US011488962B2

(12) United States Patent
Choi

(10) Patent No.: US 11,488,962 B2
(45) Date of Patent: Nov. 1, 2022

(54) MEMORY DEVICE AND METHOD FOR FABRICATING THE SAME

(71) Applicant: SK hynix Inc., Gyeonggi-do (KR)

(72) Inventor: Kang Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 87 days.

(21) Appl. No.: 17/166,367

(22) Filed: Feb. 3, 2021

(65) Prior Publication Data
US 2022/0077156 A1 Mar. 10, 2022

(30) Foreign Application Priority Data

Sep. 4, 2020 (KR) .......................... 10-2020-0113117

(51) Int. Cl.
*H01L 27/108* (2006.01)
*G11C 5/06* (2006.01)

(52) U.S. Cl.
CPC ........ *H01L 27/10826* (2013.01); *G11C 5/063* (2013.01); *H01L 27/1085* (2013.01); *H01L 27/10879* (2013.01); *H01L 27/10885* (2013.01); *H01L 27/10888* (2013.01); *H01L 27/10891* (2013.01)

(58) Field of Classification Search
None
See application file for complete search history.

(56) References Cited

U.S. PATENT DOCUMENTS 4,577,215 A * 3/1986 Stewart ............... H01L 29/7883
257/319
2019/0181142 A1 6/2019 Fishburn

* cited by examiner

*Primary Examiner* — Anthony Ho
*Assistant Examiner* — Kevin Quinto
(74) *Attorney, Agent, or Firm* — IP & T Group LLP

(57) ABSTRACT

The disclosure relates to a highly integrated memory device and a method for manufacturing the same. According to the disclosure, a memory device comprises a lower structure, an active layer horizontally oriented parallel to a surface of the lower structure, a bit line connected to a first end of the active layer and vertically oriented from the surface of the lower structure, a capacitor connected to a second end of the active layer, a word line horizontally oriented to be parallel with the active layer along a side surface of the active layer, and a fin channel layer horizontally extending from one side surface of the active layer, wherein the word line includes a protrusion covering the fin channel layer.

30 Claims, 72 Drawing Sheets

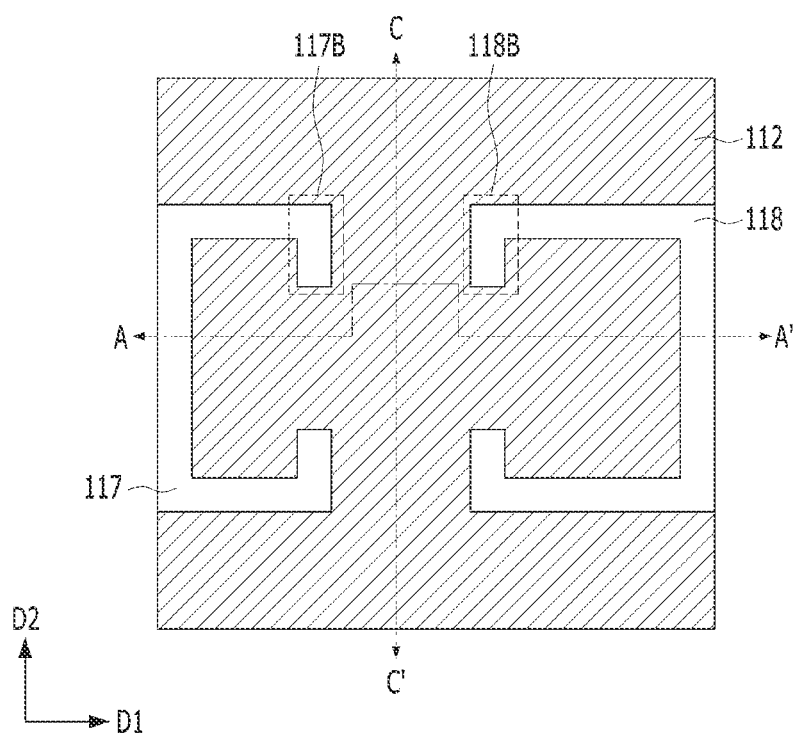

MEMORY DEVICE AND METHOD FOR FABRICATING THE SAME

CROSS-REFERENCE TO RELATED APPLICATIONS

The present application claims priority of Korean Patent Application No. 10-2020-0113117, filed on Sep. 4, 2020, which is herein incorporated by reference in its entirety.

BACKGROUND

1. Field

The disclosure relates to semiconductor devices and, more specifically, to memory devices and methods for manufacturing the same.

2. Description of the Related Art

Recently, in order to increase the net die of the memory device, the memory cell has been continuously shrunken.

Although the shrunken memory cell is supposed to lead to a decrease in parasitic capacitance (Cb) and an increase in capacitance, it is hard to increase the net die due to structural limitations of the memory cell.

SUMMARY

According to embodiments of the present disclosure, there are provided highly integrated memory cells, a memory device having the memory cells, and a method for manufacturing the same.

According to an embodiment of the present disclosure, a memory device comprises a lower structure, an active layer horizontally oriented parallel to a surface of the lower structure, a bit line connected to a first end of the active layer and vertically oriented from the surface of the lower structure, a capacitor connected to a second end of the active layer, a word line horizontally oriented to be parallel with the active layer along a side surface of the active layer, and a fin channel layer horizontally extending from one side surface of the active layer, wherein the word line includes a protrusion covering the fin channel layer.

According to an embodiment of the present disclosure, a memory device comprises active layers vertically stacked along a first direction and horizontally oriented along a second direction crossing the first direction, word lines horizontally oriented along the second direction to be individually parallel with the active layer along respective side surfaces of the active layers, an active body vertically oriented along the first direction to be jointly connected to the active layers, a bit line connected to a first end of the active layers and vertically oriented, a capacitor connected to a second end of each of the active layers, and a fin channel layer horizontally extending from a side surface of each of the active layers along a third direction, wherein each of the word lines includes a protrusion covering each of the fin channel layers.

According to an embodiment of the present disclosure, a method for manufacturing a memory device comprises forming a plurality of active layers vertically stacked from a lower structure and including a horizontal fin channel layer, forming an active body vertically oriented from the lower structure to mutually connect the active layers, forming a bit line vertically oriented from the lower structure, the bit line connected to a first end of the active layers, forming a capacitor including a storage node connected to a second end of the active layers, and forming word lines individually parallel with the active layers, the word lines individually covering the respective fin channel layers of the active layers.

According to an embodiment of the present disclosure, a memory device comprises a peripheral circuit portion and a three-dimensional (3D) array of memory cells vertically spaced apart from each other from the peripheral circuit portion, wherein each of the memory cells of the 3D array includes an active layer horizontally oriented for a surface of the peripheral circuit portion, a bit line electrically connected to a first end of the active layer and vertically oriented for the peripheral circuit portion, a capacitor electrically connected to a second end of the active layer, an active body vertically oriented and passing through the active layer, a fin channel layer horizontally extending from the active body, and a word line including a protrusion covering the fin channel layer.

According to an embodiment of the present disclosure, a DRAM memory cell comprises a substrate and a 3D array of memory cells vertically stacked on the substrate, wherein each of the memory cells includes a FinFET transistor, a bit line vertically oriented from the substrate and connected to a side of the FinFET transistor, and a capacitor connected to another side of the FinFET transistor, and wherein the FinFET transistor includes a fin channel layer parallel with a surface of the substrate. The FinFET may further include a word line facing a side surface of the fin channel layer. The word line may include a protrusion covering the fin channel layer.

According to an embodiment of the present disclosure, a memory device comprises an active layer oriented in a first direction, the active layer having a first end connected to a bit line, a second end opposite said first end connected to a capacitor, and a fin channel layer extending in a second direction from a first side surface of the active layer, and a word line including a protrusion configured to cover the fin channel layer.

According to embodiments of the present disclosure, it is possible to reduce parasitic capacitance while increasing cell density by vertically stacking memory cells to thereby form a 3D structure.

According to embodiments of the present disclosure, it is possible to suppress cell leakage current by mutually connecting the active layers, which are vertically stacked, via the active body.

According to embodiments of the present disclosure, it is possible to enhance current characteristics by adopting a triple gate structure including a fin channel layer.

These and other features and advantages of the invention will become better understood by the person having ordinary skill in the art of the invention from the following drawings and detailed description of specific embodiments.

BRIEF DESCRIPTION OF THE DRAWINGS

FIGS. 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, and 24C are views illustrating a method for manufacturing a memory device according to an embodiment of the present disclosure.

DETAILED DESCRIPTION

Figure 1:
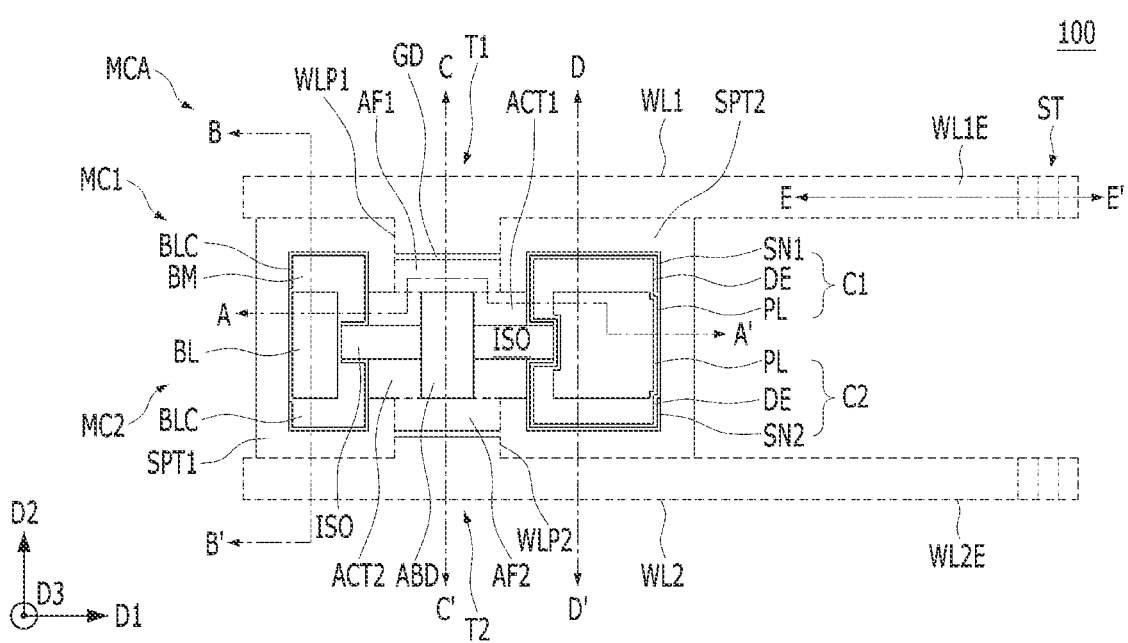
FIG. 1 is a layout schematically illustrating a configuration of a memory device according to an embodiment of the present disclosure.

Hereinafter, embodiments of the present disclosure are described with reference to schematic cross-sectional views, layouts, or block diagrams. Changes or modifications may be made to the views depending on manufacturing techniques and/or tolerances. Thus, embodiments of the present disclosure are not limited to specific types as shown and illustrated herein but may encompass changes or modifications resultant from fabricating processes. For example, the regions or areas shown in the drawings may be schematically shown, and their shapes shown are provided merely as examples, rather than as limiting the category or scope of the disclosure.

Figure 2A:
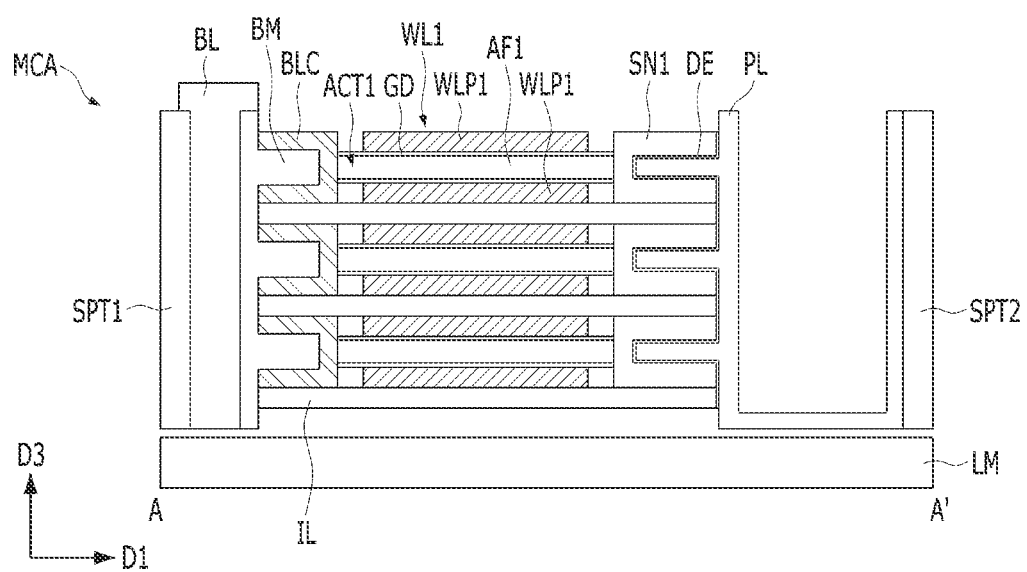
FIG. 2A is a cross-sectional view of the memory device, taken along line A-A' of FIG. 1.
Figure 2B:
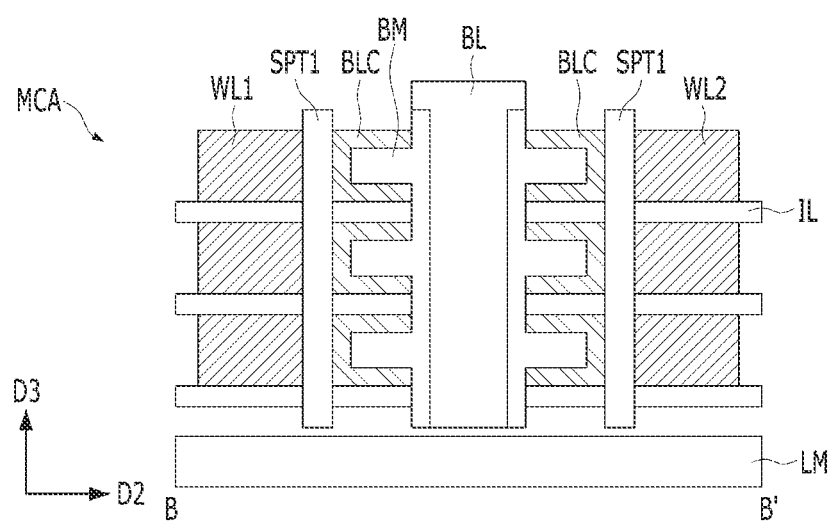
FIG. 2B is a cross-sectional view of the memory device, taken along line B-B' of FIG. 1.
Figure 2C:
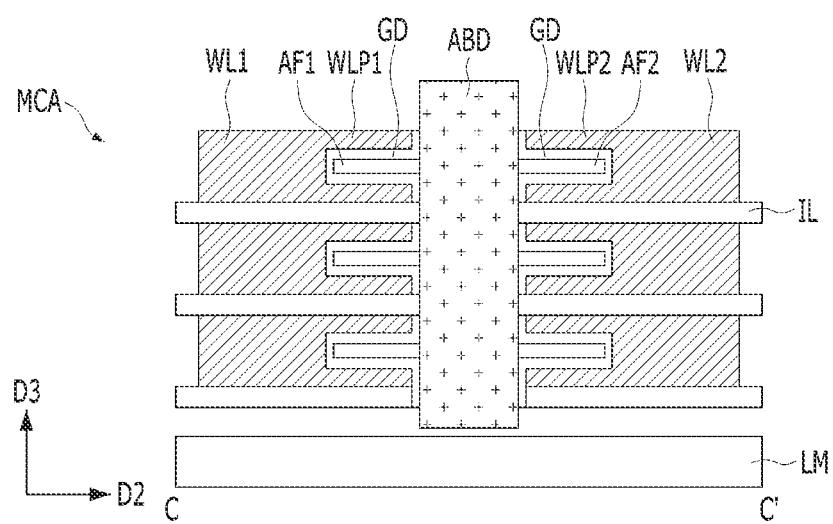
FIG. 2C is a cross-sectional view of the memory device, taken along line C-C' of FIG. 1.
Figure 2D:
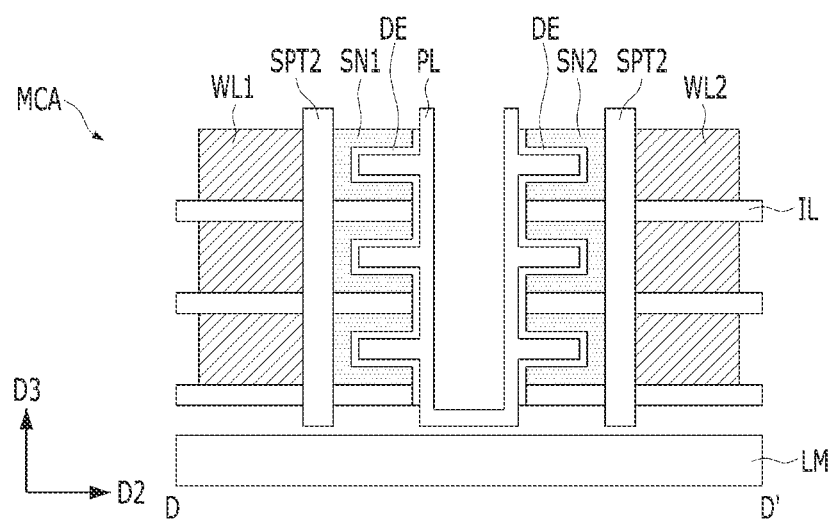
FIG. 2D is a cross-sectional view of the memory device, taken along line D-D' of FIG. 1.
Figure 2E:
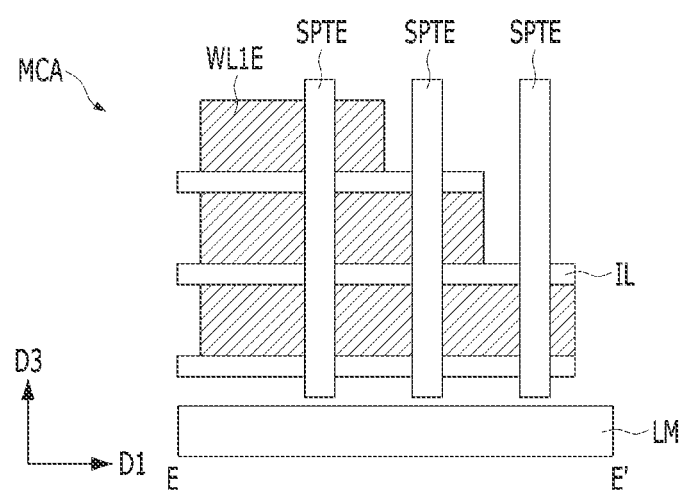
FIG. 2E is a cross-sectional view of the memory device, taken along line E-E' of FIG. 1.

FIG. 1 is a layout schematically illustrating a configuration of a memory device according to an embodiment of the present disclosure. FIG. 2A is a cross-sectional view of the memory device, taken along line A-A' of FIG. 1. FIG. 2B is a cross-sectional view of the memory device, taken along line B-B' of FIG. 1. FIG. 2C is a cross-sectional view of the memory device, taken along line C-C' of FIG. 1. FIG. 2D is a cross-sectional view of the memory device, taken along line D-D' of FIG. 1. FIG. 2E is a cross-sectional view of the memory device, taken along line E-E' of FIG. 1.

Referring to FIGS. 1 to 2E, a memory device 100 may include a memory cell array MCA. The memory cell array MCA may include at least a pair of first and second memory cells MC1 and MC2. The first memory cell MC1 and the second memory cell MC2, respectively, may include active layers ACT1 and ACT2 horizontally oriented, a bit line BL vertically oriented and connected to first ends of the active layers ACT1 and ACT2, capacitors C1 and C2 connected to second ends of the active layers ACT1 and ACT2, word lines WL1 and WL2 horizontally oriented to be parallel with the active layers ACT1 and ACT2 along the first side surfaces of the active layers ACT1 and ACT2, and fin channel layers AF1 and AF2 horizontally extending from the first side surfaces of the active layers ACT1 and ACT2. The word lines WL1 and WL2 respectively may include protrusions WLP1 and WLP2 covering the fin channel layers AF1 and AF2. The active layers ACT1 and ACT2 vertically stacked may be jointly connected to an active body ABD.

The first memory cell MC1 may include a bit line BL, a first transistor T1, and a first capacitor C1. The first transistor T1 may include a first active layer ACT1, a first fin channel layer AF1, and a first word line WL1. The first capacitor C1 may include a first storage node SN1, a dielectric layer DE, and a plate PL.

The second memory cell MC2 may include the bit line BL, a second transistor T2, and a second capacitor C2. The second transistor T2 may include a second active layer ACT2, a second fin channel layer AF2, and a second word line WL2. The second capacitor C2 may include a second storage node SN2, the dielectric layer DE, and the plate PL.

The first memory cell MC1 and the second memory cell MC2 may share the bit line BL1 and the plate PL. The first capacitor C1 and the second capacitor C2 may share the dielectric layer DE and the plate PL.

The first and second storage nodes SN1 and SN2 may be connected respectively to the first and second active layers ACT1 and ACT2. The first and second storage nodes SN1 and SN2 may each function as a storage contact node. The first and second storage nodes SN1 and SN2 may be shaped, for example, as a cylinder or a pillar.

The first and second memory cells MC1 and MC2 may each include a bit line contact node BLC. The bit line BL may connect to the first and the second active layers ACT1 and ACT2 via the bit line contact node BLC. A barrier layer BM may further be formed between the bit line BL and the bit line contact node BLC.

The bit line BL and the bit line contact node BLC may be supported by a first supporter SPT1. The first and second storage nodes SN1 and SN2 may be supported by a second supporter SPT2. The first active layer ACT1 and the first fin channel layer AF1 may be supported by the first supporter SPT1 and the second supporter SPT2. The second active layer ACT2 and the second fin channel layer AF2 may be supported by the first supporter SPT1 and the second supporter SPT2. The first supporter SPT1 may partially surround a bit is line structure, e.g., the bit line BL, the barrier layer BM, and the bit line contact node BLC. The second supporter SPT2 may partially surround the first capacitor C1 and the second capacitor C2. The first and second supporters SPT1 and SPT2 may generally each have a letter "C" shape. The first supporter SPT1 and the second supporter SPT2, respectively, may include bending edges (which are assigned no reference number in FIG. 1) connected to the first and second active layers ACT1 and ACT2. The bending edges of the first supporter SPT1 and the second supporter SPT2 refer to the regions denoted with numerals 117B and 118B of the first and second supporters of FIG. 5A. This structure of the bending edges may increase the supporting effect of the active layers ACT1 and ACT2, the bit line structure and the capacitors C1 and C2.

The first fin channel layer AF1 may be part of the first active layer ACT1 and may have a fin structure surrounded by the first word line WL1. The second fin channel layer AF2 may be part of the second active layer ACT2 and may have a fin structure covered by the second word line WL2.

The active body ABD and separation layers ISO may be positioned between the first and second active layers ACT1 and ACT2. The separation layers ISO may be positioned on either side of the active body ABD along a first direction D1. Some of the separation layers ISO may connect to the bit line BL and to the active body ABD while others may connect between the active body ABD and the first and second storage nodes SN1 and SN2. The active body ABD may mutually connect the first and second active layers ACT1 and ACT2. As viewed from the top, the active body ABD and the separation layers ISO may form a cross shape with the elongated axis of the active body ABD extending in a second direction D2 and the elongated axis of the separation layers ISO extending in the first direction D1.

Each of the first and second active layers ACT1 and ACT2 may have a bent shape and extend along the first direction D1. The active body ABD may vertically extend along the second direction D2. The first direction D1 and the second direction D2 may perpendicularly cross each other. The separation layers ISO may be positioned on both sides of the active body ABD. The active body ABD may be undoped, and the first and second active layers ACT1 and ACT2 may be doped. For example, the active body ABD may include undoped polysilicon, and the first and second active layers ACT1 and ACT2 may include doped polysilicon.

The first and second word lines WL1 and WL2 may extend along the first direction D1 and they may be parallel with each other. The first and second word lines WL1 and WL2 respectively may include word line edge portions WL1E and WL2E. Contact plugs (not shown) may be connected to the word line edge portions WL1E and WL2E. The plurality of word line edge portions WL1E and WL2E vertically disposed along a third direction D3 may have a stepped structure (refer to reference denotation 'ST'). That is, the word line edge portions WL1E and WL2E stacked along the third direction D3 may have different lengths. The word line edge portions WL1E and WL2E may be supported by a plurality of edge supporters SPTE as shown in FIG. 2E.

The first and second word lines WL1 and WL2 may include respective protrusions WLP1 and WLP2 shaped to cover the first and second fin channel layers AF1 and AF2, respectively.

The bit line BL and the plate PL may each be vertically oriented from a lower structure LM along the third direction D3. The first transistor T1 and the second transistor T2 may be horizontally oriented along the first direction D1.

The lower structure LM may provide a plane that extends along the first and second directions D1 and D2. The memory cell array MCA may be vertically positioned on the lower structure LM along third direction D3. The memory cell array MCA may include a plurality of first and second memory cells having the same structure as the first memory cell MC1 and the second memory cell MC2, respectively and are vertically disposed along the third direction D3. The plurality of first and second memory cells of the memory cell array MCA may share the bit line BL, the dielectric layer DE, and the plate PL. In the memory cell array MCA, the plurality of active layers ACT1 and ACT2 and fin channel layers AF1 and AF2 may be jointly connected to the active body ABD. In the memory cell array MCA, the plurality of memory cells may individually include independent storage nodes SN1 and SN2. The memory cell array MCA may be disposed higher than the lower structure LM. The memory cell array MCA may include a dynamic random access memory (DRAM) memory cell array.

The bit line contact nodes BLC, active layers ACT1 and ACT2, fin channel layers AF1 and AF2, and storage nodes SN1 and SN2 may be positioned at the same level. The bit line contact nodes BLC, active layers ACT1 and ACT2, fin channel layers AF1 and AF2, and storage nodes SN1 and SN2 may be parallel with the plane of the lower structure LM.

A gate insulation layer GD may be formed between the fin channel layers AF1 and AF2 and the word lines WL1 and WL2. The gate insulation layer GD may cover the exposed surfaces of the fin channel layers AF1 and AF2.

The plate PL and the dielectric layer DE may be vertically oriented along the third direction D3 for the lower structure LM, and the dielectric layer DE may surround the side wall of the plate PL.

From a top view, the storage nodes SN1 and SN2 may each have a bent shape, partially covering the outer wall of the plate PL. The storage nodes SN1 and SN2 may each have a cylindrical cross section (refer to FIG. 2A). Part of the plate PL may extend to the inside space of each of the cylinders of the storage nodes SN1 and SN2.

The lower structure LM may include a peripheral circuit portion. The peripheral circuit portion may include a plurality of control circuits. At least one or more control circuits of the peripheral circuit portion may include an N-channel transistor, a P-channel transistor, a complementary metal-oxide-semiconductor (CMOS) circuit, or a combination thereof. At least one or more control circuits of the peripheral circuit portion may include, e.g., an address decoder circuit, a read circuit, and a write circuit. At least one or more control circuits of the peripheral circuit portion may include, e.g., a planar channel transistor, a recess channel transistor, a buried gate transistor, or a fin channel transistor (FinFET). The lower structure LM may include a peripheral circuit portion connected to bit lines. The peripheral circuit portion may be disposed lower than the lowermost word line among the word lines. Alternatively, the peripheral circuit portion may be disposed higher than the uppermost word line among the word lines in which case the lower structure LM may not include the peripheral circuit portion.

The memory cell array MCA may include a DRAM memory cell array, and the peripheral circuit portion may include a sense amplifier (SA). The sense amplifier SA may connect to a multi-level metal wire (MLM). The bit line BL may be electrically connected with the sense amplifier SA.

The lower structure LM may include an etch stop layer. The etch stop layer may include a material that has etch selectivity when a series of etching processes are performed to form the memory cell array MCA. For example, the etch stop layer may include a polysilicon layer. The etch stop layer may be formed by deposition and etching of the polysilicon layer. A plurality of etch stop layers may be formed under the memory cell array MCA. The etch stop layer may be positioned under the bit line BL, and the etch stop layer may be positioned under the active body ABD.

An insulation material may be positioned between the lower structure LM and the memory cell array MCA. The memory cell array MCA may include a plurality of insulation layers IL and a plurality of word lines WL1 alternately formed vertically along the third direction D3. The insulation layers IL may prevent a short circuit between the vertically arrayed word lines WL1. The insulation layers IL may, for example, include silicon oxide.

Each of the active layers ACT1 and ACT2 may be horizontally oriented along the first direction D1. The word lines WL1 and WL2 may be horizontally oriented along the first direction D1. The active layers ACT1 and ACT2 may be vertically stacked along the third direction D3. The word lines WL1 and WL2 may be vertically stacked along the third direction D3. The active layers ACT1 and ACT2 and the word lines WL1 and WL2 may be parallel with each other. That is, at each level formed between the insulating layers there are positioned active layers ACT1 and ACT2 and word lines WL1 and WL2 which are parallel to each other. The active layers ACT1 may be vertically stacked over a surface of the lower structure LM. The active layers ACT2 may be vertically stacked over the surface of the lower structure LM.

As described above, the memory device 100 may have a three-dimensional (3D) structure. It is possible to reduce parasitic capacitance while increasing cell density by vertically stacking memory cells to thereby form a 3D structure.

As the active layers ACT1 and ACT2 of the transistors T1 and T2 are connected to each other via the active body ABD, a body bias may be applied. Thus, a cell leakage current due to dynamic operation may be suppressed.

In a comparative example where the active body ABD is omitted, since the active layers ACT1 and ACT2 are spaced apart from the lower structure LM (e.g., a silicon substrate), the cell current reduces as the mobility decreases. Further, as the active layers ACT1 and ACT2 are separated from each other, it may be difficult to connect the channels. Thus, a floating body may be formed so that, upon operation, the threshold voltage Vt of the transistor may be lowered.

According to an embodiment, a triple gate structure may be adopted for increasing the effective width and for connecting the fin channel layers AF1 and AF2 via the active body ABD. The transistors T1 and T2 are FinFETs, and the word lines WL1 and WL2 of the transistors T1 and T2 may each have a triple gate structure covering the fin channel layers AF1 and AF2. Thus, the transistor width may be increased by at least two times or more in a given area. Thus, the current reduction due to a lowering in the mobility of polysilicon may be overcome.

As the bit line BL, transistors T1 and T2, and capacitors C1 and C2 are simultaneously formed, it may be easy to form the gate electrode, source and drain which are self-aligned.

As the length of the word lines WL1 and WL2 is defined by a pre-formed supporter, it may be specified independently from a stripping process for the sacrificial layer (e.g., nitride).

FIGS. 3A to 24C are views illustrating a method for manufacturing a memory device according to an embodiment of the present disclosure. The layouts of FIGS. 3A to 24A may be sacrificial-level or gate electrode-level layouts.

Figure 3A:
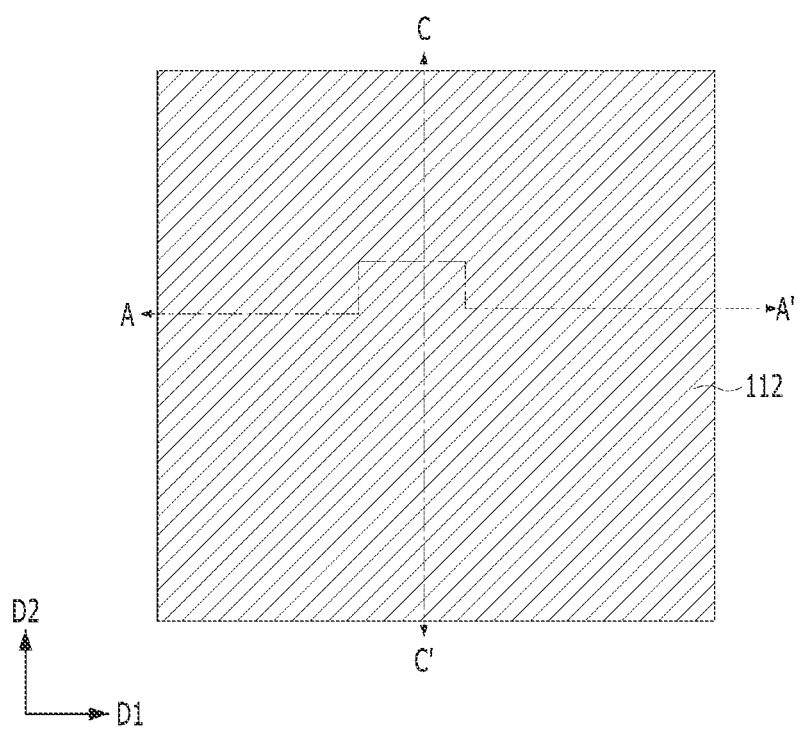
Figure 3B:
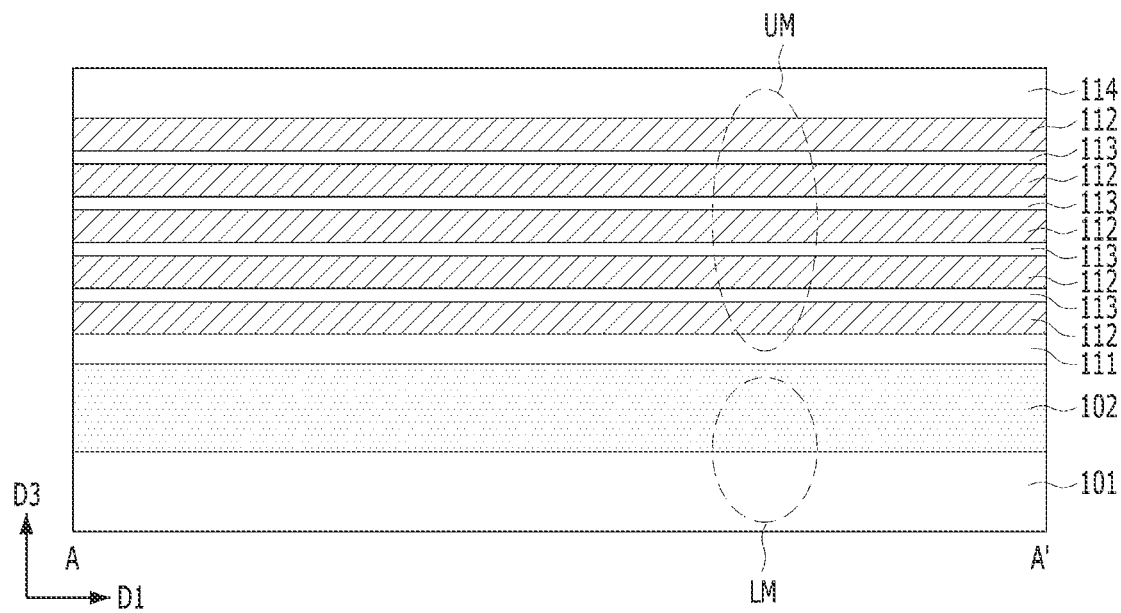
Figure 3C:
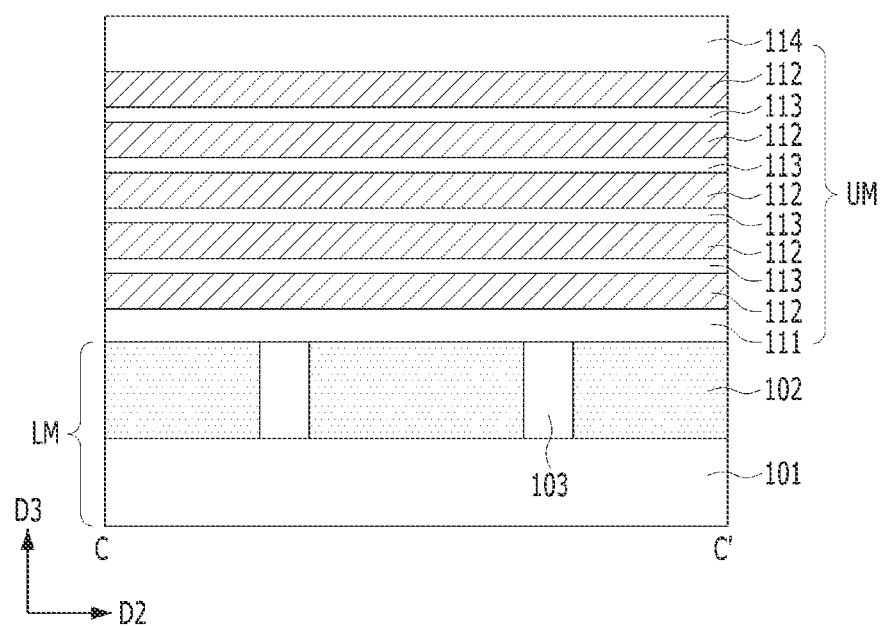

FIG. 3A is a layout illustrating a method for forming a lower structure and an upper structure. FIG. 3B is a cross-sectional view taken along line A-A' of FIG. 3A. FIG. 3C is a cross-sectional view taken along line C-C' of FIG. 3A.

Referring to FIGS. 3A to 3C, an upper structure UM may be formed on a lower structure LM. The lower structure LM may extend in a plane along the first and second directions D1 and D2. The upper structure UM may be vertically positioned on the lower structure LM along the third direction D3.

The lower structure LM may include a semiconductor substrate 101, a plurality of etch stop layers 102 positioned on the semiconductor substrate 101 and a plurality of inter-layer dielectric 103 between the etch stop layers 102. The semiconductor substrate 101 may include any material that is suitable for semiconductor processing. The semiconductor substrate 101 may be formed, for example, of a silicon-containing material. For example, the semiconductor substrate 101 may include silicon, monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The semiconductor substrate 101 may include other semiconductor material, e.g., germanium. The semiconductor substrate 101 may include a compound semiconductor substrate, e.g., a group-III/V semiconductor substrate, such as GaAs. The semiconductor substrate 101 may include a silicon-on-insulator (SOI) substrate. According to another embodiment, the semiconductor substrate 101 may include a silicon substrate and a plurality of integrated circuits formed on the silicon substrate. For example, the plurality of integrated circuits may include at least one or more control circuits. The at least one or more control circuits may include an N-channel transistor, a P-channel transistor, a complementary metal-oxide-semiconductor (CMOS) circuit, or a combination thereof. At least one or more control circuits may include, e.g., an address decoder circuit, a read circuit, and a write circuit. At least one or more control circuits may include, e.g., a planar channel transistor, a recess channel transistor, a buried gate transistor, or a fin channel transistor (FinFET). Although not shown, the at least one or more control circuits may include a sense amplifier SA. The sense amplifier SA may connect to a multi-layer metal wire (MLM).

The etch stop layers 102 may include a material that has etch selectivity upon a subsequent etching process. For example, the etch stop layers 102 may include a polysilicon layer. The etch stop layers 102 may be formed by deposition and etching of the polysilicon layer. The etch stop layers 102 may be separated from one another by then inter-layer dielectrics 103. The inter-layer dielectrics 103 may be fills the space between the etch stop layers 102. The inter-layer dielectrics 103 may be planarized to expose the top surface of the etch stop layers 102. The top surface of the etch stop layers 102 may be coplanar with the top surface of the inter-layer dielectrics 103.

The upper structure UM may include a lowermost insulation layer 111, an uppermost insulation layer 114, and an alternate stack between the lowermost insulation layer 111 and the uppermost insulation layer 114. The lowermost insulation layer 111 and the uppermost insulation layer 114 may be formed of or include the same material. The lowermost insulation layer 111 and the uppermost insulation layer 114 may, for example, be formed of silicon oxide. The lowermost insulation layer 111 may be thinner than the uppermost insulation layer 114.

The alternate stack may include a plurality of sacrificial layers 112 and a plurality of insulation layers 113. The alternate stack may include a stack of sacrificial layers 112 and insulation layers 113 alternately and repetitively formed along the third direction D3. The sacrificial layer 112 and the insulation layer 113 may be formed of or include different materials. The sacrificial layer 112 and the insulation layer 113 may have different etch selectivity. The sacrificial layer 112 may include, for example, silicon nitride, and the insulation layer 113 may include a material having etch selectivity to silicon nitride. Where the sacrificial layer 112 is formed of silicon nitride, the insulation layer 113 may, for example, include silicon oxide. The insulation layer 113 may be formed of or include the same material as the lowermost insulation layer 111 and the uppermost insulation layer 114.

The lowermost insulation layer 111, the insulation layers 113 and the uppermost insulation layer 114 may, for example, include silicon oxide, and the sacrificial layers 112 may include, for example, silicon nitride. Thus, the upper structure UM may include at least one or more 'oxide-nitride (ON) stacks.' The upper structure UM may include at least one or more 'sacrificial layer 112/insulation layer 113 stacks' and the number of sacrificial layer 112/insulation layer 113 stacks may be set to correspond to the number of memory cells. The insulation layers 113 may be thinner than the lowermost insulation layer 111 and the uppermost insulation layer 114. The sacrificial layers 112 may be thicker than the insulation layers 113. The sacrificial layers 112 may have the same thickness as the lowermost insulation layer 111 and the uppermost insulation layer 114. The insulation layers 113 may be thinner than the lowermost insulation layer 111 and the uppermost insulation layer 114.

Although not shown, after the alternate stack of the plurality of sacrificial layers 112 and the plurality of insulation layers 113 is formed, a stepped structure may be formed in the area corresponding to the word line edge portion (refer to FIG. 2E). The stepped structure may be formed by etching the plurality of sacrificial layers 112 and the plurality of insulation layers 113. Upon forming supporters 117 and 118 in a subsequent process, edge supporters ('SPTE' of FIG. 2E) may be simultaneously formed and pass through the stepped structure. Upon forming gate recesses in a subsequent process, in the stepped structures, the edge portions of the gate recesses may be expanded, and the edge portions of the gate recesses may be filled with the word line edge portions ('WL1E' and 'WL2E' of FIG. 1).

Figure 4A:
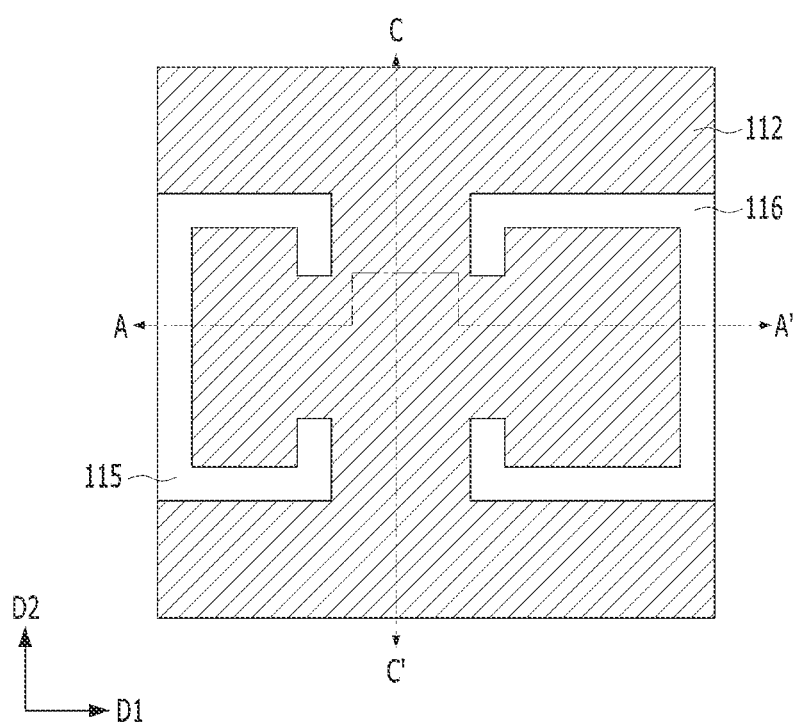
Figure 4B:
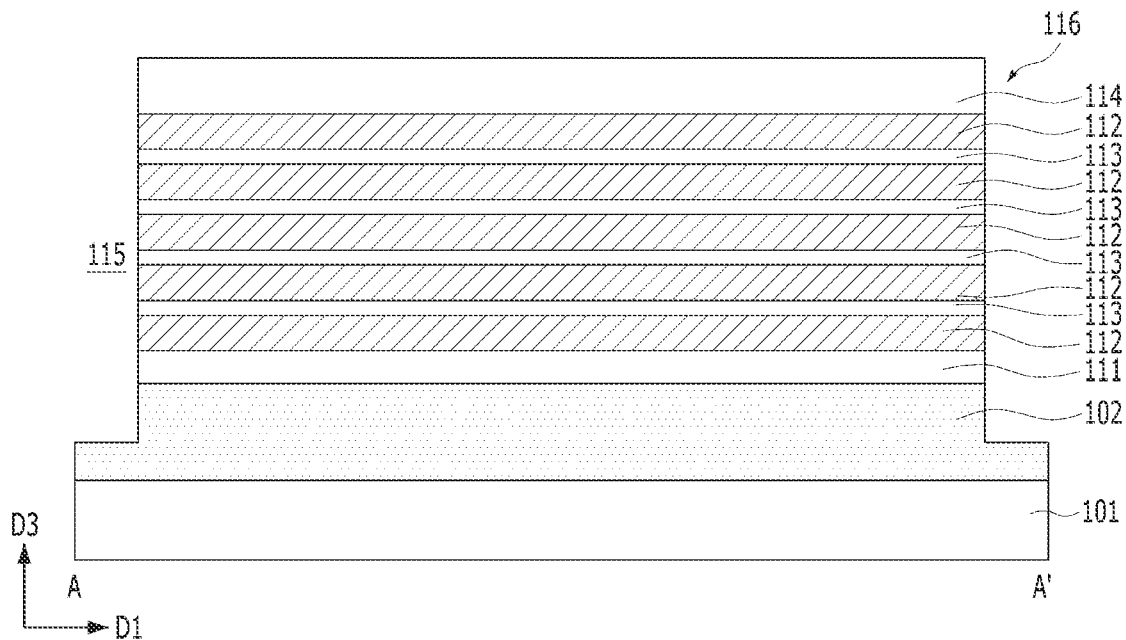
Figure 4C:
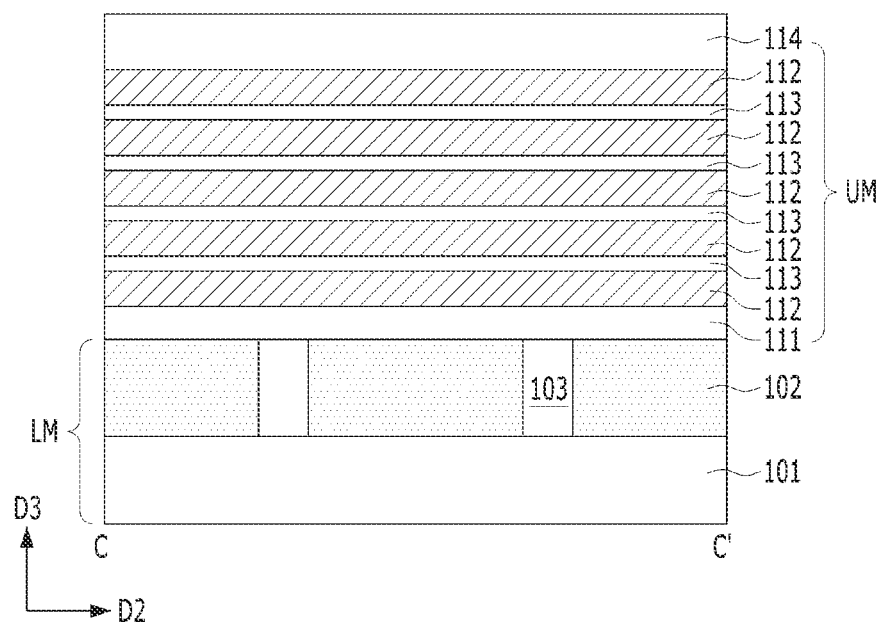

FIG. 4A is a layout illustrating a method for forming supporter openings. FIG. 4B is a cross-sectional view taken along line A-A' of FIG. 4A. FIG. 4C is a cross-sectional view taken along line C-C' of FIG. 4A.

Referring to FIGS. 4A to 4C, to form a first supporter opening 115 and a second supporter opening 116, part of the upper structure UM may be etched. The process of etching part of the upper structure UM may be performed to be stopped at the etch stop layers 102. For example, the lowermost insulation layer 111, sacrificial layers 112, insulation layers 113, and uppermost insulation layer 114 may be etched, forming the first supporter opening 115 and the second supporter opening 116. To form the first supporter opening 115 and the second supporter opening 116, the upper structure UM may be dry-etched. The first supporter opening 115 and the second supporter opening 116 may vertically extend along the third direction D3.

To prevent the first and second supporter openings 115 and 116 from being not open, the etching process of the upper structure UM may include an overetch. Thus, the bottom surface of the first and second supporter openings 115 and 116 may be partially expanded to the inside of the etch stop layers 102. That is, a recessed surface may be formed on the surface of the etch stop layers 102.

The first and second supporter openings 115 and 116 may be vertical openings vertically oriented from the semiconductor substrate 101 and may vertically extend from the top surface of the etch stop layers 102. The side walls of the first and second supporter openings 115 and 116 may have a vertical profile. The first and second supporter openings 115 and 116 may denote a cell separation area for separating the memory cells.

At top view, the first and second supporter openings 115 and 116 may each have a bent edge portion generally shaped as the letter "C." The first and second supporter openings 115 and 116 may be spaced apart from each other and face each other. The first supporter opening 115 may be different in size than the second supporter opening 116. For example, the size of the first supporter opening 115 may be smaller than the size of the second supporter opening 116.

Figure 5B:
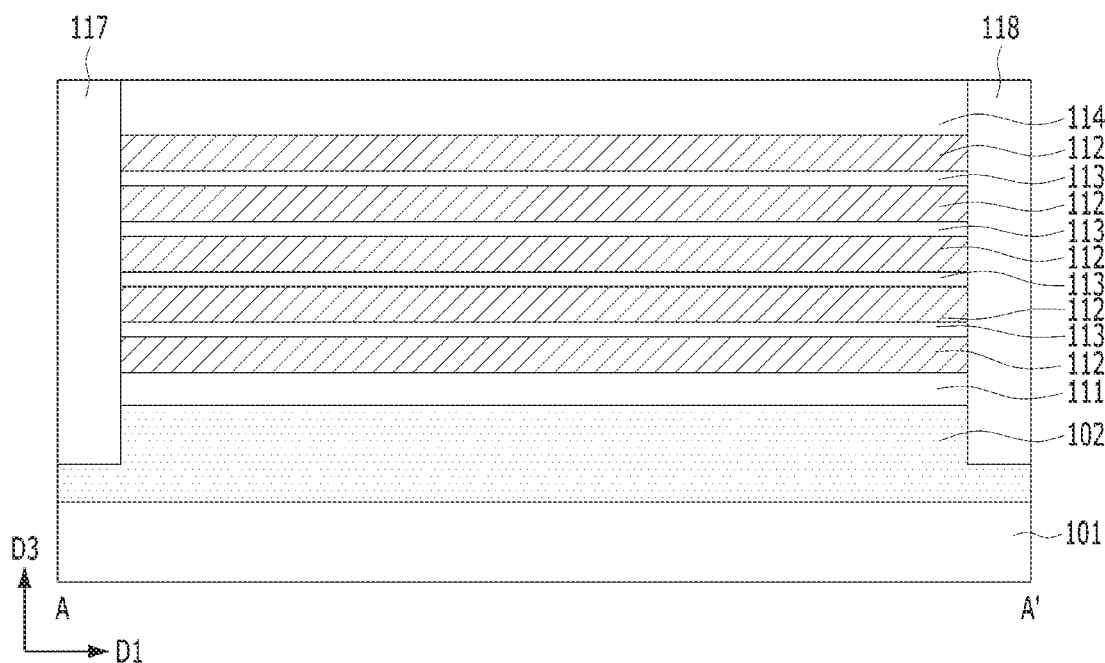
Figure 5C:
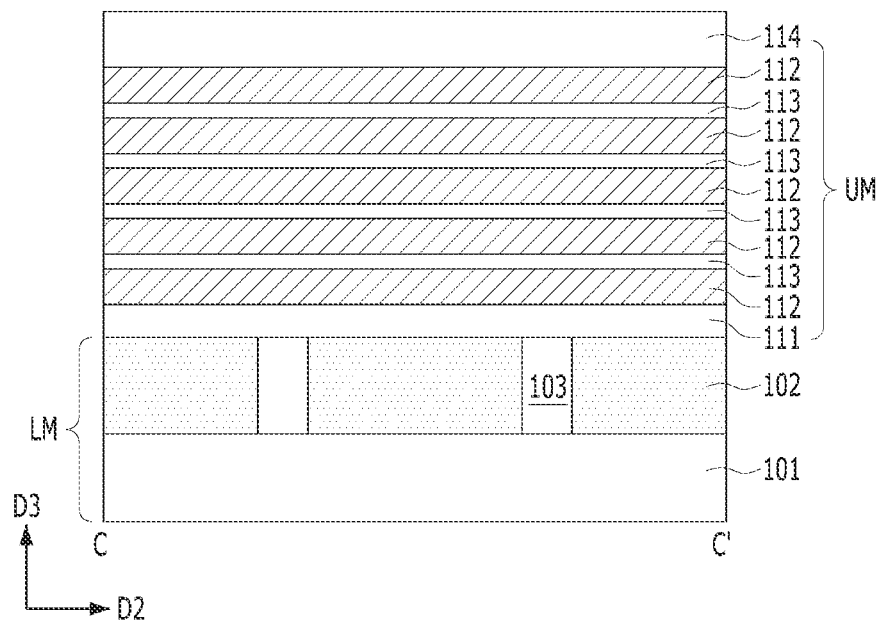

FIG. 5A is a layout illustrating a method for forming supporters. FIG. 5B is a cross-sectional view taken along line A-A' of FIG. 5A. FIG. 5C is a cross-sectional view taken along line C-C' of FIG. 5A.

Referring to FIGS. 5A to 5C, first and second supporters 117 and 118 may be formed in the first supporter opening 115 and the second supporter opening 116, respectively. To form the first and second supporters 117 and 118, the first and second supporter openings 115 and 116 may be gap-filled with an insulation material, and the insulation material may then be planarized. The first and second supporters 117 and 118 may, for example, include silicon oxide. From a top view of FIG. 5A, the first and second supporters 117 and 118 may each be generally shaped as the letter "C." The first supporter 117 and the second supporter 118 may each include a plurality of bending edges 117B and 118B, thus increasing the supporting effect. The first supporter 117 and the second supporter 118 may be spaced apart from each other and may face each other. The first supporter 117 may be smaller in size than the second supporter 118. The first and second supporters 117 and 118 may be vertical supporters vertically oriented from the semiconductor substrate 101 along the third direction D3 and may vertically extend from the top surface of the etch stop layers 102.

Figure 6A:
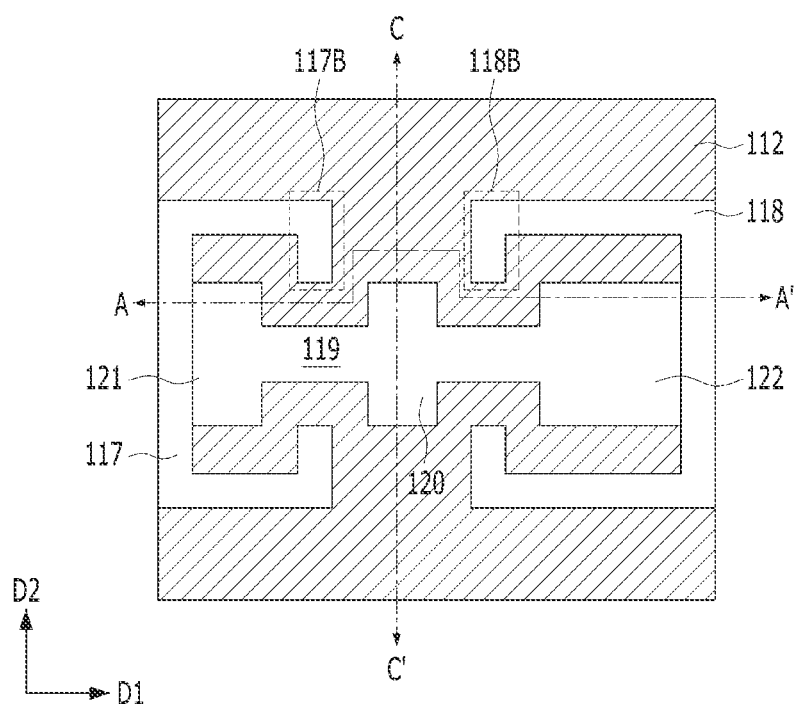
Figure 6B:
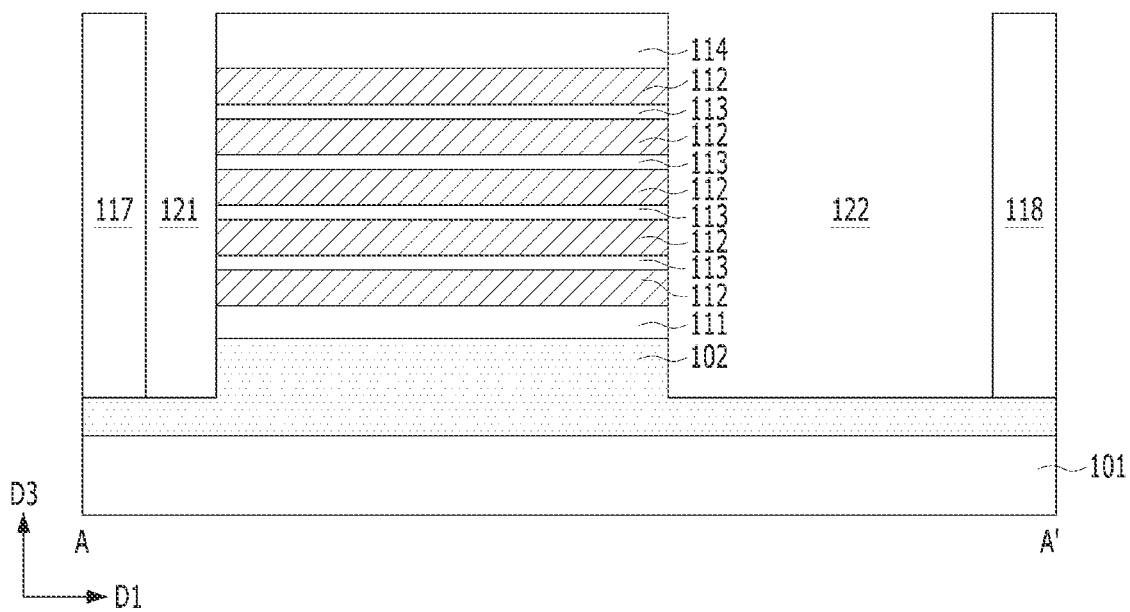
Figure 6C:
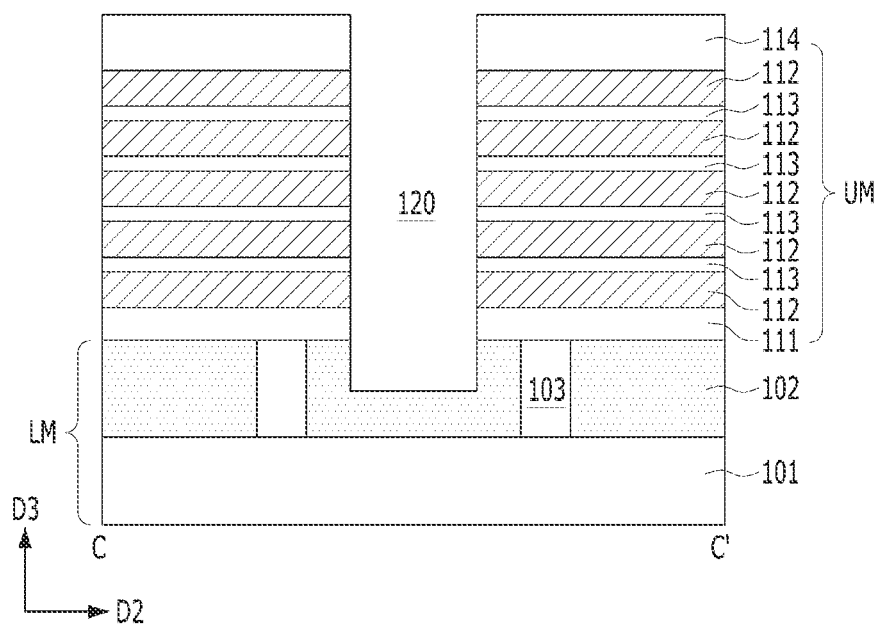

FIG. 6A is a layout illustrating a method for forming cell openings. FIG. 6B is a cross-sectional view taken along line A-A' of FIG. 6A. FIG. 6C is a cross-sectional view taken along line C-C' of FIG. 6A.

Referring to FIGS. 6A to 6C, a cell opening 119 may be formed in the space between the first supporter 117 and the second supporter 118. To form the cell opening 119, part of the upper structure UM may be etched. The process of etching part of the upper structure UM may be performed to be stopped at the etch stop layers 102. For example, the lowermost insulation layer 111, sacrificial layers 112, insulation layers 113, and uppermost insulation layer 114 may be etched, forming the cell opening 119. The cell opening 119 may be a vertical opening vertically oriented from the semiconductor substrate 101 along the third direction D3, and the cell opening 119 may be vertically oriented from the etch stop layers 102. The cell opening 119 may extend along the first direction D1 and be formed between the first supporter 117 and the second supporter 118. The cell opening 119 may horizontally extend to the first supporter 117 and the second supporter 118 along the first direction D1. The cell opening 119 may define an area where the memory cell is to be formed, e.g., an area where the active body, bit line, and capacitor are to be formed.

The cell opening 119 may include a first cell opening 120, a second cell opening 121, and a third cell opening 122. From a top view, the first cell opening 120 may be disposed in the middle, the second cell opening 121 may be disposed on one side (or the left side) of the first cell opening 120, and the third cell opening 122 may be disposed on the opposite side (or the right side) of the first cell opening 120. The open area of the third cell opening 122 may be larger than that of the first cell opening 120 and the second cell opening 121.

The first cell opening 120 may provide a space where an active body is to be formed. The second cell opening 121 may provide a space where a bit line is to be formed. The third cell opening 122 may provide a space where a capacitor is to be formed. Since the third cell opening 122 is formed in a relatively large size, the capacitor which is to be formed may be increased. Thus, a sufficient capacitance may be secured.

From a top view, the cell opening 119 may have a multi-finger shape. The first cell opening 120, the second cell opening 121, and the third cell opening 122 may be arranged side by side in the multi-finger shape. The first cell opening 120, the second cell opening 121, and the third cell opening 122 may be connected to one another.

One side surface of the second cell opening 121 may expose one side surface of the first supporter 117. Likewise, one side surface of the third cell opening 122 may expose one side surface of the second supporter 118.

Figure 7A:
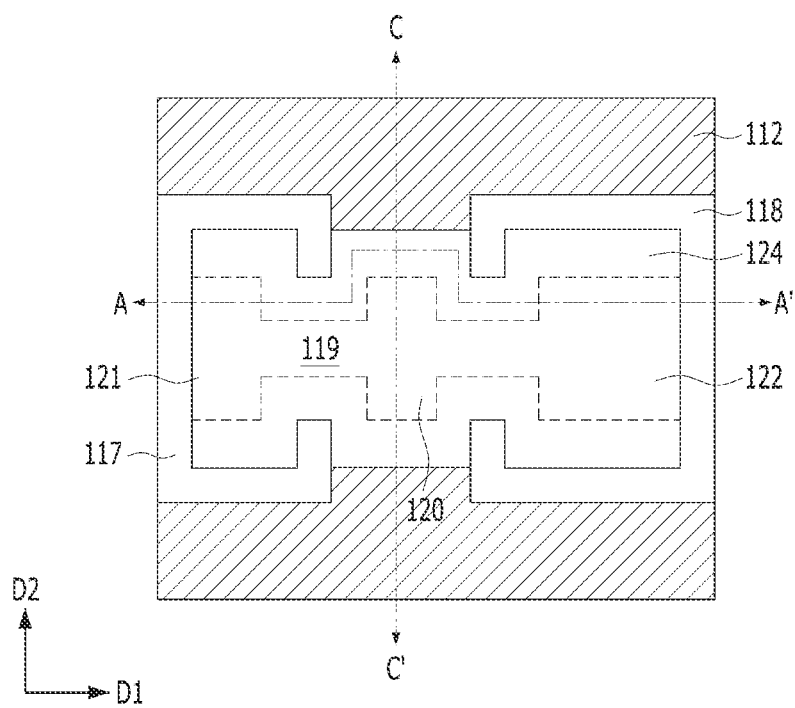
Figure 7B:
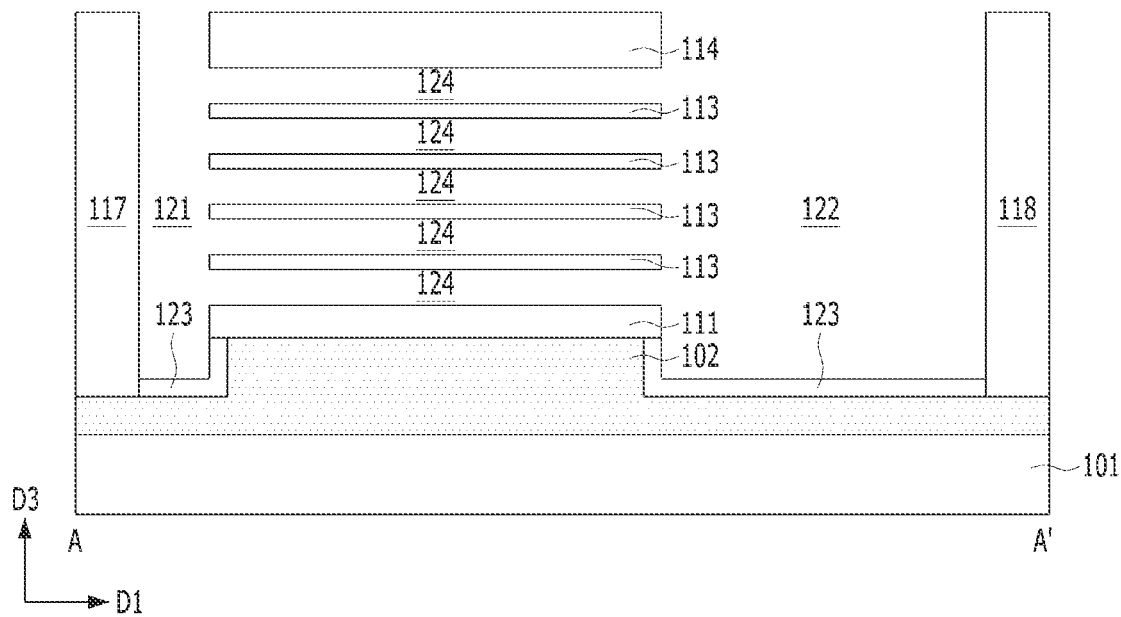
Figure 7C:
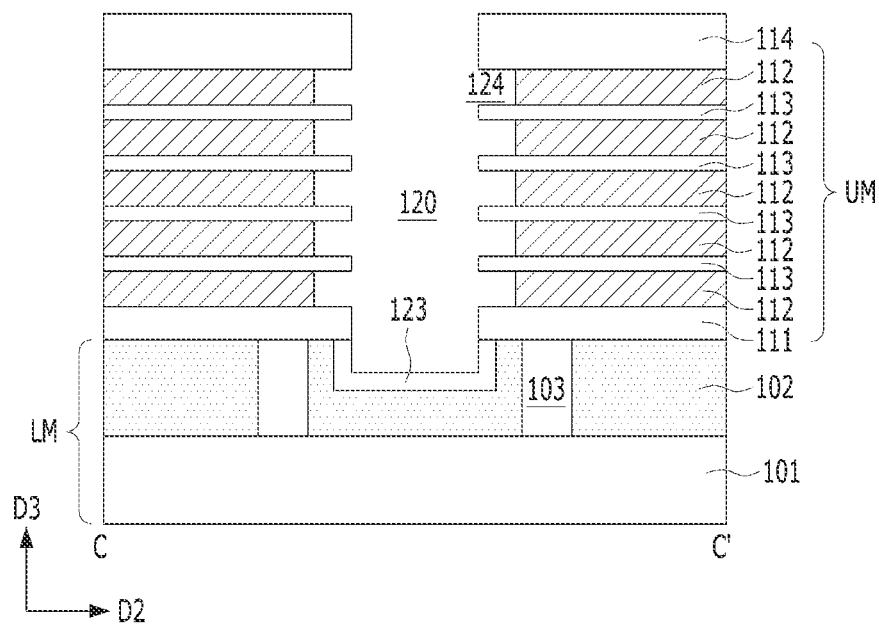

FIG. 7A is a layout illustrating a method for forming horizontal recesses. FIG. 7B is a cross-sectional view taken along line A-A' of FIG. 7A. FIG. 7C is a cross-sectional view taken along line C-C' of FIG. 7A.

Referring to FIGS. 7A to 7C, to form a protection layer 123, the recessed surface of the etch stop layers 102 may be oxidated. The protection layer 123 may be formed by exposing the recessed surface of the etch stop layers 102 to a thermal oxidation process. For example, the etch stop layers 102 may be formed of polysilicon and the protection layer 123 may be formed of silicon oxide. The protection layer 123 may protect the etch stop layers 102 in the subsequent processes. The protection layer 123 may electrically insulate the bit line and capacitor, which are formed in the subsequent process, from the etch stop layers 102.

The protection layer 123 may conformally cover the bottom surface of the cell opening 119, e.g., the recessed surface of the etch stop layers 102.

After the protection layer 123 is formed, the sacrificial layers 112 may be selectively recessed horizontally via the cell opening 119. By horizontal recessing the sacrificial layers 112, a plurality of horizontal recesses (also referred to as lateral recesses) 124 may be formed between the insulation layers 113 which are vertically stacked along the third direction D3. The insulation layers 113 and the horizontal recesses 124 may be alternately and repetitively formed along the third direction D3. Horizontal recessing of the sacrificial layers 112 may be performed by wet etching or dry etching. For example, in an embodiment, the sacrificial layers 112 may contain silicon nitride, and the horizontal recesses 124 may be formed by wet-etching silicon nitride.

The horizontal recesses 124 may horizontally extend from the side surfaces of the first to third cell openings 120, 121, and 122, e.g., the ends of the insulation layers 113. The horizontal recesses 124 which neighbor each other along the second direction D2 may be symmetrical to each other with respect to the first cell opening 120, the second cell opening 121, and the third cell opening 122.

First ends of the horizontal recesses 124, e.g., the ends along the first direction D1, may contact the first supporter 117 and the second supporter 118. Side surfaces of the horizontal recesses 124 along the second direction D2 may contact the remaining sacrificial layers 112. Among the horizontal recesses 124, the uppermost horizontal recess 124 may be positioned between the uppermost insulation layer 114 and the insulation layer 113. Among the horizontal recesses 124, the lowermost horizontal recess 124 may be positioned between the lowermost insulation layer 111 and the insulation layer 113. The vertical height and horizontal length of the horizontal recesses 124 may be identical to each other.

Figure 8A:
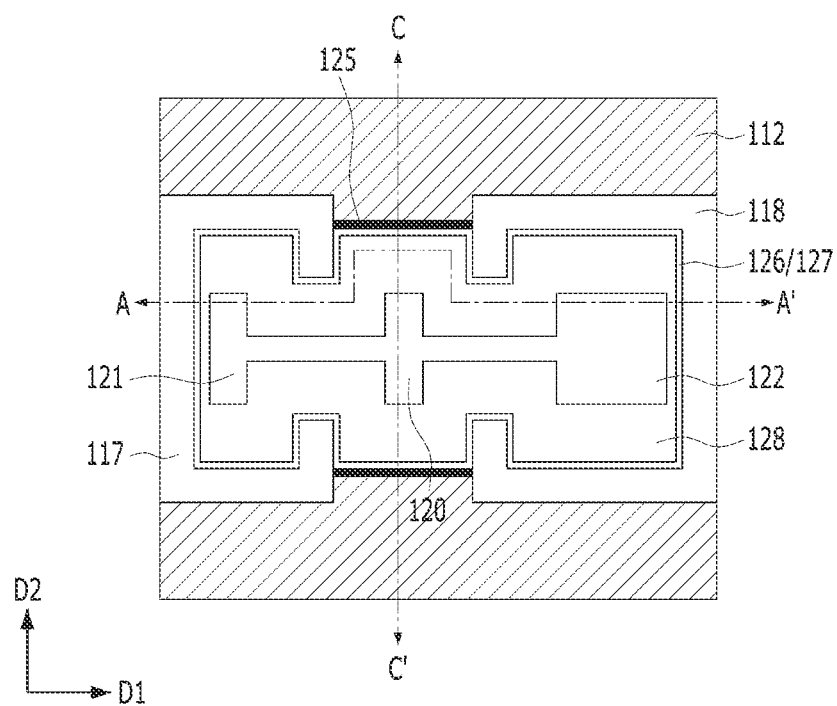
Figure 8B:
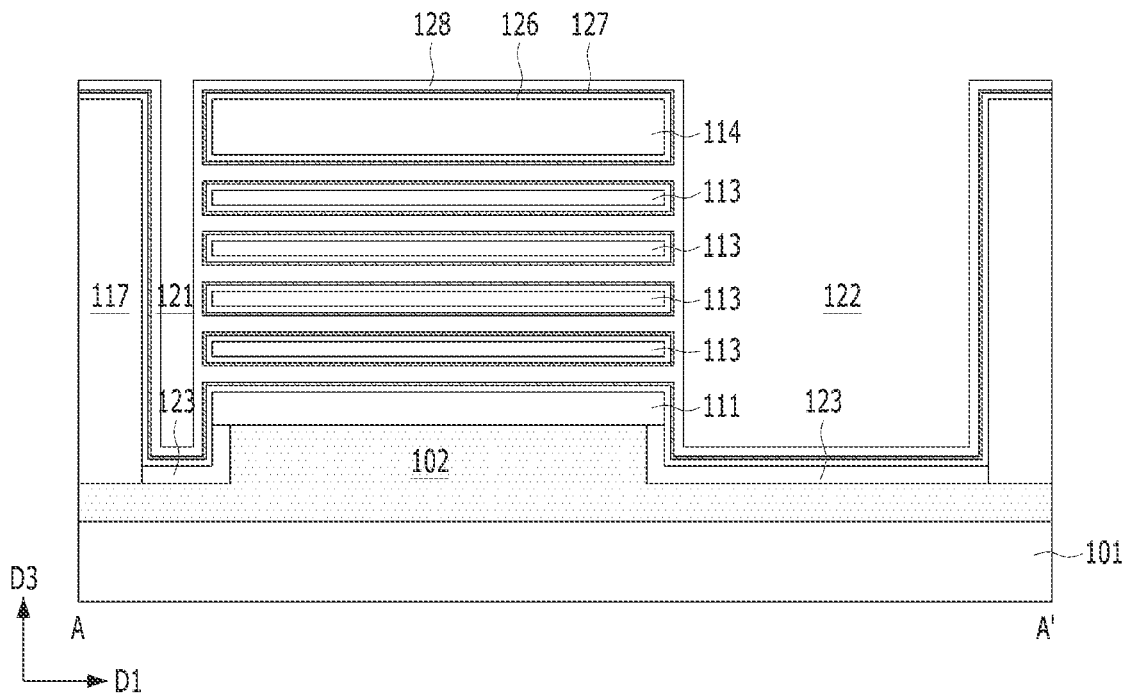
Figure 8C:
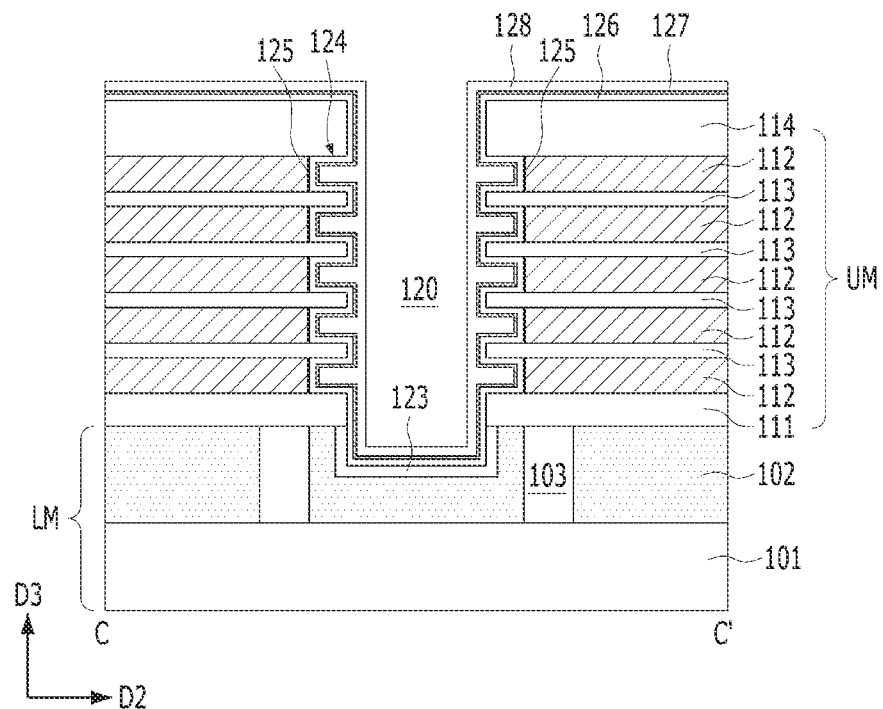

FIG. 8A is a layout illustrating a method for forming a gate insulation layer and a channel material layer. FIG. 8B is a cross-sectional view taken along line A-A' of FIG. 8A. FIG. 8C is a cross-sectional view taken along line C-C' of FIG. 8A.

Referring to FIGS. 8A to 8C, the side surface of the remaining sacrificial layers 112 which provide the horizontal recesses 124 may be selectively oxidated. Thus, the side walls of the horizontal recesses 124 along the second direction D2 may be covered with selective oxides 125. For example, in an embodiment, the remaining sacrificial layers 112 may contain silicon nitride and the selective oxides 125 may include silicon oxynitride.

Next, a sacrificial insulation layer 126/127 and an active material layer 128 may be formed. The sacrificial insulation layer 126/127 may include a stack of nitride 126 and oxide 127. The active material layer 128 may include a semiconductor material. The active material layer 128 may, for example, include polysilicon. The active material layer 128 may include P-type polysilicon or undoped polysilicon. The active material layer 128 may adjust the thickness of the horizontal recesses 124 that need to be filled in a void-free manner.

The sacrificial insulation layer 126/127 and the active material layer 128 may extend along the first direction D1.

The sacrificial insulation layer 126/127 may cover the top, bottom, and side surfaces of the insulation layers 113. The active material layer 128 may fill the horizontal recesses 124 on the sacrificial insulation layer 126/127. The sacrificial insulation layer 126/127 and the active material layer 128 may be conformally formed on the side surfaces of the cell opening 119. The sacrificial insulation layer 126/127 and the active material layer 128 may partially fill the cell opening 119.

Figure 9A:
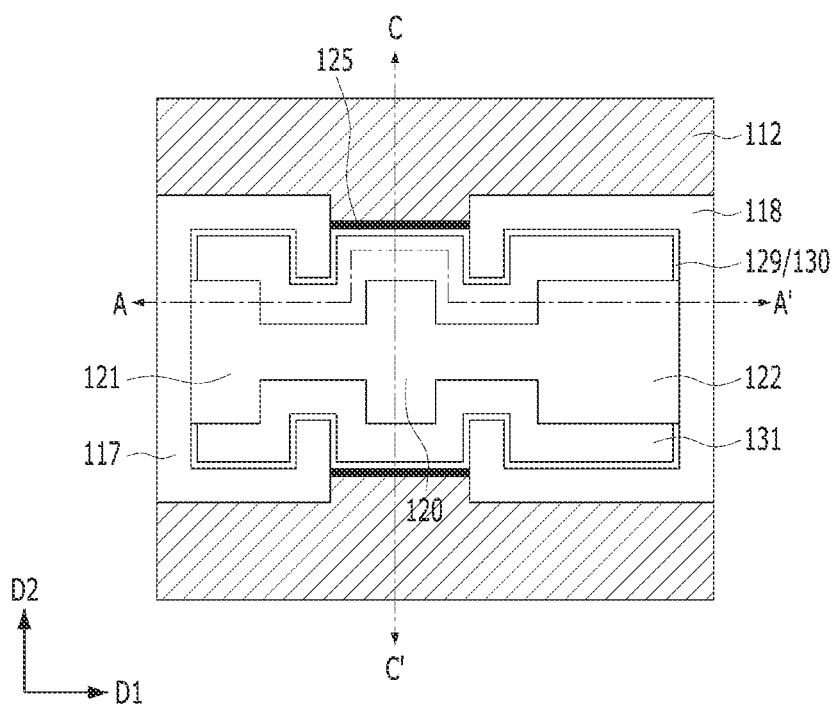
Figure 9B:
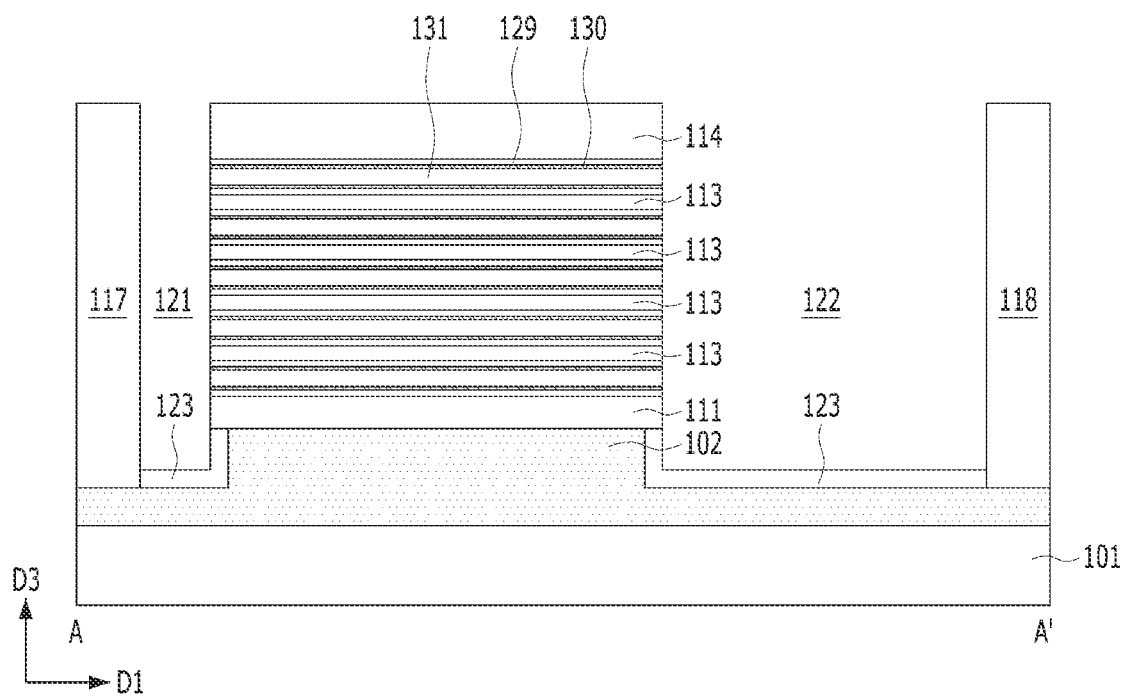
Figure 9C:
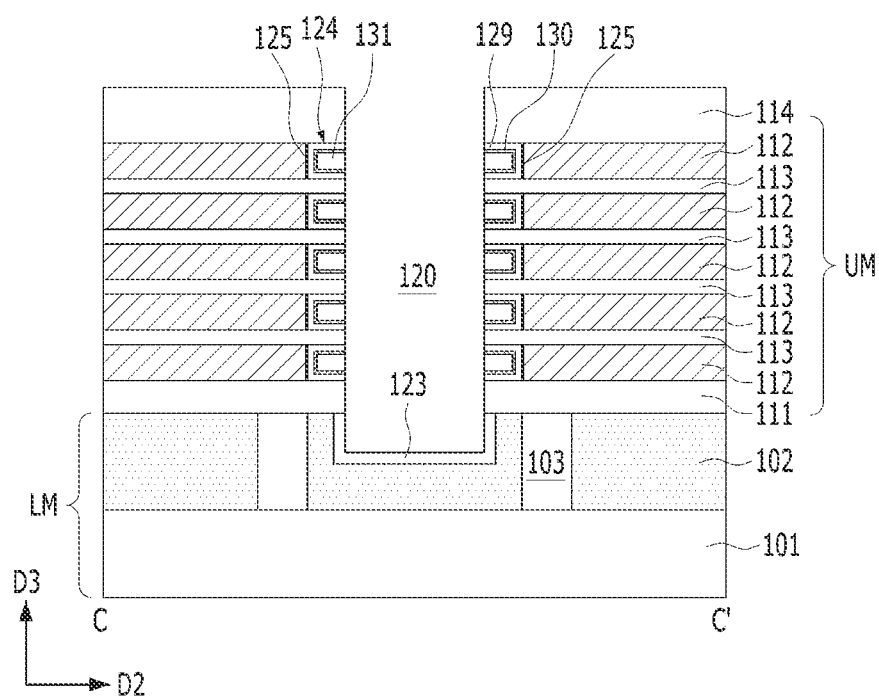

FIG. 9A is a layout illustrating a method for forming active layers. FIG. 9B is a cross-sectional view taken along line A-A' of FIG. 9A. FIG. 9C is a cross-sectional view taken along line C-C' of FIG. 9A.

Referring to FIGS. 9A to 9C, an active layer separation or isolation process may be performed. For example, an active layer 131 may be formed in each of the horizontal recesses 124 by selectively etching the active material layer 128 (which is denoted as the process of cutting the 'active material layer'). The active layers 131 individually formed in the horizontal recesses 124 may be vertically separated from each other. In the second direction D2, some side walls of the active layers 131 may be covered with selective oxides 125. The selective oxides 125 may be positioned between the active layers 131 and the remaining sacrificial layers 112. Along the first direction D1, the respective first side walls of the active layers 131 may be covered with the first supporter 117, and the respective second side walls of the active layers 131 may be covered with the second supporter 118. Prior to the cutting process for the active material layer 128, the sacrificial insulation layer 126/127 may be selectively cut. Thus, sacrificial insulation layer patterns 129/130 may remain in the horizontal recesses 124. Each sacrificial insulation layer pattern 129/130 may include, for example, a nitride pattern 129 and an oxide pattern 130. The nitride pattern 129 may be formed by etching the oxide 126, and the oxide pattern 130 may be formed by etching the oxide 127.

From a top view, the active layers 131 may have a wave shape including a plurality of rectangular protrusions extending in the second direction D2. The protrusions may be spaced apart along a flat base line extending in the first direction D1. The protrusions may be spaced apart at a regular interval. A pair of active layers 131 may face each other along the second direction D2, with the cell opening 119 disposed therebetween. The sacrificial insulation layer pattern 129/130 and the active layer 131 may extend along the first direction D1. The sacrificial insulation layer pattern 129/130 may be positioned between the active layers 131 and the first and second supporters 117 and 118.

Figure 10A:
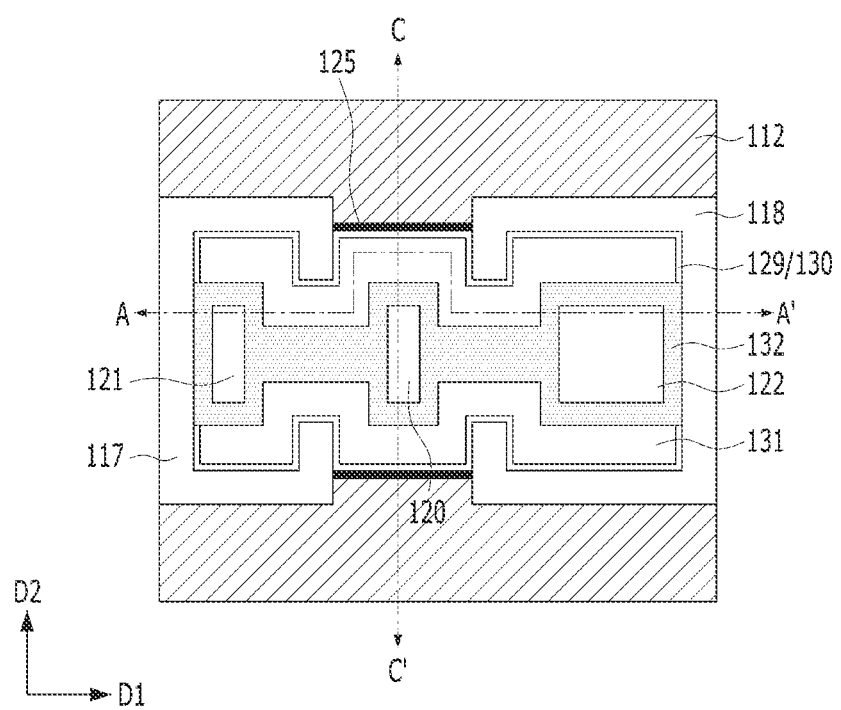
Figure 10B:
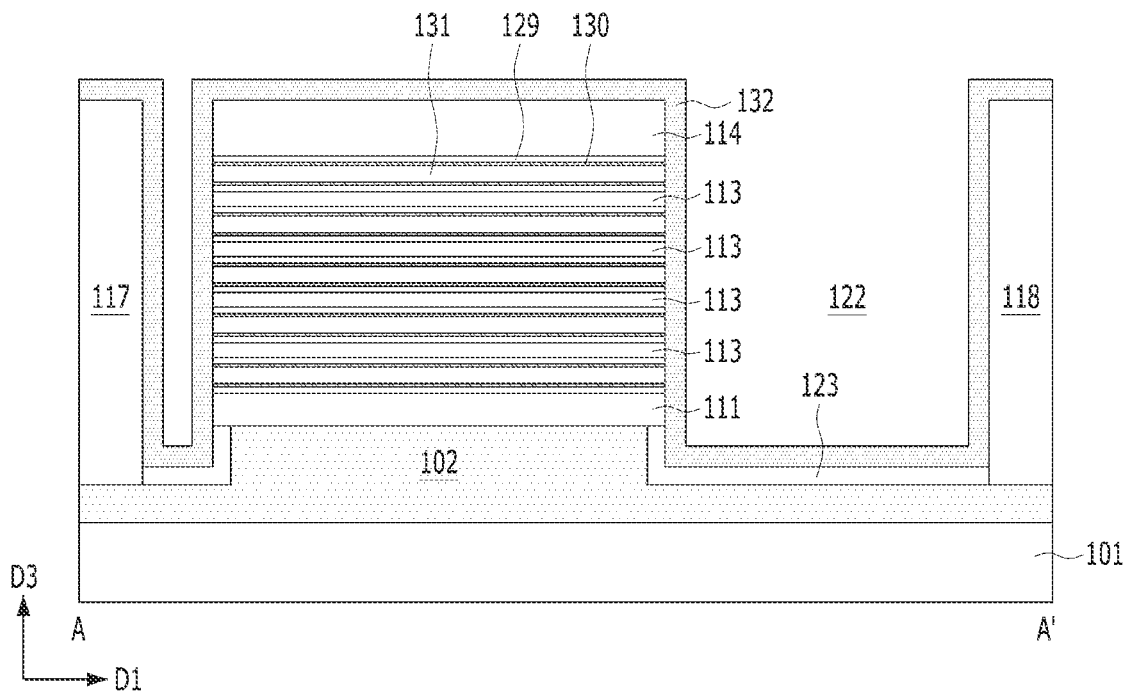
Figure 10C:
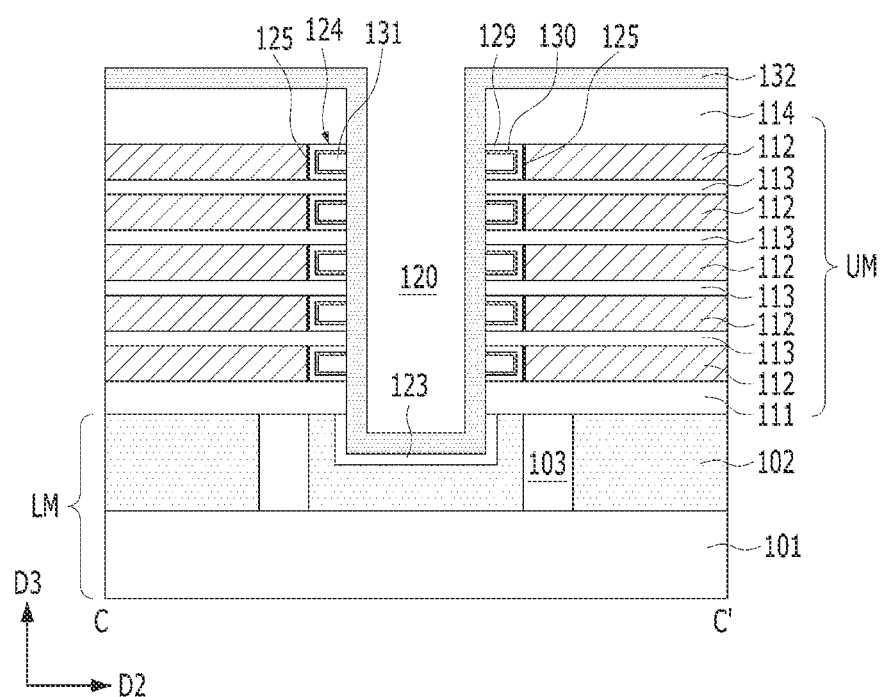

FIG. 10A is a layout illustrating a method for forming a liner oxide layer. FIG. 10B is a cross-sectional view taken along line A-A' of FIG. 10A. FIG. 10C is a cross-sectional view taken along line C-C' of FIG. 10A.

Referring to FIGS. 10A to 10C, a liner oxide layer 132 may be formed in the cell opening 119. The liner oxide layer 132 may be formed conformally on the side walls of the cell opening 119. The liner oxide layer 132 may cover one side surface of the active layer 131. The liner oxide layer 132 may partially fill the first cell opening 120, the second cell opening 121, and the third cell opening 122.

Figure 11A:
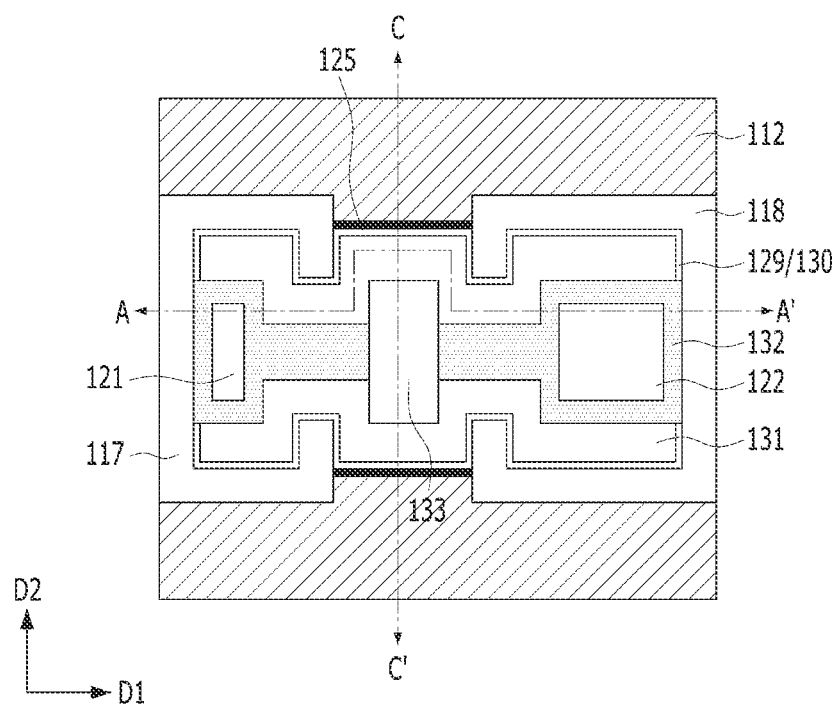
Figure 11B:
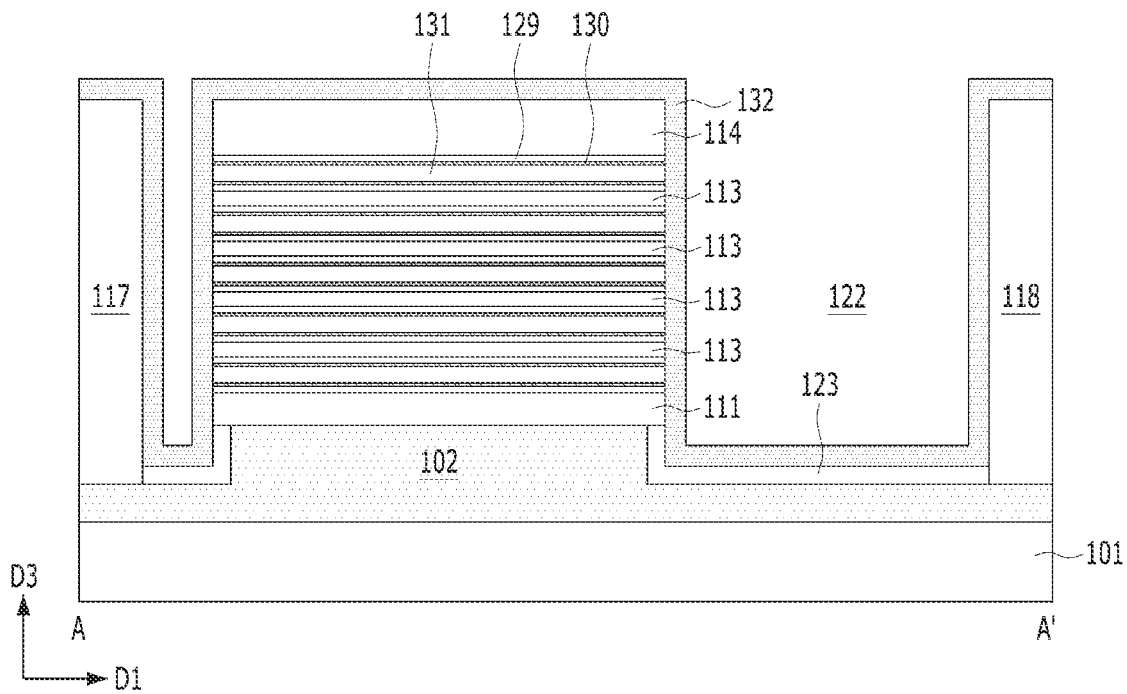
Figure 11C:
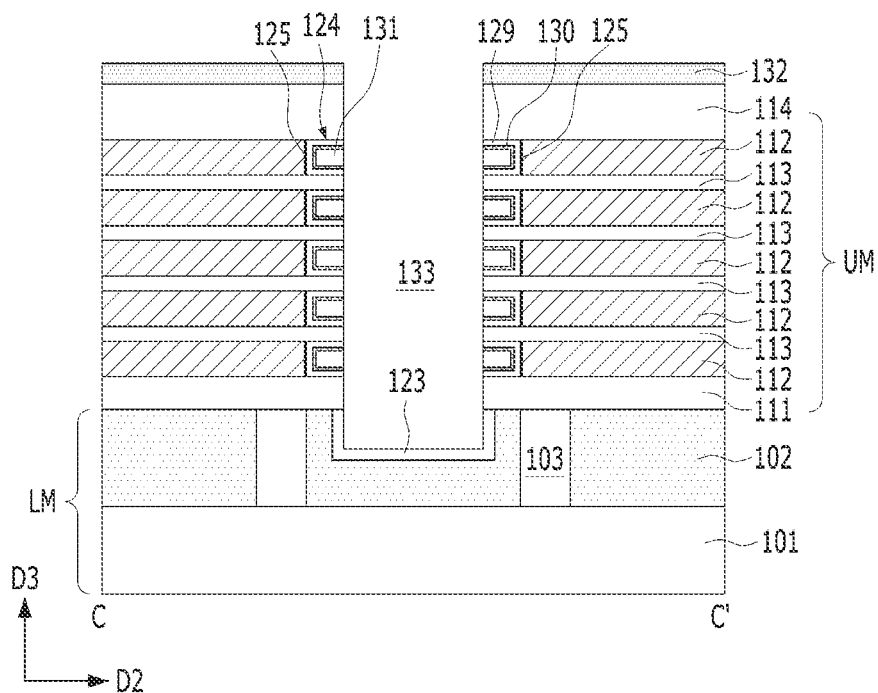

FIG. 11A is a layout illustrating a method for forming an active body opening. FIG. 11B is a cross-sectional view taken along line A-A' of FIG. 11A. FIG. 11C is a cross-sectional view taken along line C-C' of FIG. 11A.

Referring to FIGS. 11A to 11C, the first cell opening 120 may be exposed again. To that end, the liner oxide layer 132 may be selectively removed from the first cell opening 120.

The exposed first cell opening 120 is referred to as an 'active body opening 133.' By the active body opening 133, part of each active layer 131 may be exposed along the second direction D2. The liner oxide layer 132 may be positioned on both side surfaces of the active body opening 133 along the first direction D1.

The active body opening 133 may be vertically oriented from the lower structure LM.

Figure 12A:
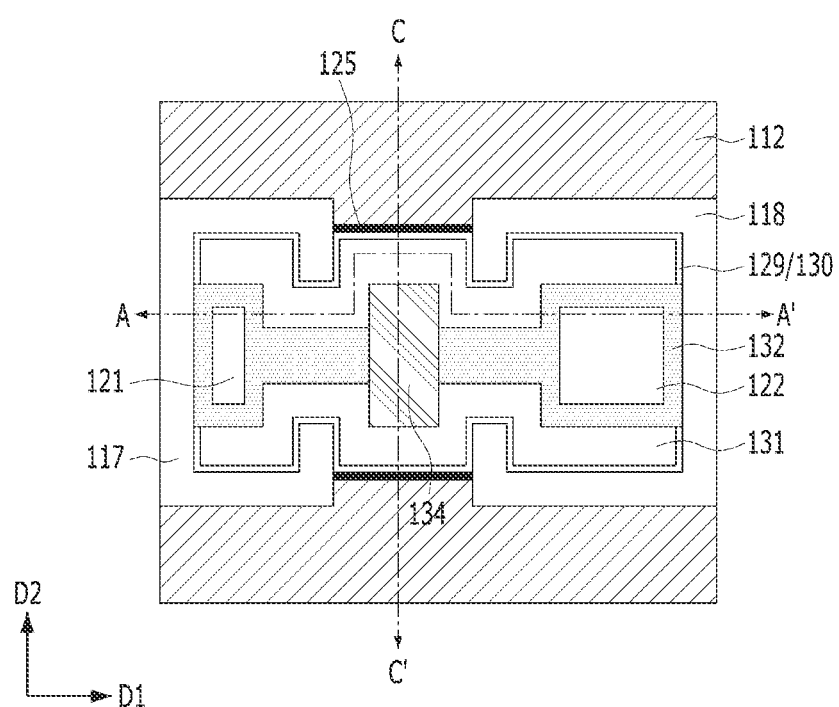
Figure 12B:
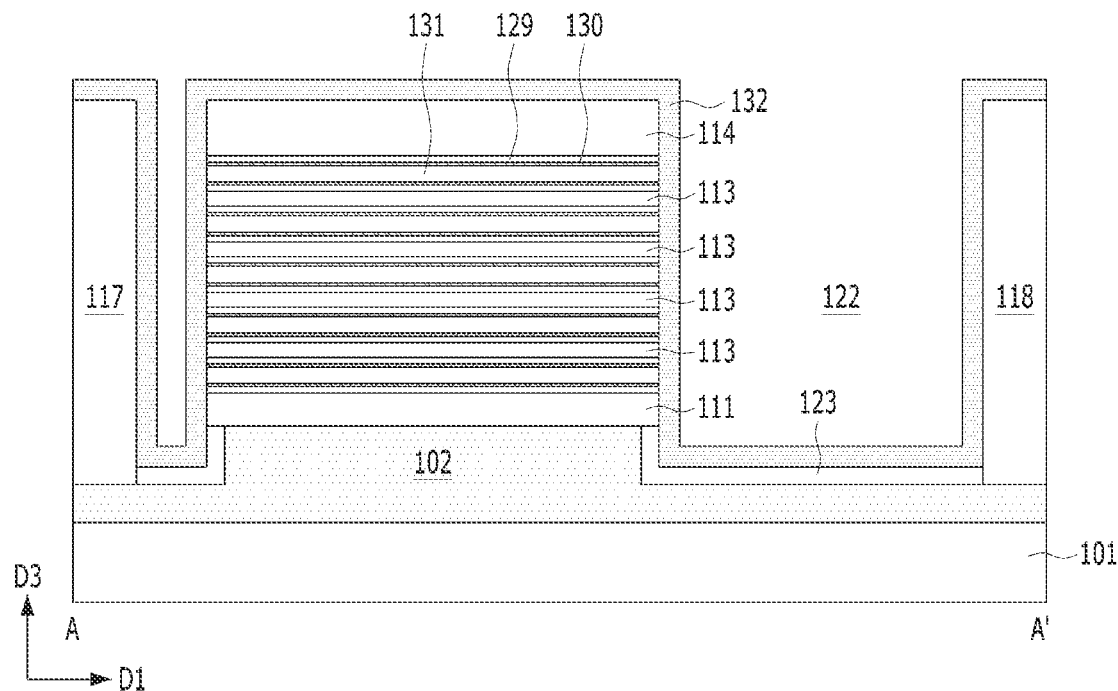
Figure 12C:
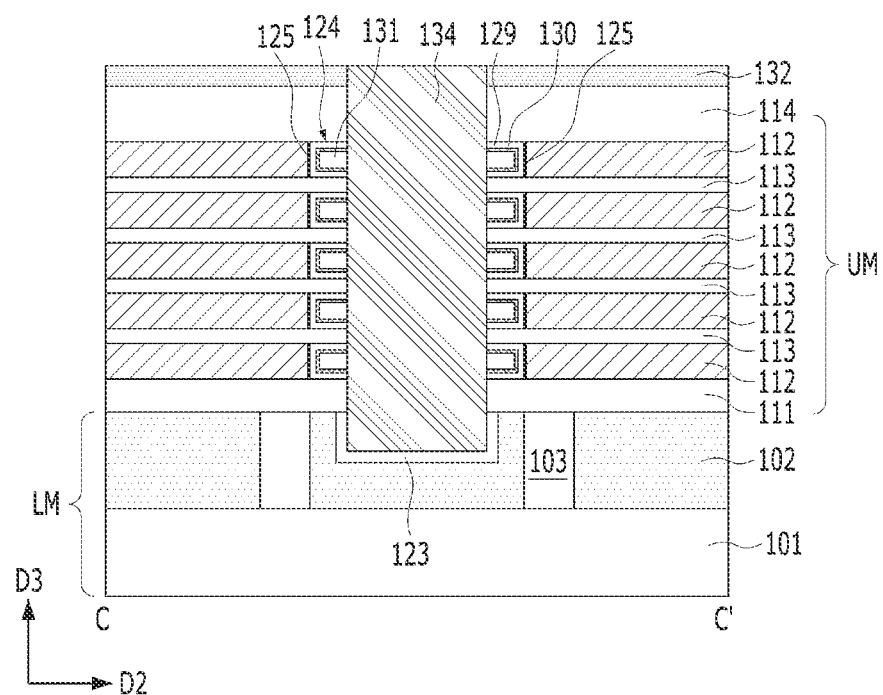

FIG. 12A is a layout illustrating a method for forming an active body. FIG. 12B is a cross-sectional view taken along line A-A' of so FIG. 12A. FIG. 12C is a cross-sectional view taken along line C-C' of FIG. 12A.

Referring to FIGS. 12A to 12C, an active body 134 may fill the active body opening 133. The active body 134 may include doped polysilicon. To form the active body 134, P-type polysilicon may be deposited to fill the active body opening 133 and planarization may be performed. P-type polysilicon refers to polysilicon doped with a P-type impurity, such as, for example, boron.

The active body 134 may mutually connect the active layers 131 vertically positioned along the third direction D3. A body bias may be applied to the active body 134. The active body 134 may have a pillar shape. The active body 134 may penetrate the active layers 131 vertically stacked. Part of each active layer 131 may be electrically connected to the active body 134 along the second direction D2. A pair of active layers 131 may be electrically connected with each other with the active body 134 along the second direction D2.

Figure 13A:
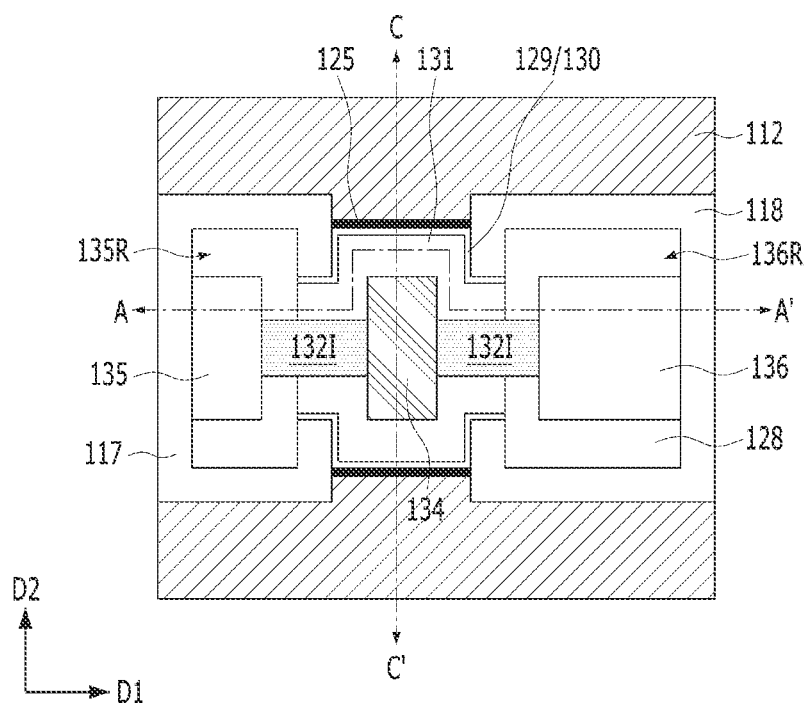
Figure 13B:
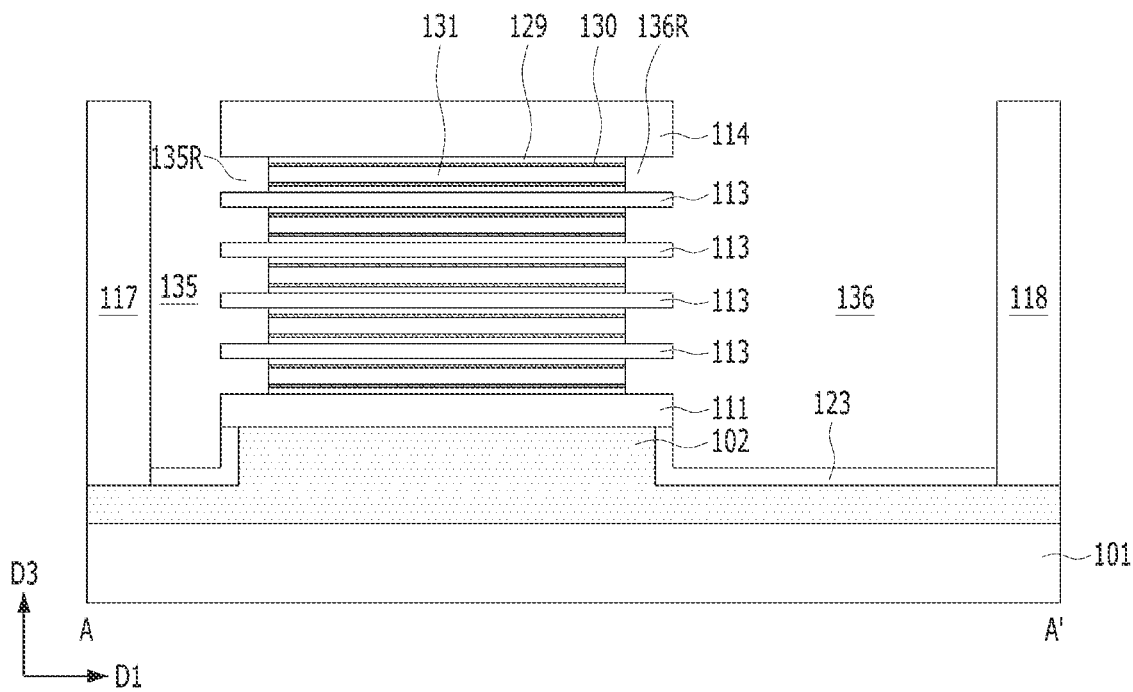
Figure 13C:
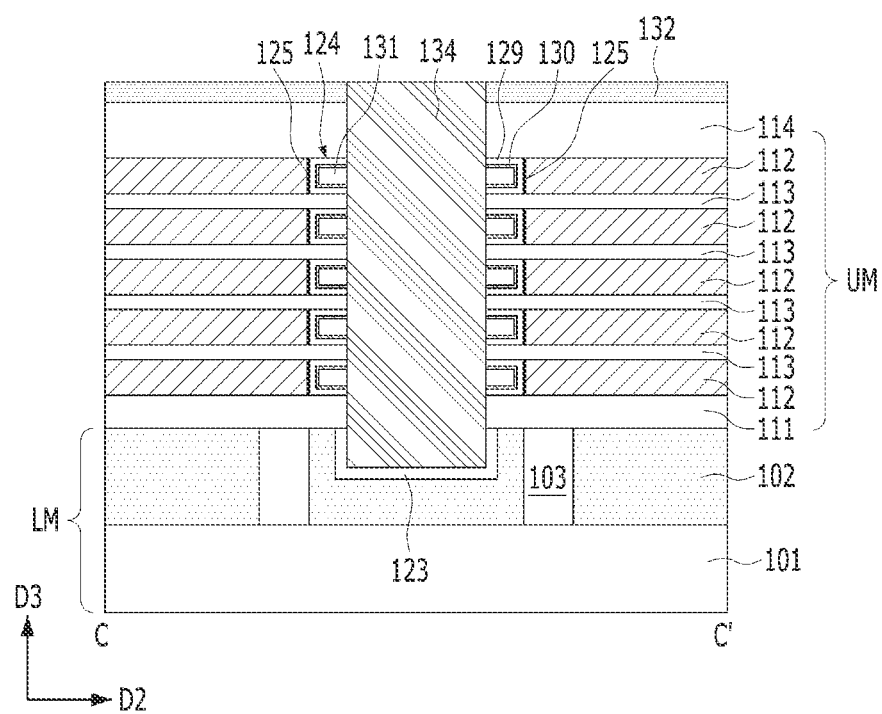

FIG. 13A is a layout illustrating a method for forming a bit line opening and a capacitor opening. FIG. 13B is a cross-sectional view taken along line A-A' of FIG. 13A. FIG. 13C is a cross-sectional view taken along line C-C' of FIG. 13A.

Referring to FIGS. 13A to 13C, a bit line opening 135 and a capacitor opening 136 may be formed. To form the bit line opening 135, the liner oxide layer 132 may be removed from the second cell opening 121. To form the capacitor opening 136, the liner oxide layer 132 may be removed from the third cell opening 122.

The bit line opening 135 may further include a bit line opening recess 135R, and the capacitor opening 136 may further include a capacitor opening recess 136R.

To form the bit line opening recess 135R, after the bit line opening 135 is formed, part of the sacrificial insulation layer pattern 129/130 and the active layer 131 may be horizontally recessed. To form the capacitor opening recess 136R, after the capacitor opening 136 is formed, part of the sacrificial insulation layer pattern 129/130 and the active layer 131 may be horizontally recessed. The bit line opening recess 135R and the capacitor opening recess 136R may be positioned between the insulation layers 113. Portions of the active layers 131 may be cut by the bit line opening recess 135R and the capacitor opening recess 136R. The remaining active layer 131 may be positioned between the bit line opening recess 135R and the capacitor opening recess 136R. The remaining active layer 131 may be horizontally recessed from an end of the insulation layer 113.

Separation layers 132I may be formed between the active layers 131. The separation layers 132I may denote the liner oxide layer 132 remaining after the bit line opening 135 and the capacitor opening 136 are formed. The separation layers 132I may be positioned on both sides of the active body 134 along the first direction D1 and between the active layers 131 neighboring along the second direction D2. The active layers 131 may be supported by the first and second supporters 117 and 118.

Figure 14A:
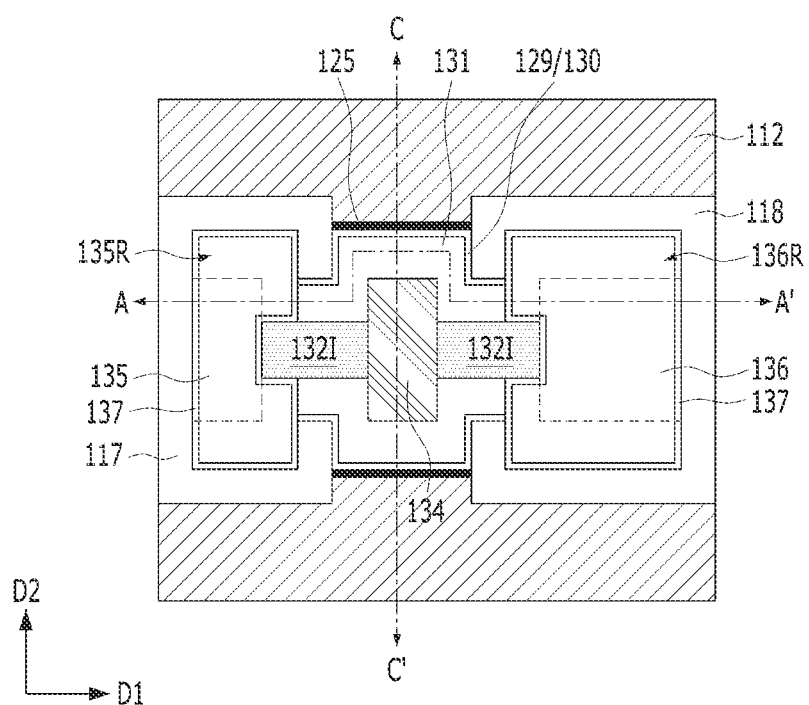
Figure 14B:
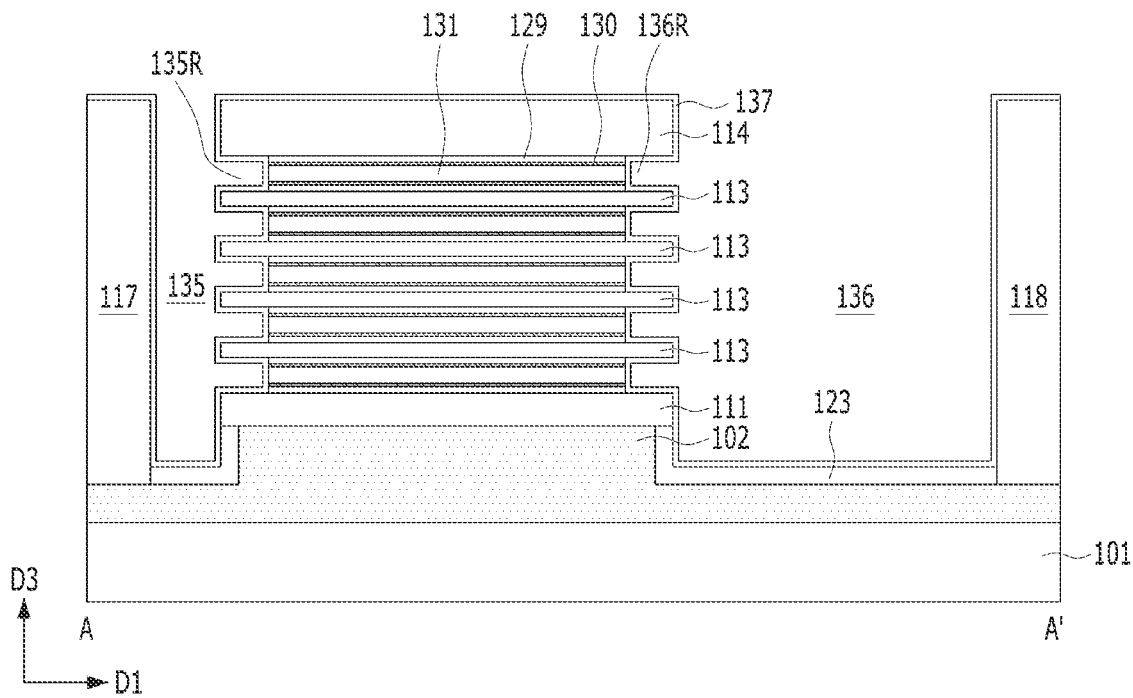
Figure 14C:
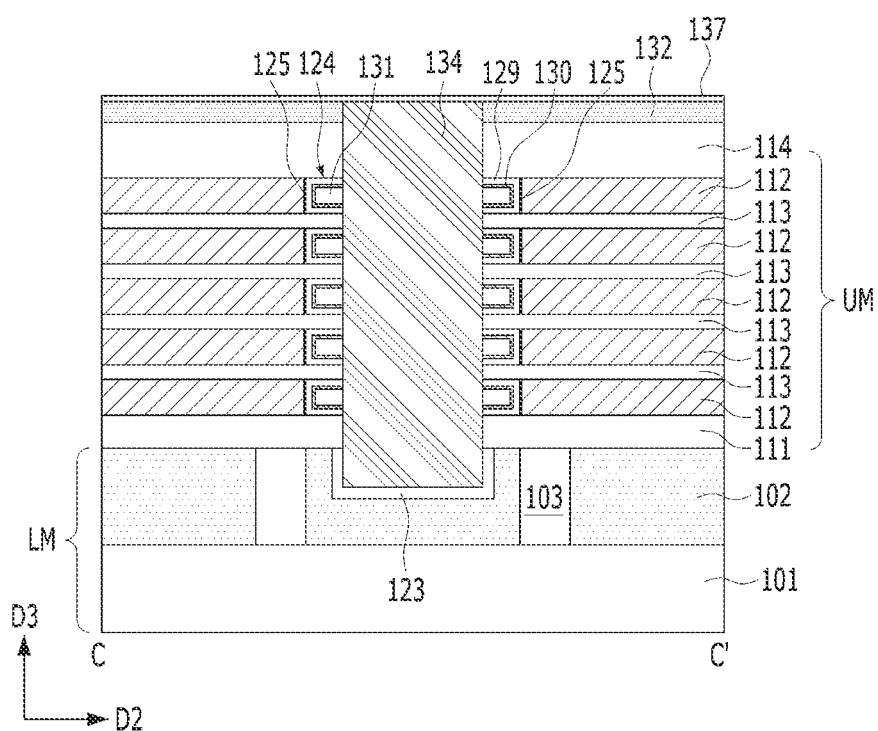

FIG. 14A is a layout illustrating a method for forming a polysilicon layer. FIG. 14B is a cross-sectional view taken along line A-A' of FIG. 14A. FIG. 14C is a cross-sectional view taken along line C-C' of FIG. 14A.

Referring to FIGS. 14A to 14C, a conductive liner layer 137 may be formed. The conductive liner layer 137 may include polysilicon, metal, metal nitride, or a combination thereof. The conductive liner layer 137 may include a polysilicon layer doped with an N-type impurity which may be referred to as an N-type polysilicon layer. The conductive liner layer 137 may include a stack of N-type polysilicon layer and titanium nitride.

The conductive liner layer 137 may conformally cover the bit line opening 135 and the capacitor opening 136. The conductive liner layer 137 may conformally cover the bit line opening recess 135R and the capacitor opening recess 136R. The impurity in the conductive liner layer 137 may be spread to both ends of the active layer 131 by a subsequent thermal process to form, for example, a source/drain (not shown).

Figure 15A:
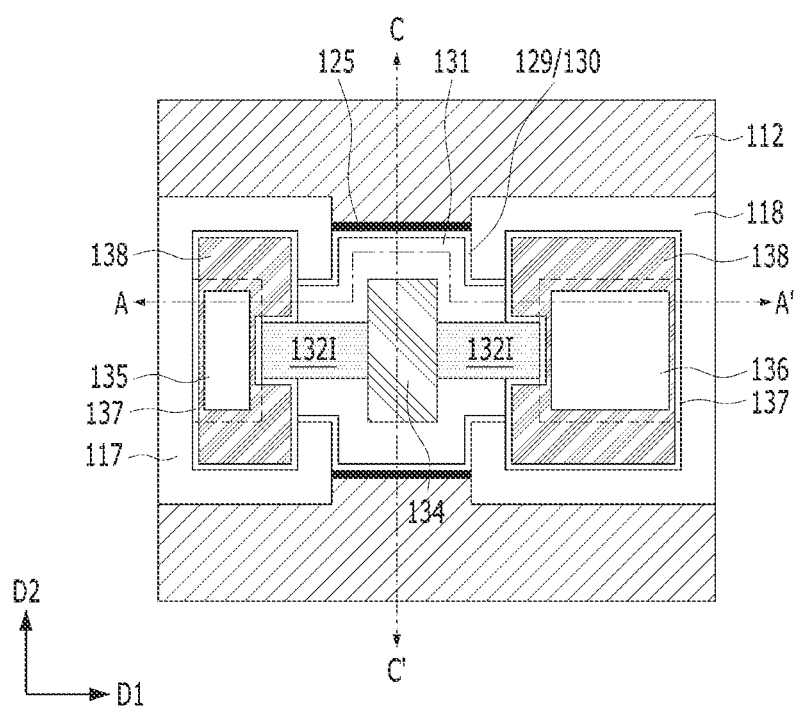
Figure 15B:
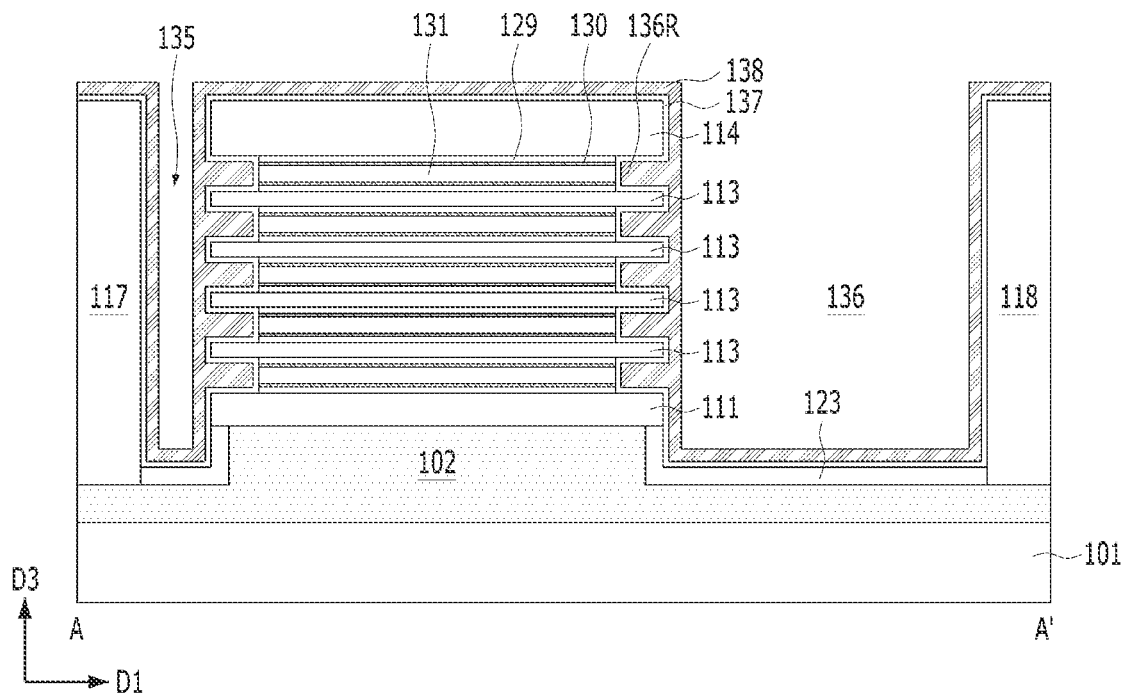
Figure 15C:
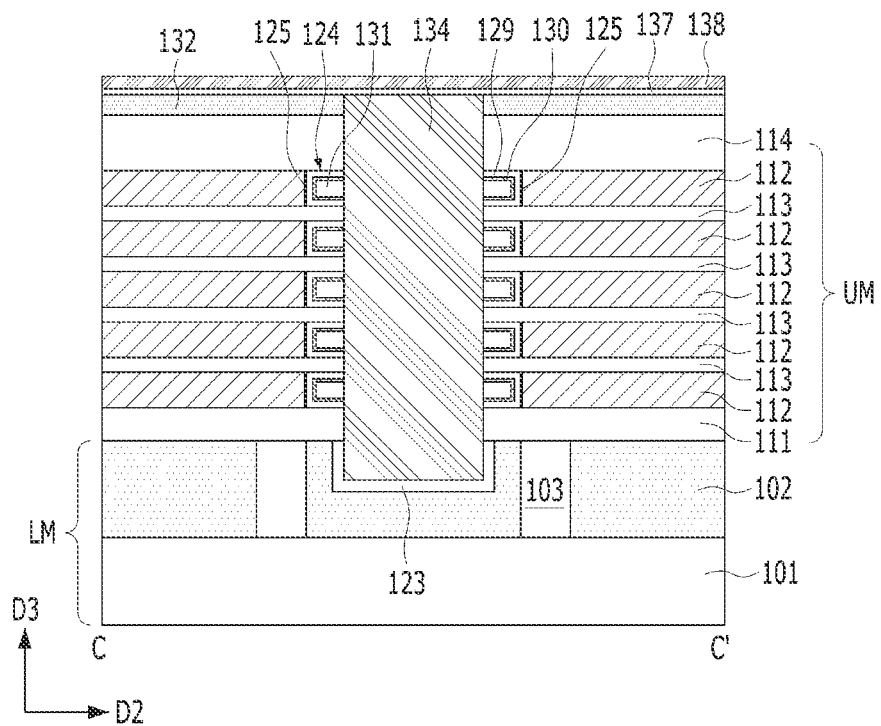

FIG. 15A is a layout illustrating a method for forming a capping oxide layer. FIG. 15B is a cross-sectional view taken along line A-A' of FIG. 15A. FIG. 15C is a cross-sectional view taken along line C-C' of FIG. 15A.

Referring to FIGS. 15A to 15C, a capping oxide layer 138 may be formed on the conductive liner layer 137. The capping oxide layer 138 may fill the bit line opening recess 135R and the capacitor opening recess 136R.

Figure 16A:
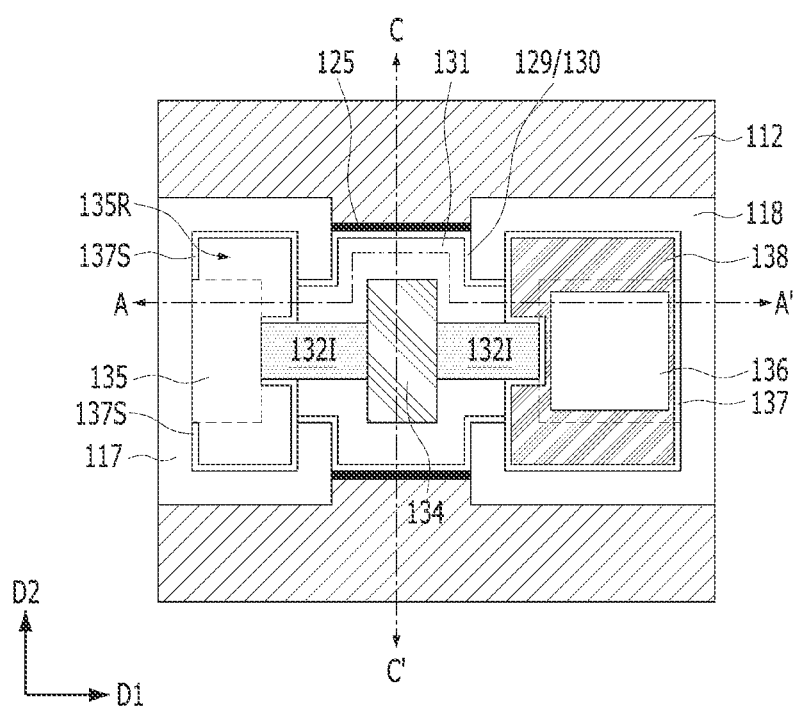
Figure 16B:
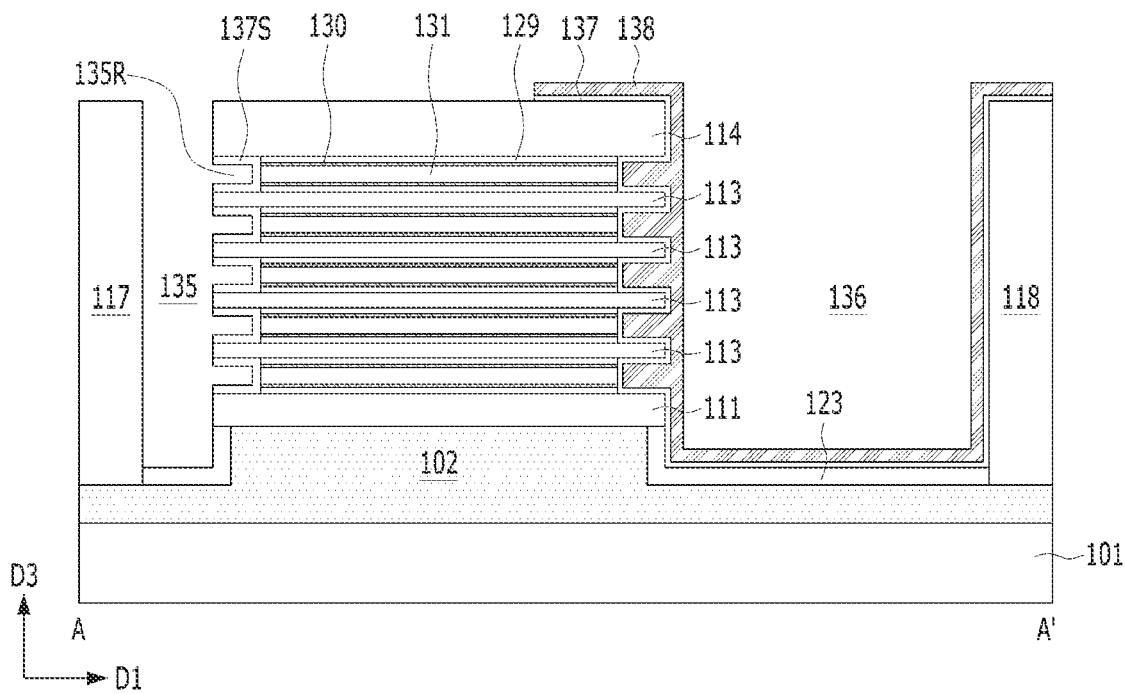
Figure 16C:
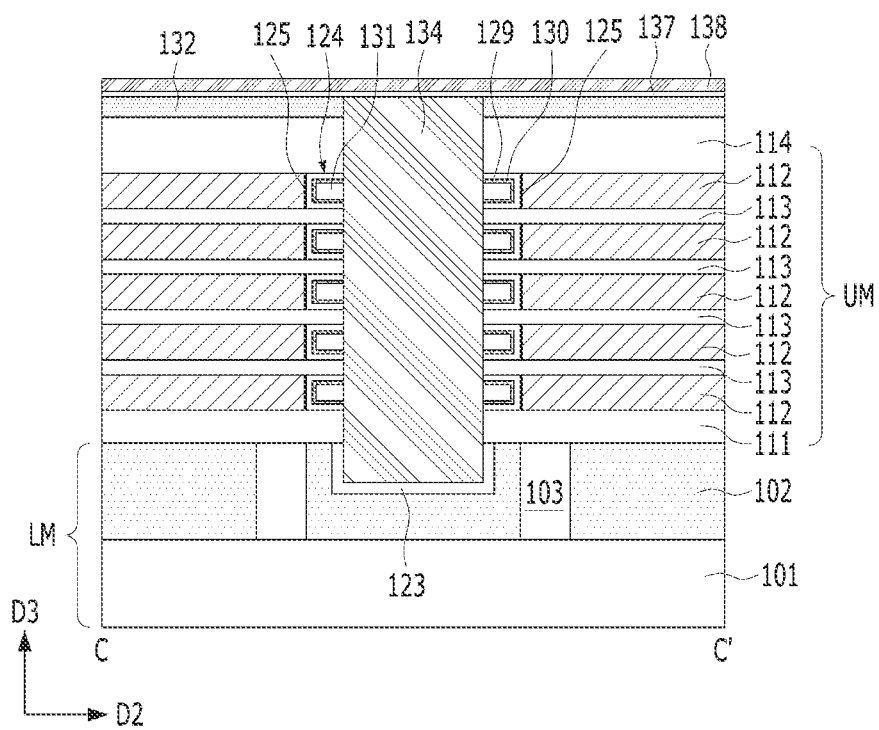

FIG. 16A is a layout illustrating a method for cutting the polysilicon layer. FIG. 16B is a cross-sectional view taken along line A-A' of FIG. 16A. FIG. 16C is a cross-sectional view taken along line C-C' of FIG. 16A.

Referring to FIGS. 16A to 16C, the capping oxide layer 138 may be selectively removed from the bit line opening 135. After the capping oxide layer 138 is removed, the conductive liner layer 137 may be selectively cut from the bit line opening 135.

Thus, the conductive liner layer 137S may remain only inside the bit line opening recess 135R. The conductive liner layer 137S may be referred to as a bit line contact node 137S. The bit line contact node 137S may have a cylinder shape. A plurality of bit line contact nodes 137S may be positioned along the third direction D3, and the bit line contact nodes 137S may be spaced apart from one another. The bit line contact node 137S may be positioned at the same level as the active layer 131. Alternatively, the bit line contact node 137S may be shaped to fill the bit line opening recess 135R.

The bit line contact node 137S and the active layer 131 may directly contact each other. By a subsequent thermal process, the impurity may be spread from the bit line contact node 137S to the active layer 131, so that a first source/drain (not shown) may be formed. The subsequent thermal process for forming the first source/drain may be performed after the conductive liner layer 137 is deposited.

Figure 17A:
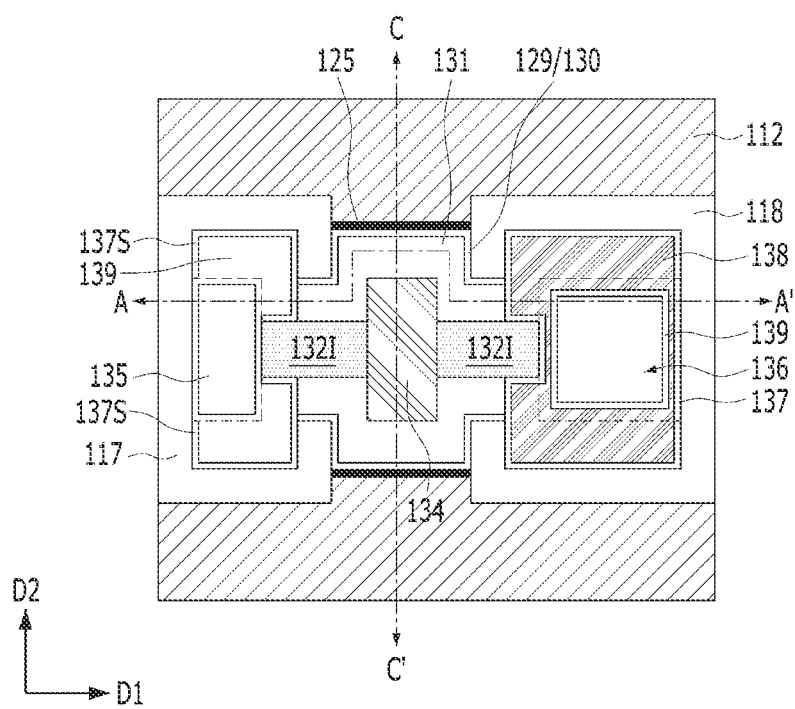
Figure 17B:
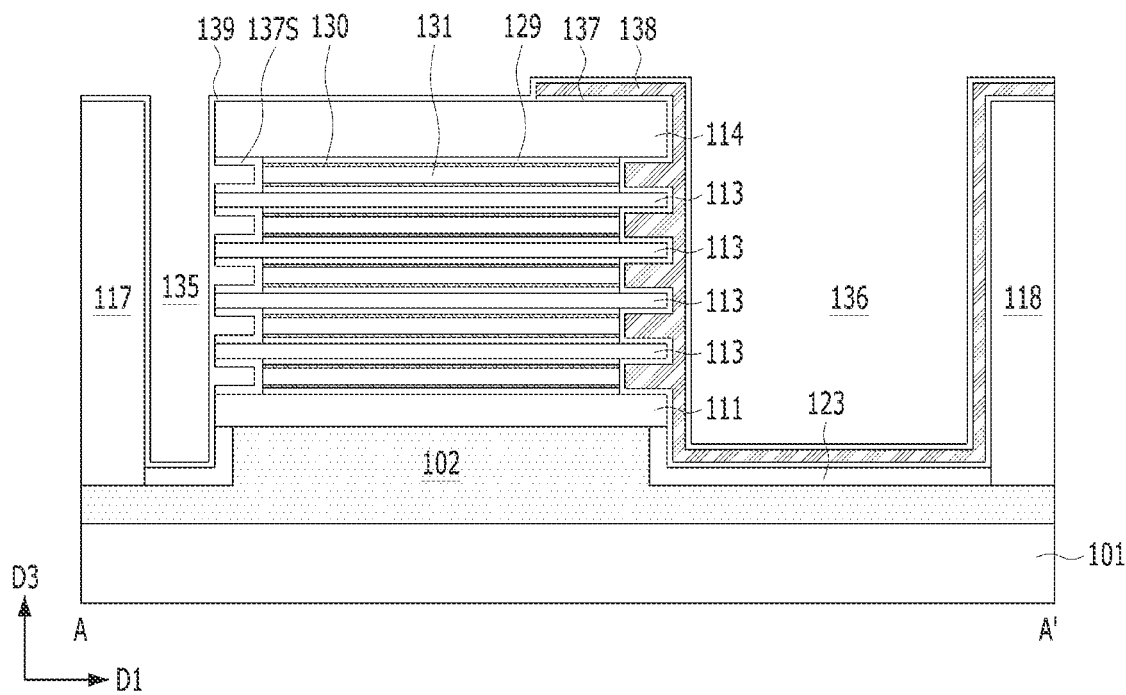
Figure 17C:
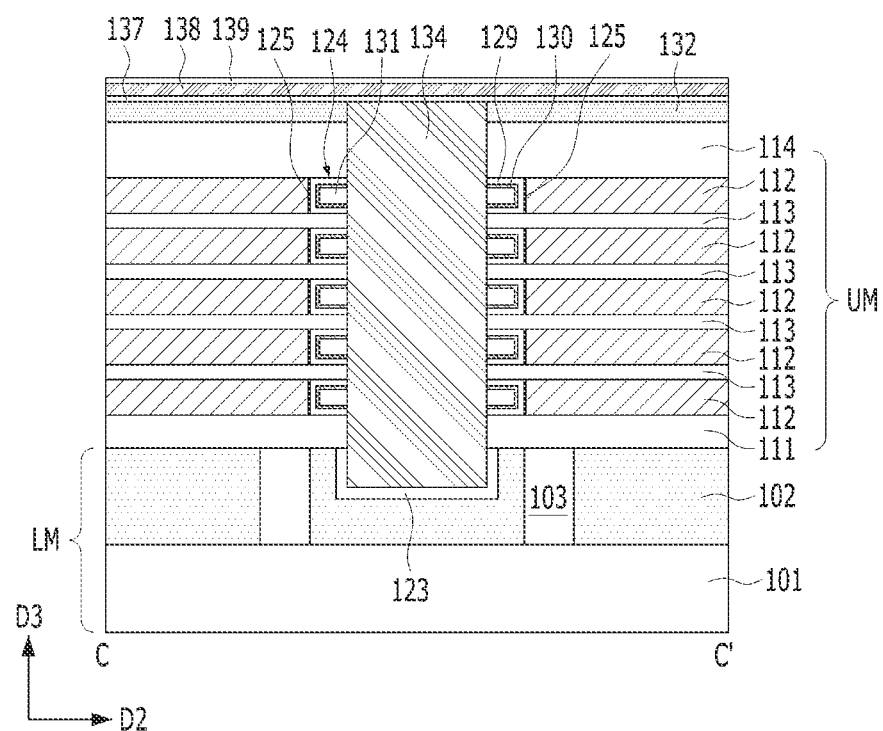

FIG. 17A is a layout illustrating a method for forming a barrier layer. FIG. 17B is a cross-sectional view taken along line A-A' of FIG. 17A. FIG. 17C is a cross-sectional view taken along line C-C' of FIG. 17A.

Referring to FIGS. 17A to 17C, a barrier layer 139 may be formed on the bit line contact node 137S. The barrier layer 139 may fill the bit line opening recess 135R on the bit line contact node 137S. The barrier layer 139 may include metal nitride, metal silicide, or a combination thereof. The barrier layer 139 may include titanium nitride. According to an embodiment, an ohmic contact layer, such as of metal silicide, may be formed between the barrier layer 139 and the bit line contact node 137S. The barrier layer 139 may conformally cover the capacitor opening 136.

Figure 18A:
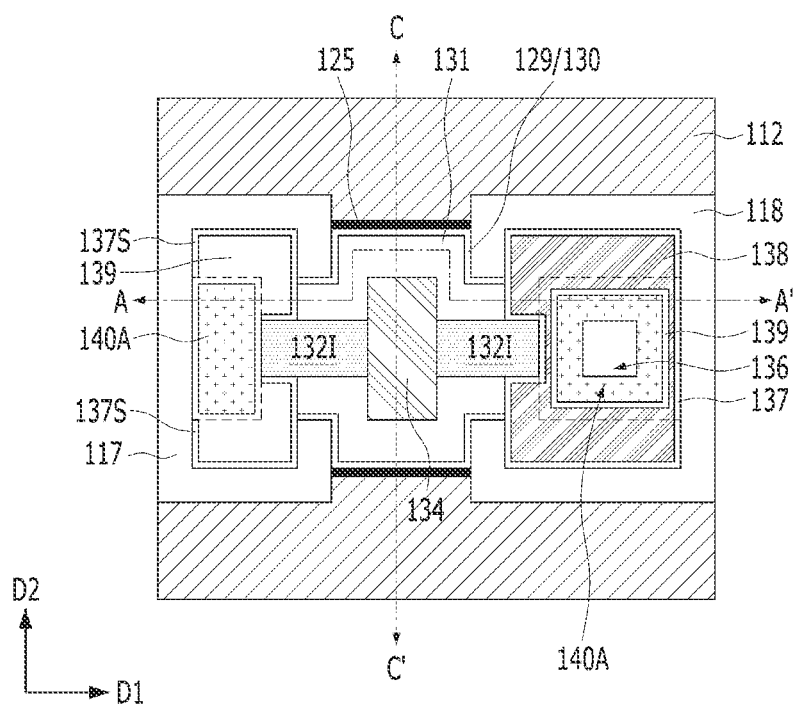
Figure 18B:
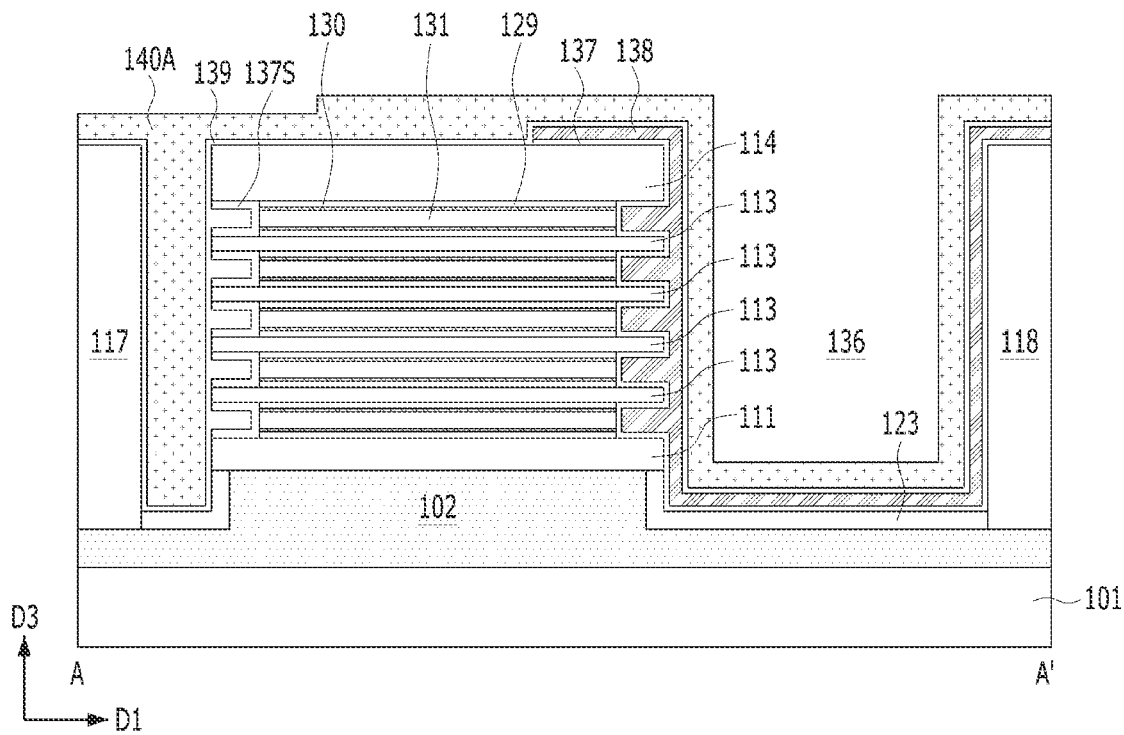
Figure 18C:
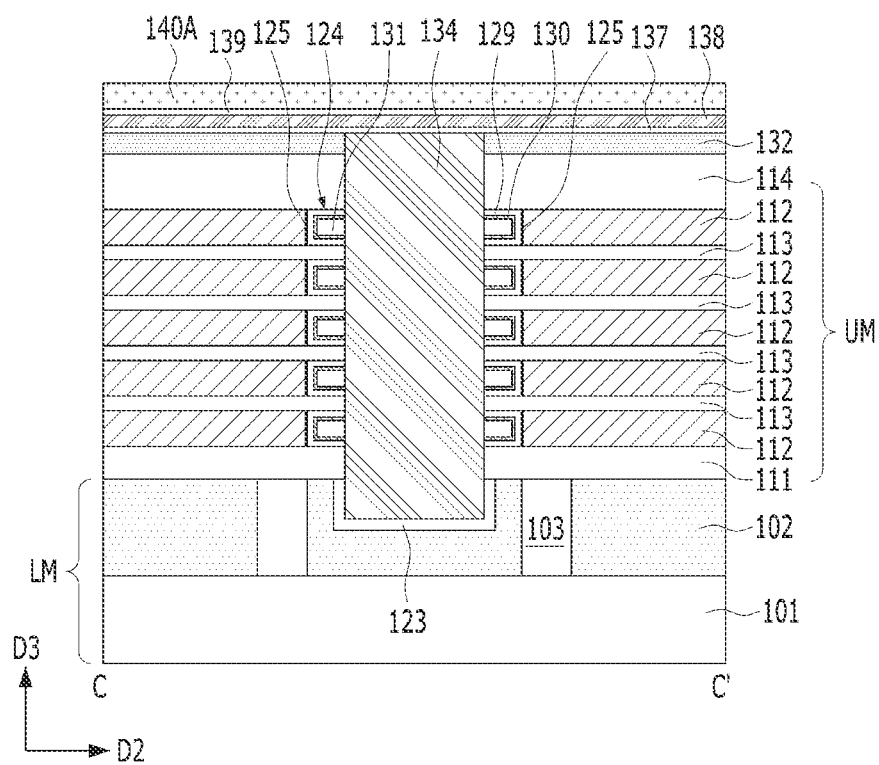

FIG. 18A is a layout illustrating a method for forming a bit line layer. FIG. 18B is a cross-sectional view taken along line A-A' of FIG. 18A. FIG. 18C is a cross-sectional view taken along line C-C' of FIG. 18A.

Referring to FIGS. 18A to 18C, a bit line layer 140A may be formed on the barrier layer 139. The bit line layer 140A may fill the bit line opening 135 on the barrier layer 139. The bit line layer 140A may include metal, metal nitride, metal silicide, or a combination thereof. The bit line layer 140A may include tungsten. The bit line layer 140A may fill the capacitor opening 136.

Figure 19A:
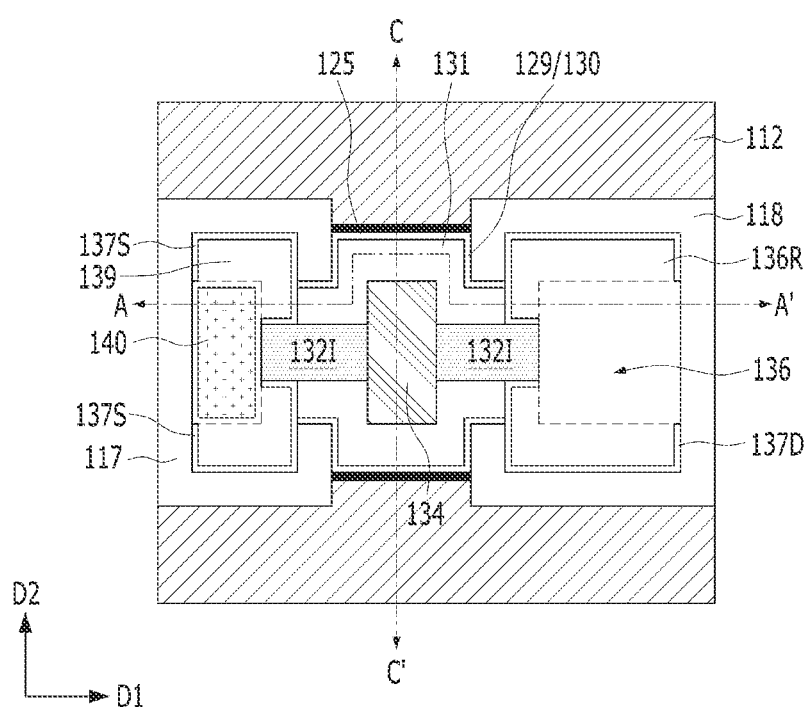
Figure 19B:
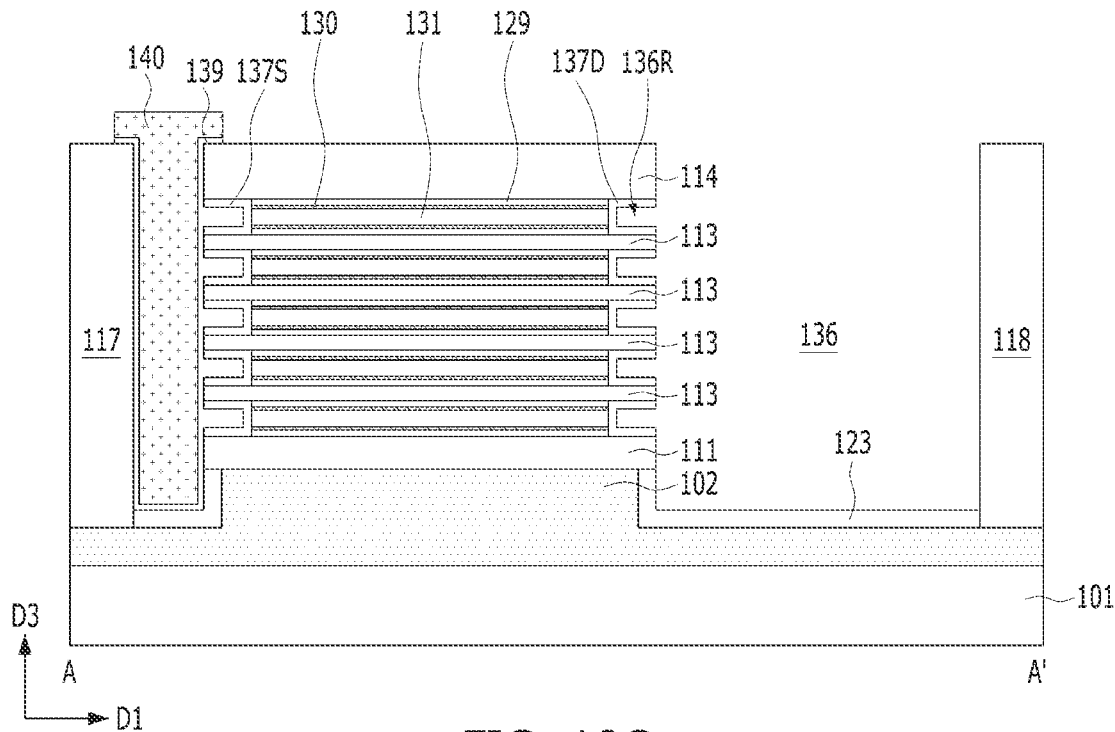
Figure 19C:
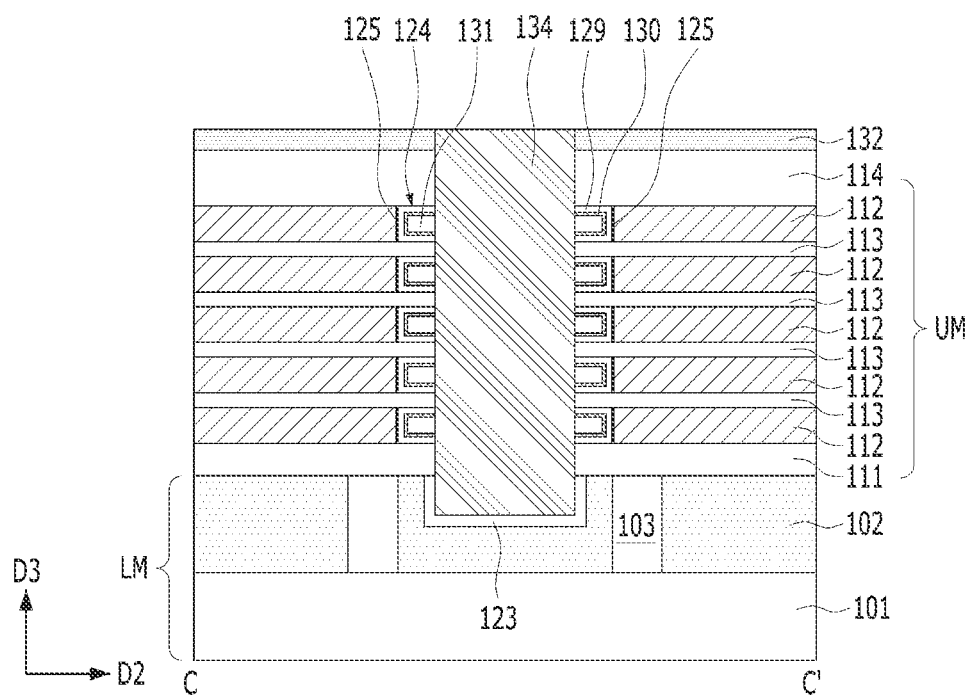

FIG. 19A is a layout illustrating a method for forming a bit line. FIG. 19B is a cross-sectional view taken along line A-A' of FIG. 19A. FIG. 19C is a cross-sectional view taken along line C-C' of FIG. 19A.

Referring to FIGS. 19A to 19C, a bit line 140 may be formed in the bit line opening 135. To form the bit line 140, the bit is line layer 140A may be selectively etched. The bit line 140 may be vertically oriented from the lower structure LM. The bit line layer 140A may be removed from the capacitor opening 136.

After the bit line 140 is formed, the capacitor opening 136 may be exposed again. Continuously, the barrier layer 139 and the capping oxide layer 138 may be removed from the capacitor opening 136. The barrier layer 139 may be positioned in the bit line opening 135 while contacting the bit line 140. The bit line 140, the barrier layer 139, and the bit line contact node 137S may be electrically connected with one another.

Next, the conductive liner layer 137 may be selectively etched from the capacitor opening 136. Thus, a capacitor contact node 137D may be formed in the capacitor opening recess 136R. The capacitor contact node 137D may be referred to as a 'storage contact node' or 'storage node contact plug.' The capacitor contact node 137D and the active layer 131 may directly contact each other. By a subsequent thermal process, the impurity may be spread from the capacitor contact node 137D to the active layer 131, so that a second source/drain (not shown) may be formed. The second source/drain may also be formed by thermal treatment after the bit line contact node 137S is formed. That is, the first source/drain and the second source/drain may be simultaneously formed. The capacitor contact node 137D may have a cylinder shape. A plurality of capacitor contact nodes 137D may be positioned along the third direction D3, and the capacitor contact nodes 137D may be spaced apart from one another. The capacitor contact node 137D may be positioned at the same level as the active layer 131. The capacitor contact node 137D may play a role as a storage node (or lower electrode) of the capacitor. The capacitor contact node 137D may also be denoted a storage node. According to another embodiment, the capacitor contact node 137D, also functioning as a storage node, may be shaped to fill the capacitor opening recess 136R.

Figure 20A:
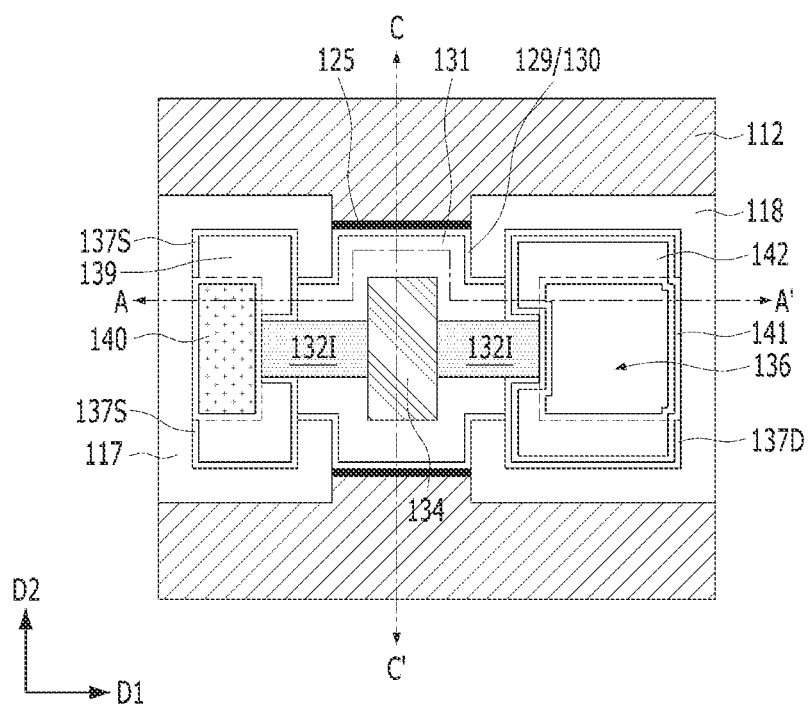
Figure 20B:
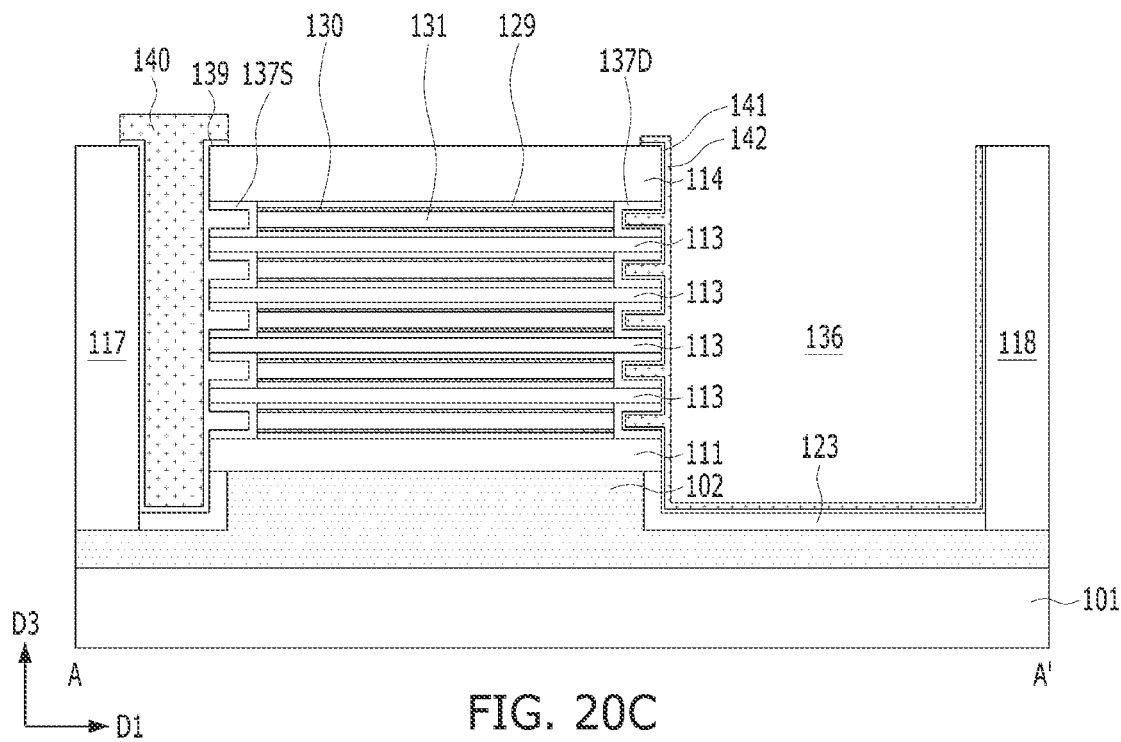
Figure 20C:
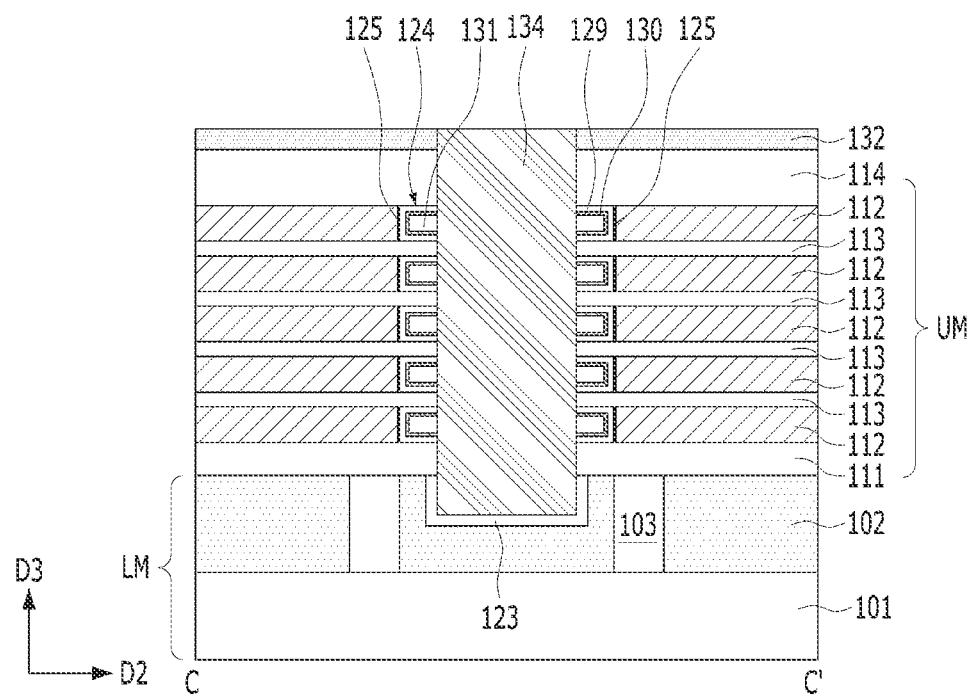

FIG. 20A is a layout illustrating a method for forming a capacitor. FIG. 20B is a cross-sectional view taken along line A-A' of FIG. 20A. FIG. 20C is a cross-sectional view taken along line C-C' of FIG. 20A.

Referring to FIGS. 20A to 20C, a dielectric layer 141 and a plate 142 may be sequentially formed on the capacitor contact node 137D. Before the dielectric layer 141 is formed, a storage node (not shown) which connects to the capacitor contact node 137D may further be formed by a deposition and etching of a metal-base material. The storage node may have a cylinder shape like the capacitor contact node 137D. The storage node may include titanium nitride.

The dielectric layer 141 may conformally cover the capacitor opening 136, and the plate 142 may fully fill the capacitor opening recess 136R on the dielectric layer 141.

To form the dielectric layer 141 and the plate 142, a dielectric material and a plate layer are formed on the capacitor opening 136 and may then be etched to remain in the capacitor opening 136.

The dielectric layer 141 may include a single-layered material, a multi-layer material, a laminated material, an intermixing material, or a combination thereof. The dielectric layer 141 may include a high-k material. The dielectric layer 141 may have a higher dielectric constant than silicon oxide ($SiO_2$). The silicon oxide may have a dielectric constant of about 3.9, and the dielectric layer 141 may include a material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), or a combination thereof. The dielectric layer 141 may be formed by atomic layer deposition (ALD).

The dielectric layer 141 may be formed of a zirconium-based oxide (Zr-based oxide). The dielectric layer 141 may have a stacked structure including zirconium oxide ($ZrO_2$). The stacked structure including the zirconium oxide ($ZrO_2$) may include a ZA($ZrO_2/Al_2O_3$) or a ZAZ($ZrO_2/Al_2O_3/ZrO_2$). The ZA may have a stacked structure in which an aluminum oxide $Al_2O_3$ is stacked on a zirconium oxide $ZrO_2$. The ZAZ may have a stacked structure in which a zirconium oxide $ZrO_2$, an aluminum oxide $Al_2O_3$, and a zirconium oxide $ZrO_2$ are sequentially stacked. $ZrO_2$, ZA, and ZAZ stack may be denoted a zirconium oxide-base layer ($ZrO_2$-based layer). According to another embodiment, the dielectric layer 141 may form a hafnium-based oxide. The dielectric layer 141 may have a stacked structure including a hafnium oxide ($HfO_2$). The stacked structure including the hafnium oxide ($HfO_2$) may include a HA($HfO_2/Al_2O_3$) or an HAH($HfO_2/Al_2O_3/HfO_2$). The HA may have a stacked structure in which an aluminum oxide $Al_2O_3$ is stacked on a hafnium oxide $HfO_2$. The HAH may have a stacked structure in which a hafnium oxide $HfO_2$, an aluminum oxide $Al_2O_3$, and a hafnium oxide $HfO_2$ are sequentially stacked. $HfO_2$, HA, and HAH stack may be denoted a hafnium oxide-base layer ($HfO_2$-base layer). In the ZA, ZAZ, HA, and HAH, the aluminum oxide ($Al_2O_3$) may have a larger bandgap than the zirconium oxide ($ZrO_2$) and the hafnium oxide ($HfO_2$). The aluminum oxide ($Al_2O_3$) may have a lower dielectric constant than the zirconium oxide ($ZrO_2$) and the hafnium oxide ($HfO_2$). Thus, the dielectric layer 141 may include a stack of the high-k material and a high band gap material which has a larger band gap than the high-k material. The dielectric layer 141 may also include a silicon oxide $SiO_2$ as a high band gap material other than the aluminum oxide $Al_2O_3$. As the dielectric layer 141 includes a high band gap material, leakage current may be suppressed. The high band gap material may be extremely thin. The high band gap material may be thinner than the high-k material.

According to another embodiment, the dielectric layer 141 may include a laminated structure in which high-k materials and high band gap materials are alternately stacked. For example, the dielectric layer DE may include ZAZA($ZrO_2/Al_2O_3/ZrO_2/Al_2O_3$), ZAZAZ($ZrO_2/Al_2O_3/ZrO_2/Al_2O_3/ZrO_2$), HAHA($HfO_2/Al_2O_3/HfO_2/Al_2O_3$) or HAHAH($HfO_2$/$Al_2O_3$/$HfO_2$/$Al_2O_3$/$HfO_2$). In the above laminated structure, the aluminum oxide $Al_2O_3$ may be extremely thin.

In another embodiment, the dielectric layer 141 may include hafnium oxide having a tetragonal crystalline phase or zirconium oxide having a tetragonal crystalline phase.

In another embodiment, the dielectric layer 141 may have a stacked structure of hafnium oxide having a tetragonal crystalline phase or zirconium oxide having a tetragonal crystalline phase.

The plate 142 may include a metal-base material. The plate 142 may include metal nitride. The plate 142 may include metal, metal nitride, metal carbide, conductive metal nitride, conductive metal oxide, or a combination thereof. The plate 142 may be titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof.

Figure 21A:
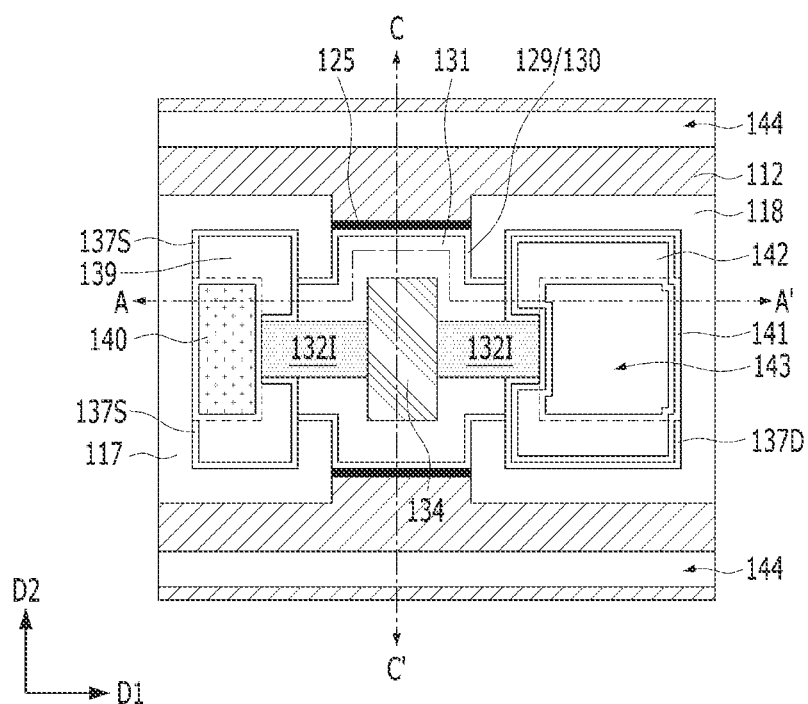
Figure 21B:
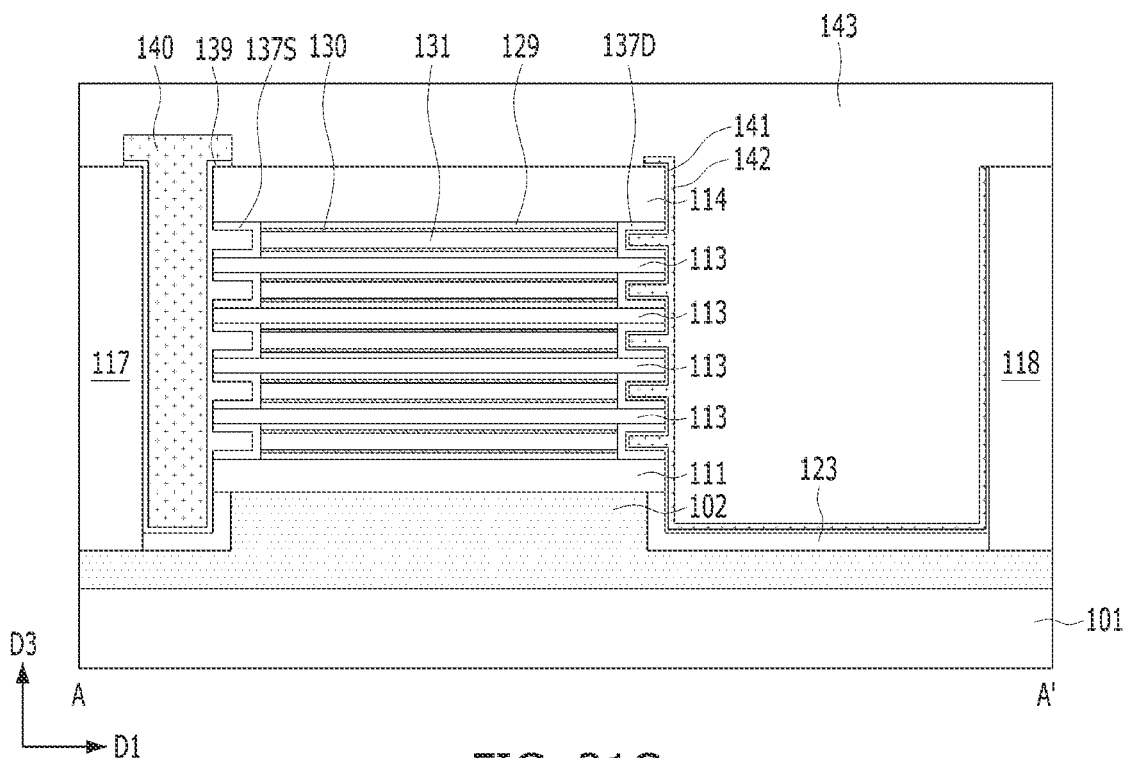
Figure 21C:
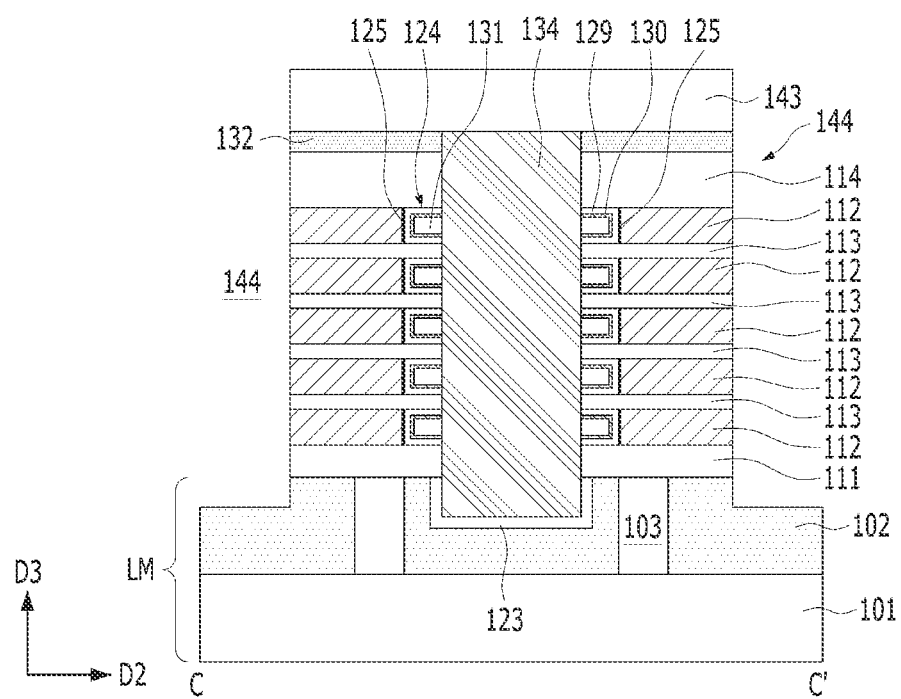

FIG. 21A is a layout illustrating a method for forming a slit. FIG. 21B is a cross-sectional view taken along line A-A' of FIG. 21A. FIG. 21C is a cross-sectional view taken along line C-C' of FIG. 21A.

Referring to FIGS. 21A to 21C, a separation insulation layer 143 may be formed to gap-fill the capacitor opening 136. The separation insulation layer 143 may cover the overall structure including the bit line 140 and the plate 142. The separation insulation layer 143 may, for example, include silicon oxide. The separation insulation layer 143 may fill the capacitor opening 136 on the plate 142.

Next, a slit 144 may be formed. The slit 144 may be formed by etching a plurality of layers. The active layer 131 and the slit 144 may be horizontally spaced apart from each other and be parallel with each other.

To form the slit 144, the separation insulation layer 143, the uppermost insulation layer 114, the insulation layers 113, the sacrificial layers 112, and the lowermost insulation layer 111 may be etched. The slit 144 may be shaped as a trench. Although not shown, a protection layer may be formed on the etch stop layers 102 after the slit 144 is formed.

Figure 22A:
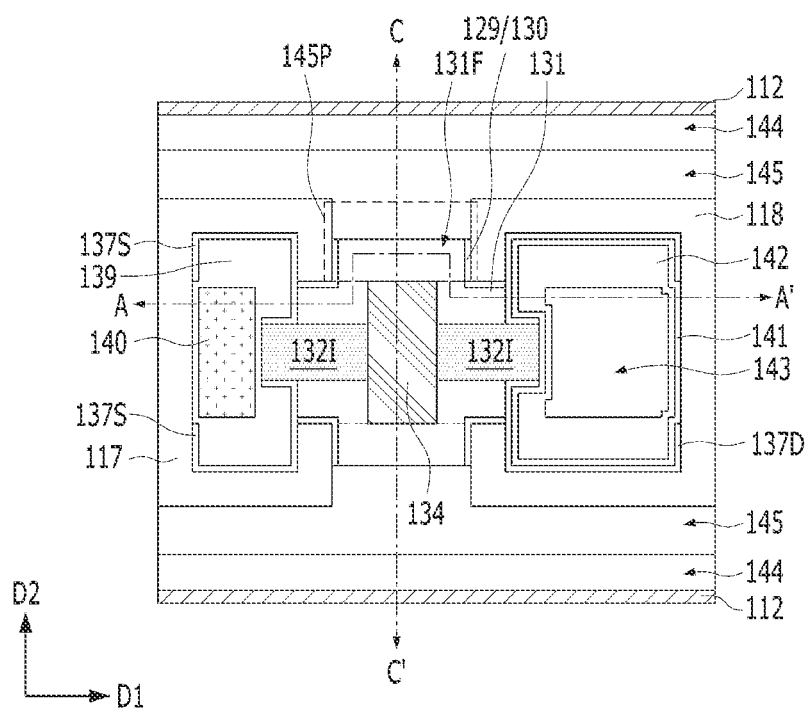
Figure 22B:
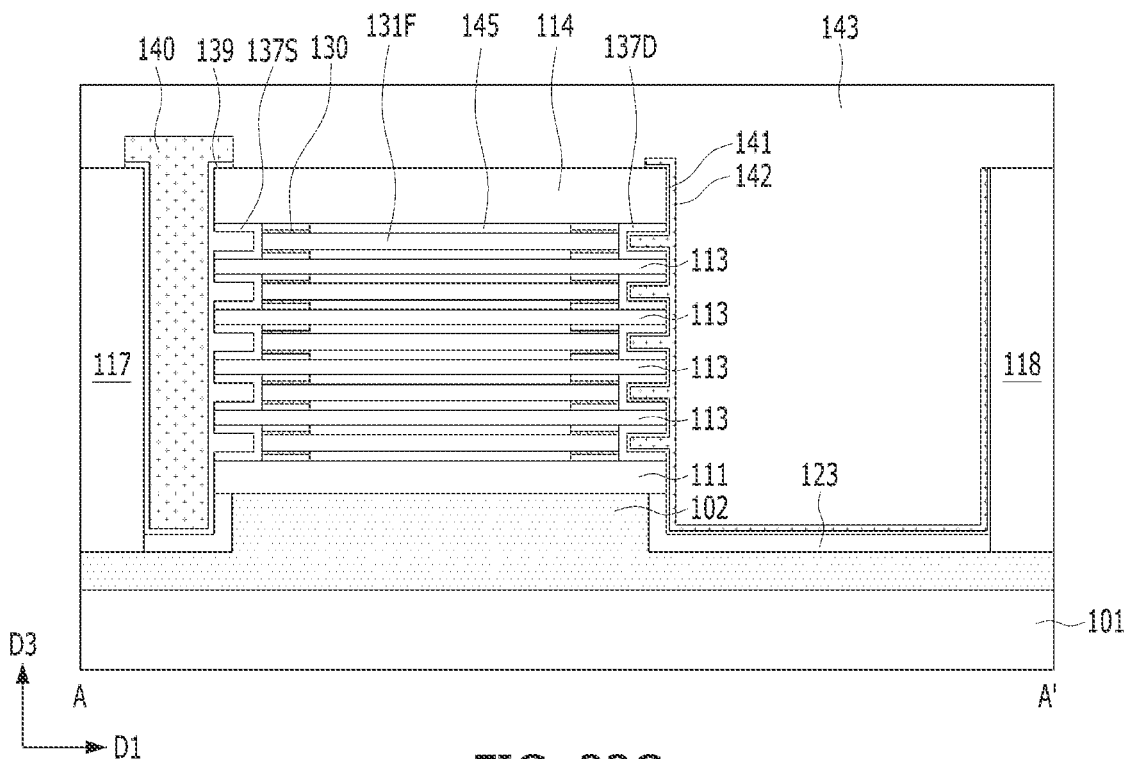
Figure 22C:
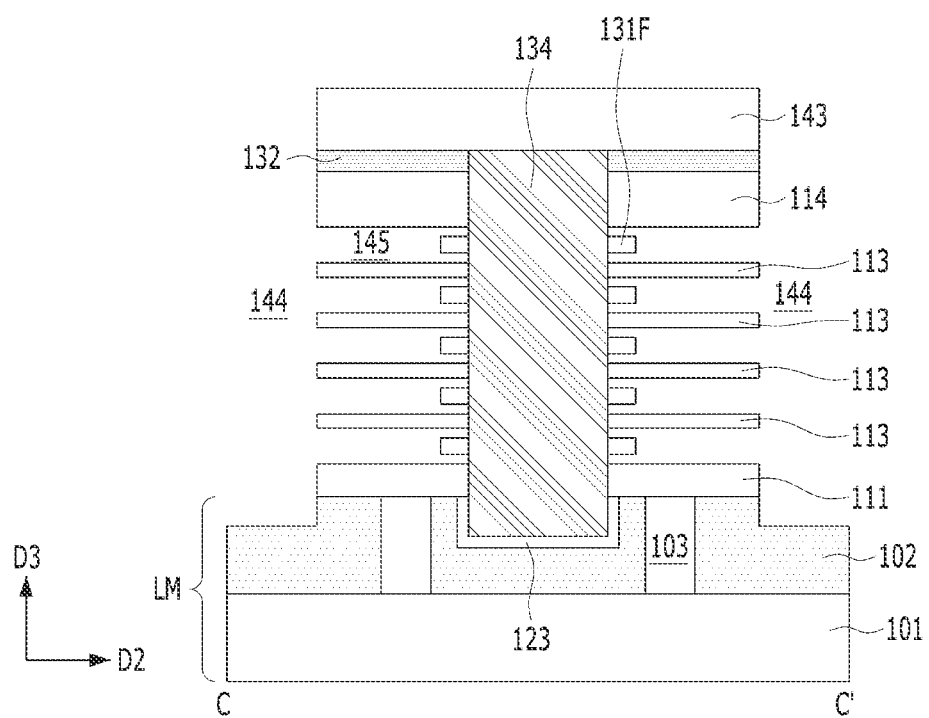

FIG. 22A is a layout illustrating a method for forming a gate recess. FIG. 22B is a cross-sectional view taken along line A-A' of FIG. 22A. FIG. 22C is a cross-sectional view taken along line C-C' of FIG. 22A.

Referring to FIGS. 22A to 22C, the sacrificial layers 112 may be selectively stripped via the slit 144. Thus, the sacrificial layers 112 may be selectively removed between the insulation layers 113.

Gate recesses 145 may be self-aligned and formed between the insulation layers 113 vertically stacked, by selectively removing the sacrificial layers 112.

Part of the selective oxide layer 125 may be exposed by the gate recesses 145. Subsequently, the selective oxide layer 125 may be removed to expose the sacrificial insulation layer pattern 129/130.

Although not shown, the gate recesses 145 may be expanded to the stepped structures, and the gate electrodes which are formed in a subsequent process may fill the edge portions of the gate recesses 145.

Next, part of the sacrificial insulation layer pattern 129/130 may be removed via the gate recesses 145, thereby exposing part of the active layer 131. The exposed portion of the active layer 131 may include a fin channel layer 131F. The fin channel layer 131F may be shaped to horizontally protrude to the gate recess 145. The fin channel layer 131F may be exposed along the second direction D2. The fin channel layer 131F may contact the active body 134. The sacrificial insulation layer pattern 129/130 may remain between the fin channel layer 131F and the first and second supporters 117 and 118.

The gate recesses 145 may include protrusions 145P towards the active layers 131. The protrusions 145P of the gate recesses 145 may expose the fin channel layer 131F.

Figure 23A:
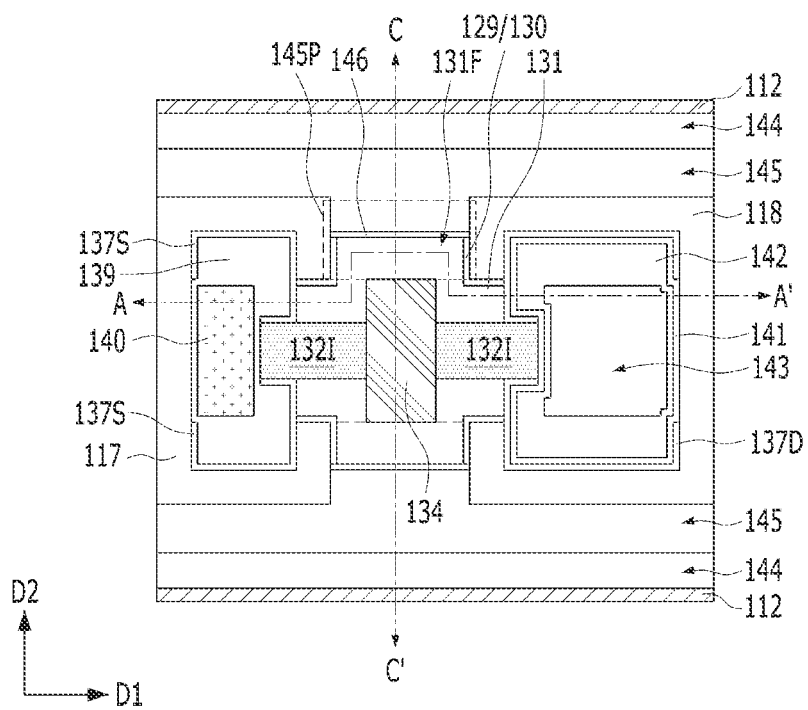
Figure 23B:
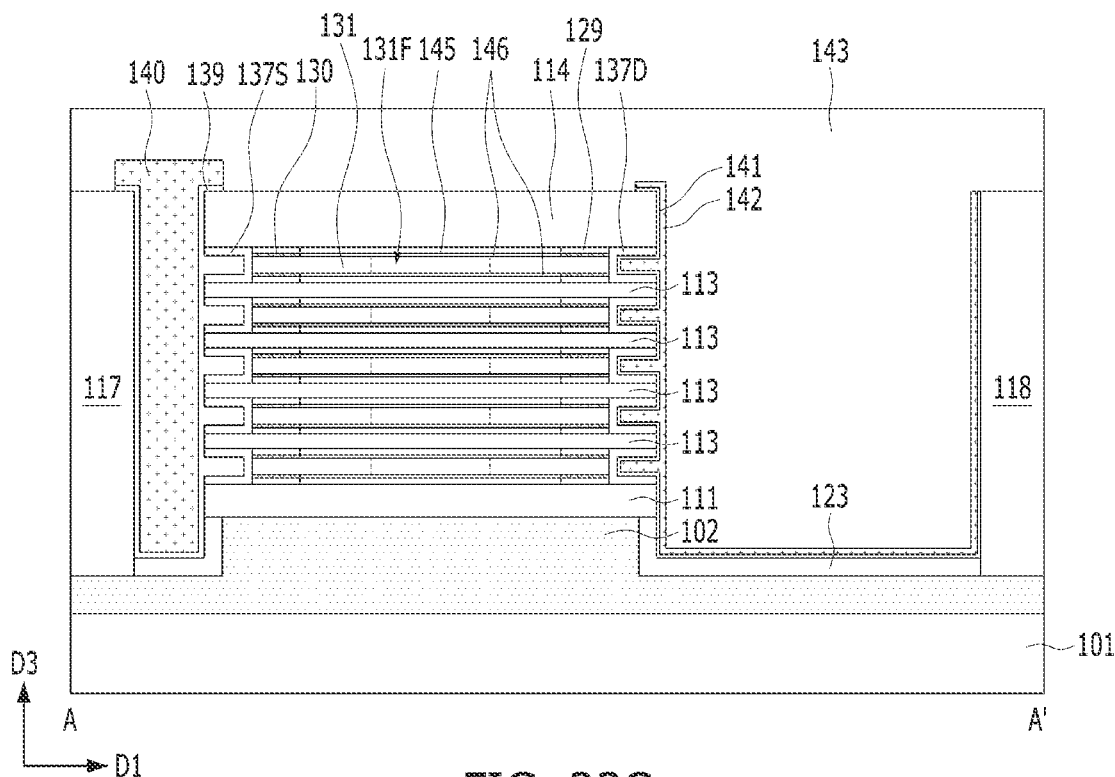
Figure 23C:
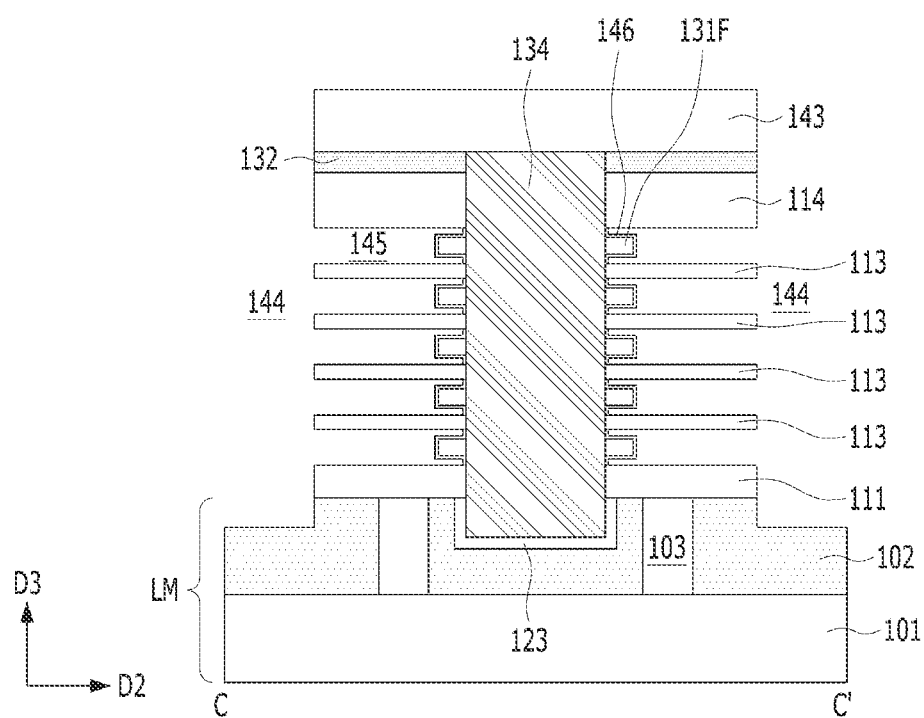

FIG. 23A is a layout illustrating a method for forming gate insulation layers. FIG. 23B is a cross-sectional view taken along line A-A' of FIG. 23A. FIG. 23C is a cross-sectional view taken along line C-C' of FIG. 23A.

Referring to FIGS. 23A to 23C, a gate insulation layer 146 may be formed on each of the top surface and bottom surface of the active layer 131. The gate insulation layer 146 may be formed on the surface of the fin channel layer 131F.

The gate insulation layers 146 may be formed by selectively oxidating the surface of the fin channel layer 131F and the active layers 131 exposed by the gate recesses 145.

Figure 24A:
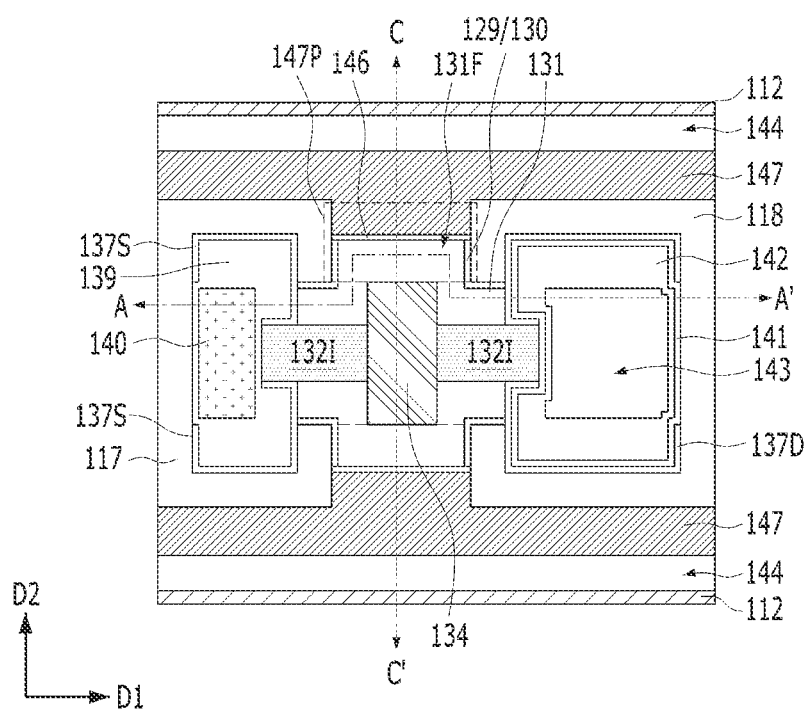
Figure 24B:
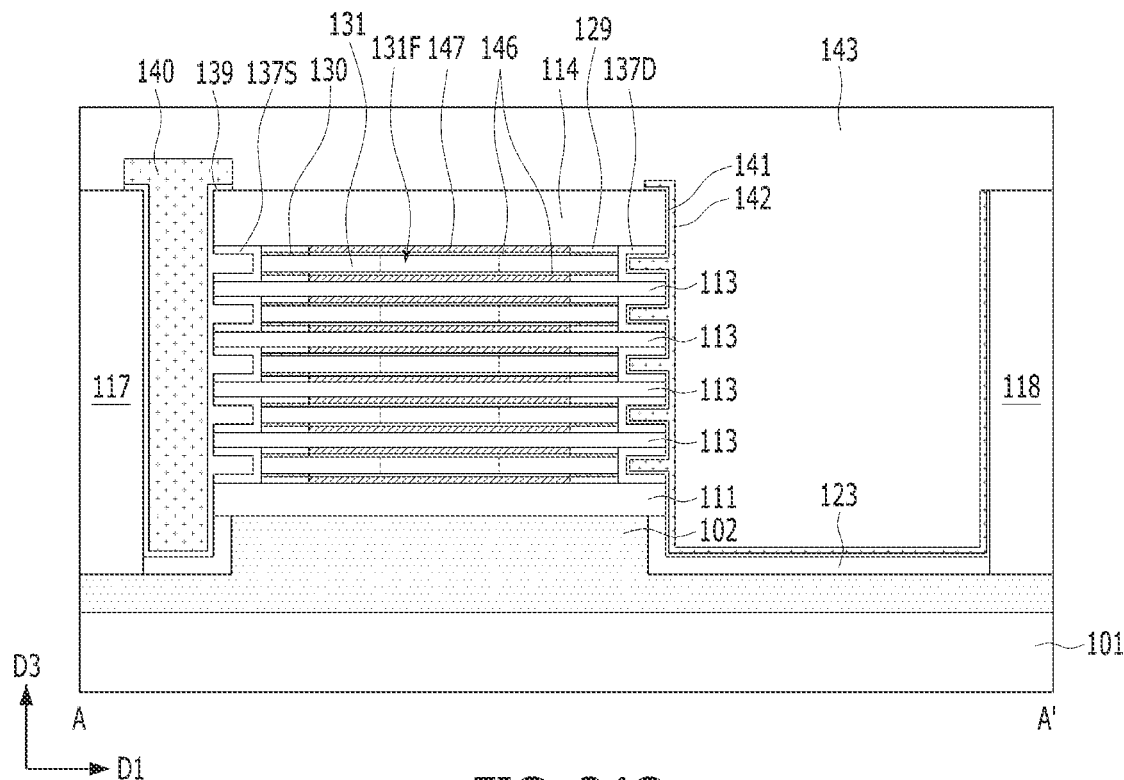
Figure 24C:
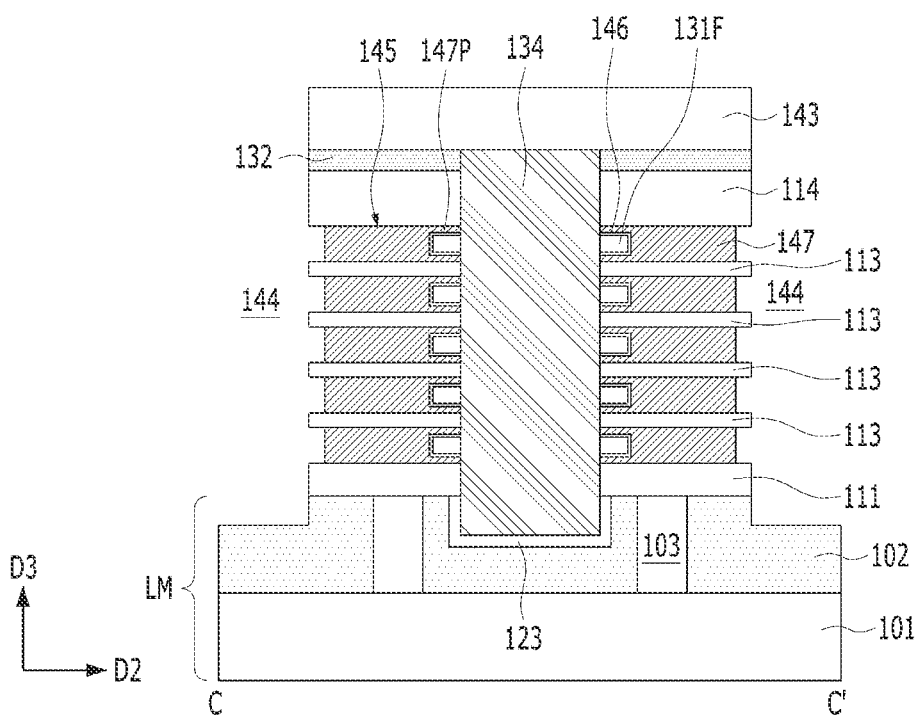

FIG. 24A is a layout illustrating a method for forming gate electrodes. FIG. 24B is a cross-sectional view taken along line A-A' of FIG. 24A. FIG. 24C is a cross-sectional view taken along line C-C' of FIG. 24A.

Referring to FIGS. 24A to 24C, gate electrodes 147 filling the gate recesses 145 may be formed on the gate insulation layers 146. The gate electrode 147 may be formed of a metal-base material. The gate electrode 147 may be formed by stacking titanium nitride and tungsten. For example, after titanium nitride is conformally formed on the gate recesses 145, the gate recesses 145 may be gap-filled using tungsten. Subsequently, the titanium nitride and tungsten may be etchbacked to form gate electrodes 147 vertically separated. This is called a gate electrode separation or isolation process, and edges of the gate electrodes 147 may be positioned inside the gate recesses 145. The edges of the gate electrodes 147 may be formed with undercuts between the insulation layers 113. According to another embodiment, the gate electrodes 147 may include impurity-doped polysilicon.

The gate electrodes 147 may individually include protrusions 147P filling the protrusions 145P of the gate recesses 145. The protrusions 147P of the gate electrodes 147 may cover the fin channel layer 131F on the gate insulation layer 146.

As described above, each of the plurality of gate electrodes 147 may horizontally extend along the first direction D1. The gate electrodes 147 may be vertically stacked along the third direction D3. The insulation layers 113 may be positioned between the gate electrodes 147 vertically stacked. The plurality of insulation layers 113 and the plurality of gate electrodes 147 may be alternately stacked vertically from the lower structure LM. The gate electrodes 147 and the active layers 131 may be positioned at the same level.

According to another embodiment, after the gate electrodes 147 are formed, the capacitor and the bit line may sequentially be formed.

Although not shown, the slit 144 may be filled with a slit insulation layer after the gate electrodes 147 are formed. The slit insulation layer refers to the slit insulation layer 148 of FIGS. 33A to 33C described below.

FIGS. 25A to 35C are views illustrating a method for manufacturing a memory device according to an embodiment of the present disclosure. In FIGS. 25A to 35C, the same reference numbers are used to denote the same elements as those in FIGS. 3A to 24C. No detailed description is given of duplicate elements. The layouts of FIGS. 25A to 35C may be sacrificial-level or gate electrode-level layouts.

Figure 25A:
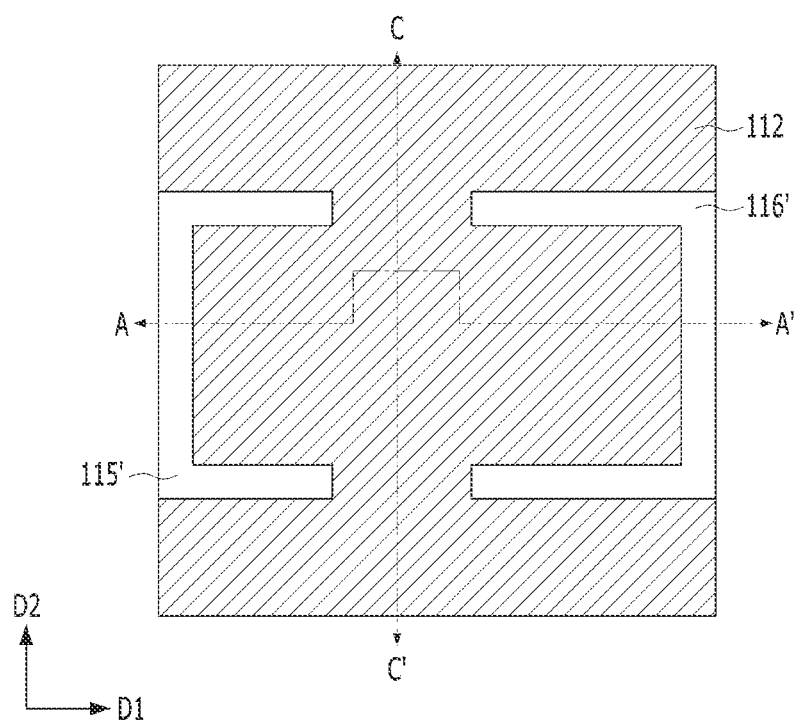
FIGS. 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, and 35C are views illustrating a method for manufacturing a memory device according to an embodiment of the present disclosure.
Figure 25B:
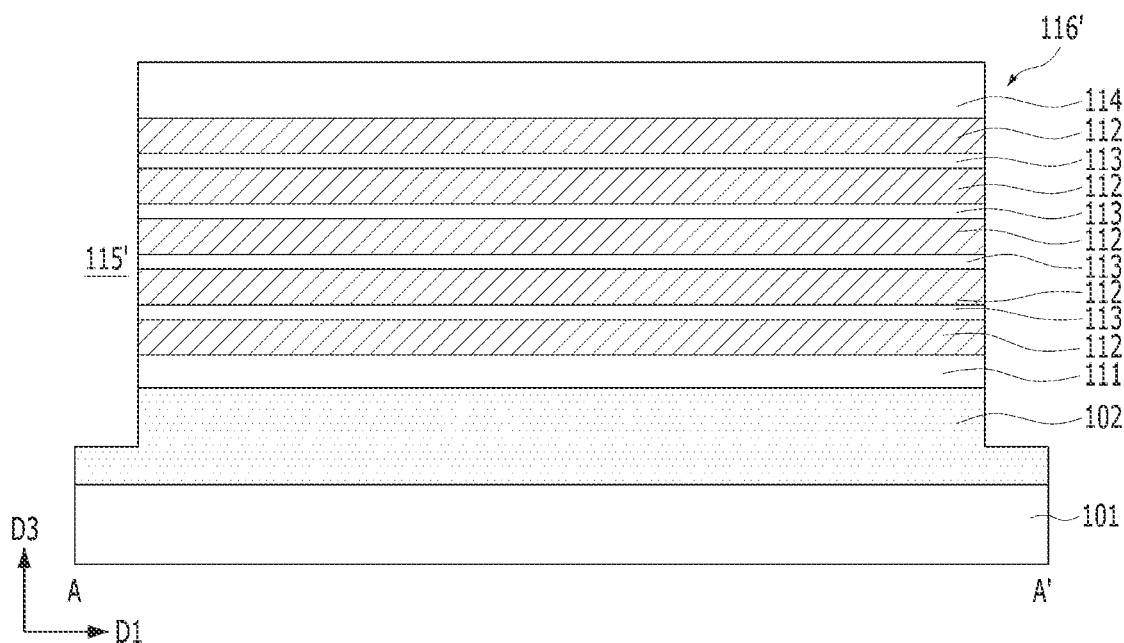
Figure 25C:
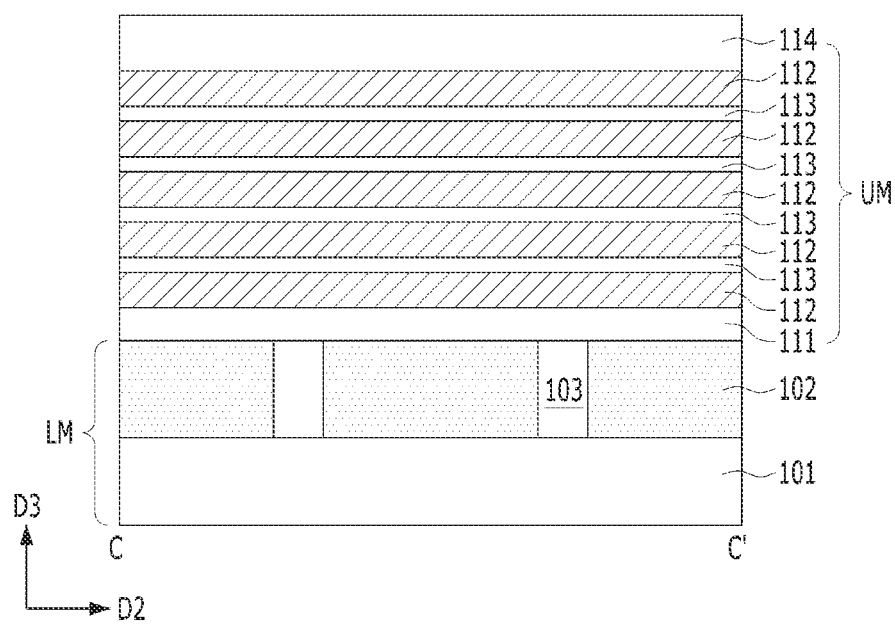

FIG. 25A is a layout illustrating a method for forming supporters. FIG. 25B is a cross-sectional view taken along line A-A' of FIG. 25A. FIG. 25C is a cross-sectional view taken along line C-C' of FIG. 25A.

Referring to FIGS. 25A to 25C, a first supporter opening 115' and a second supporter opening 116' may be formed by etching the upper structure UM. From a top view, the first and second supporter openings 115' and 116' may have a straight line shape. The first supporter opening 115' and the second supporter opening 116' may each include no bending edge. Referring back to FIG. 4A, according to an embodiment, the first supporter opening 115 and the second supporter opening 116 each include a bending edge.

Figure 26A:
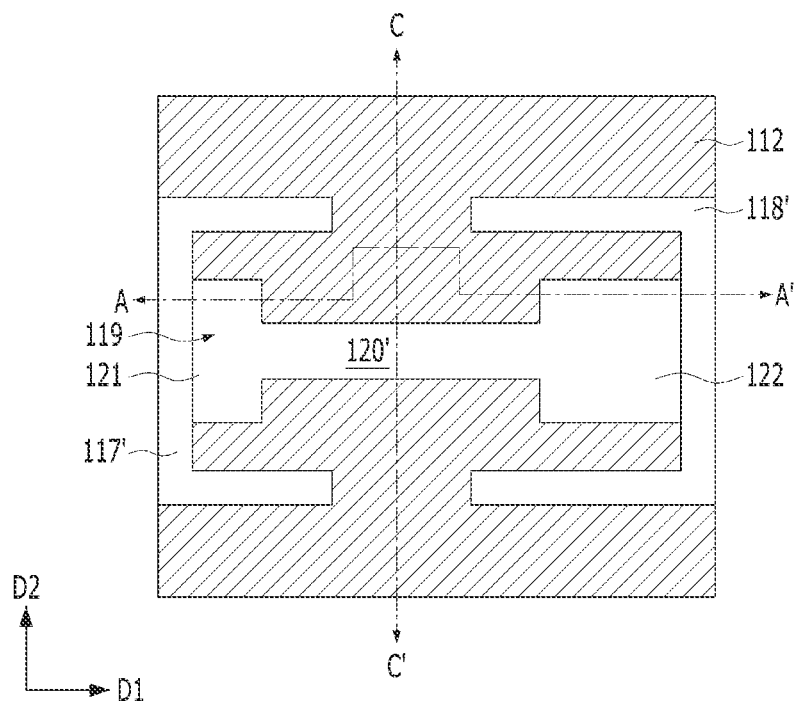
Figure 26B:
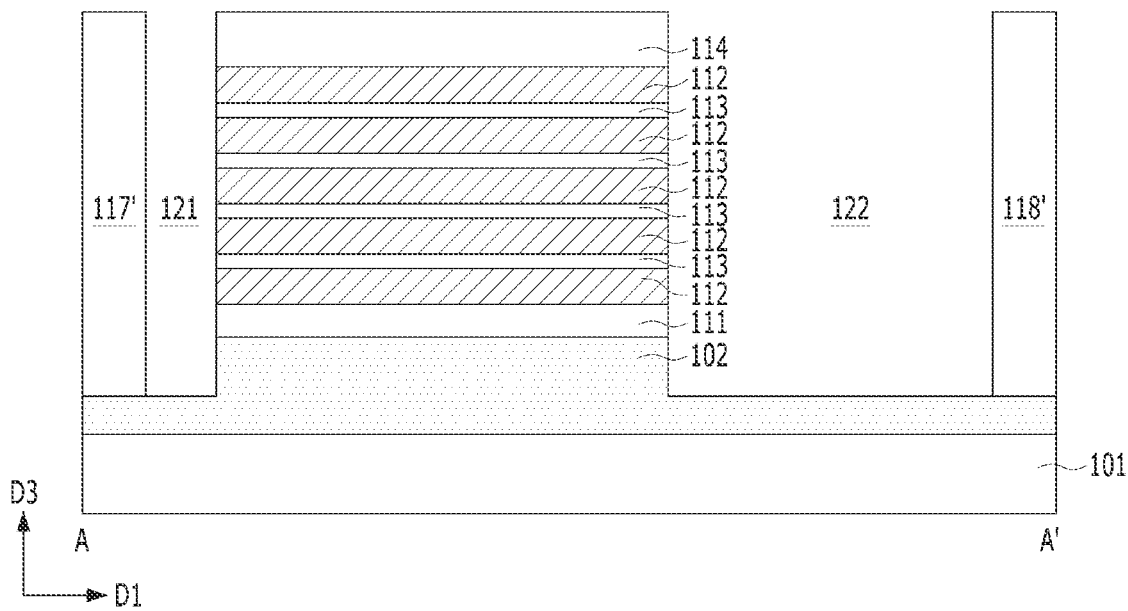
Figure 26C:
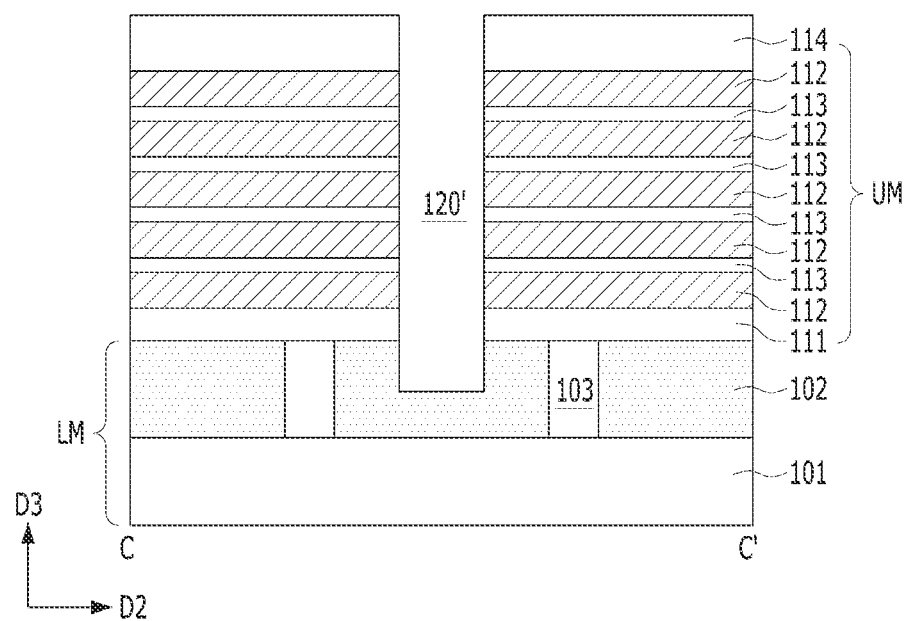

FIG. 26A is a layout illustrating a method for forming supporters. FIG. 26B is a cross-sectional view taken along line A-A' of FIG. 26A. FIG. 26C is a cross-sectional view taken along line C-C' of FIG. 26A.

Referring to FIGS. 26A to 26C, a first supporter 117' and a second supporter 118' respectively may be formed in the first supporter opening 115' and the second supporter opening 116' penetrating the upper structure UM. To form the first and second supporters 117' and 118', the first and second supporter openings 115' and 116' may be gap-filled with an insulation material, and the insulation material may then be planarized. The first and second supporters 117' and 118' may, for example, include silicon oxide. From a top view, the edges of the first and second supporters 117' and 118' may have a straight line shape. The first supporter 117' and the second supporter 118' may each include no bending edge. The first supporter 117' and the second supporter 118' may each have a "C" shape with no bending edge. For example, the first supporter 117' may have a "c" shape, and the second supporter 118' may have a "a" shape. Referring back to FIG. 5A, according to an embodiment, the first supporter 117 and the second supporter 118 include the bending edges 117B and 118B, respectively.

Next, a cell opening 119 may be formed between the first supporter 117' and the second supporter 118'. The cell opening 119 may extend along the A-A' direction and be formed between the first supporter 117' and the second supporter 118'. The cell opening 119 may horizontally extend in any direction, e.g., from the first supporter 117' to the second supporter 118'. Further, the cell opening 119 may be vertically oriented from the etch stop layers 102. The cell opening 119 may define an area where the memory cell is to be formed, e.g., an area where the active body, bit line, and capacitor are to be formed.

The cell opening 119 may include a first cell opening 120', a second cell opening 121, and a third cell opening 122. From a top view, the first cell opening 120' may be disposed in the middle, the second cell opening 121 may be disposed on one side (or the left side) of the first cell opening 120', and the third cell opening 122 may be disposed on the opposite side (or the right side) of the first cell opening 120'. The open area of the third cell opening 122 may be larger than that of the second cell opening 121. The first cell opening 120' may have a straight line shape.

Figure 27A:
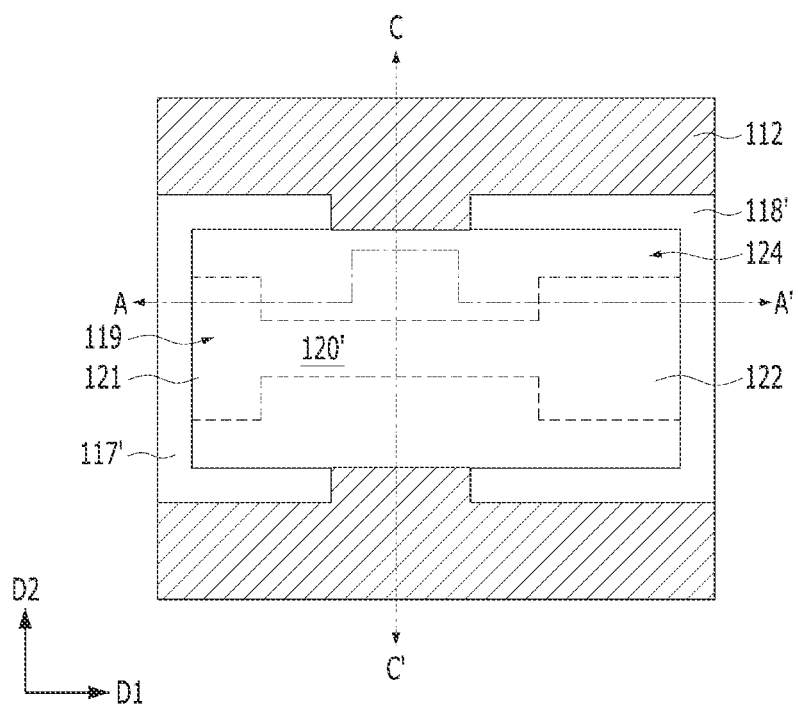
Figure 27B:
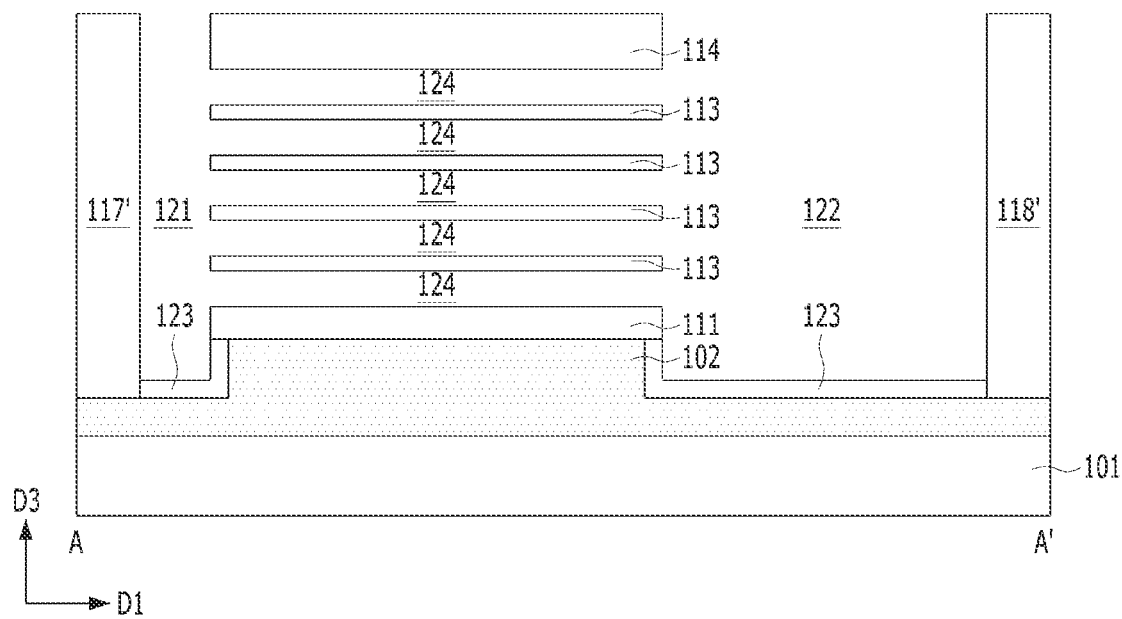
Figure 27C:
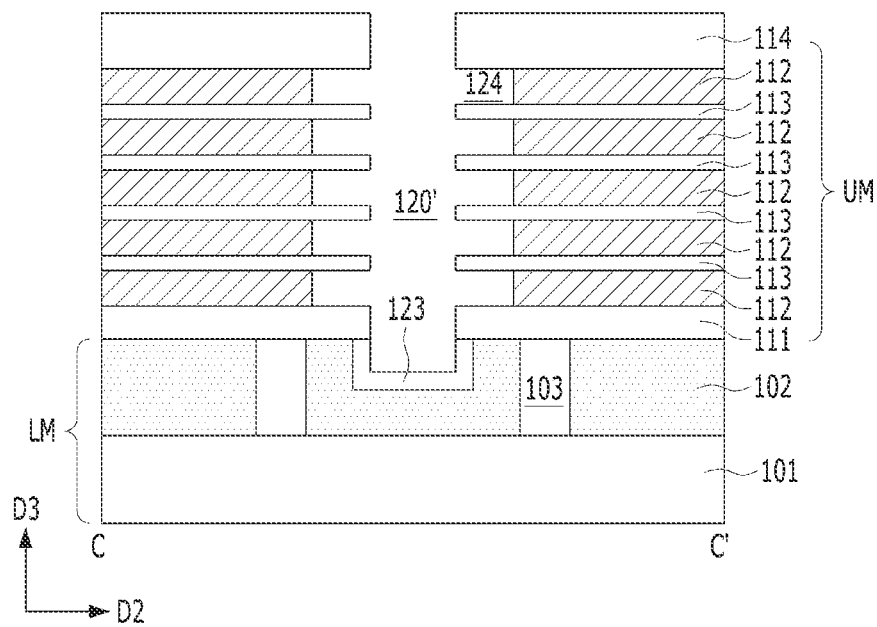

FIG. 27A is a layout illustrating a method for forming horizontal recesses. FIG. 27B is a cross-sectional view taken along line A-A' of FIG. 27A. FIG. 27C is a cross-sectional view taken along line C-C' of FIG. 27A.

Referring to FIGS. 27A to 27C, to form a protection layer 123, the recessed surface of the etch stop layers 102 may be oxidated.

After the protection layer 123 is formed, the sacrificial layer 112 may be selectively recessed horizontally via the cell opening 119. By the horizontal recessing of the sacrificial layers 112, a plurality of horizontal recesses, also referred to as lateral recesses, 124 may be formed. The horizontal recesses 124 may be formed between the insulation layers 113 vertically stacked. A horizontal recessing of the sacrificial layers 112 may be performed by wet etching or dry etching. Where the sacrificial layers 112 contain silicon nitride, the horizontal recesses 124 may be formed by wet-etching silicon nitride.

Figure 28A:
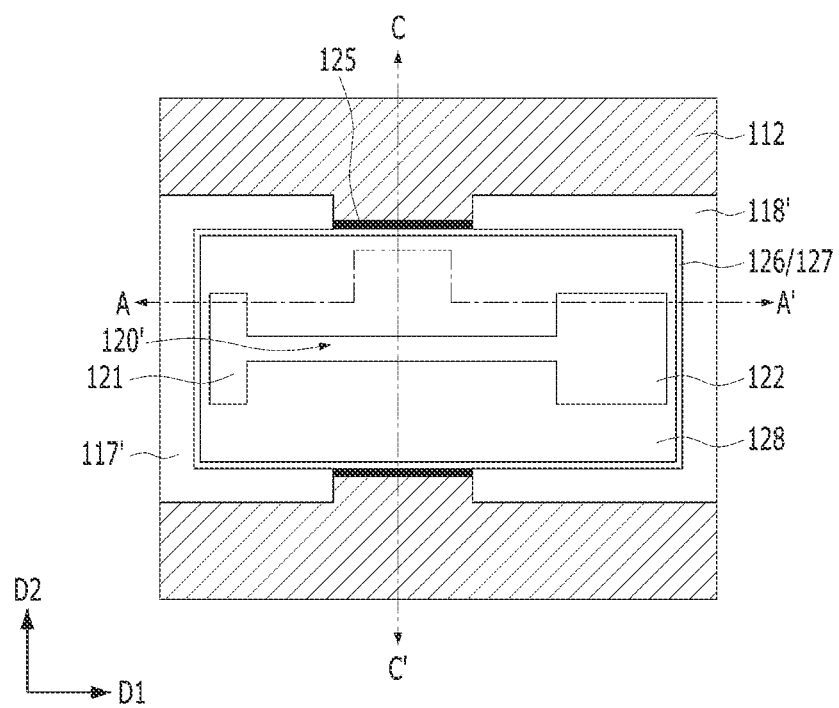
Figure 28B:
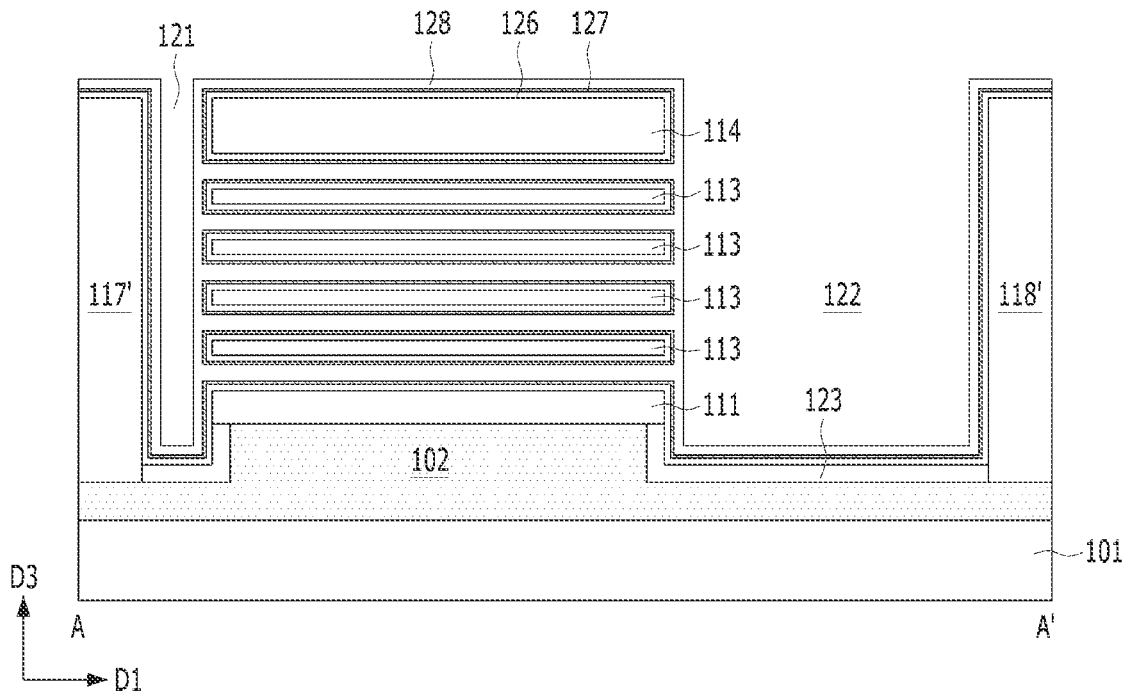
Figure 28C:
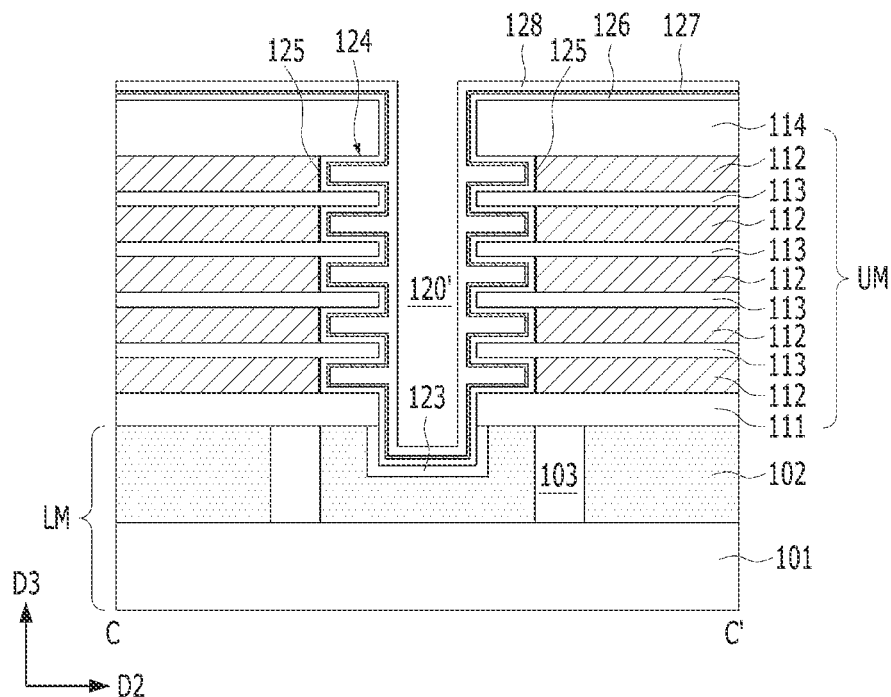

FIG. 28A is a layout illustrating a method for forming an active material layer. FIG. 28B is a cross-sectional view taken along line A-A' of FIG. 28A. FIG. 28C is a cross-sectional view taken along line C-C' of FIG. 28A.

Referring to FIGS. 28A to 28C, the side surface of the remaining sacrificial layers 112 which provide the horizontal recesses 124 may be selectively oxidated. Thus, the side walls of the horizontal recesses 124 along the second direction D2 may be covered with selective oxides 125. Where the remaining sacrificial layers 112 contain silicon nitride, the selective oxides 125 may include silicon oxynitride.

Next, a sacrificial insulation layer 126/127 and an active material layer 128 may be formed. The sacrificial insulation layer 126/127 may include a stack of nitride 126 and oxide 127. The active material layer 128 may include a semiconductor material. The active material layer 128 may include polysilicon. The active material layer 128 may include P-type polysilicon or undoped polysilicon. The active material layer 128 may adjust the thickness to fill the horizontal recesses 124 in a void-free manner.

The sacrificial insulation layer 126/127 and the active material layer 128 may extend along the first direction D1. The sacrificial insulation layer 126/127 may cover the top, bottom, and side surfaces of the insulation layers 113. The active material layer 128 may fill the horizontal recesses 124 on the sacrificial insulation layer 126/127. The sacrificial insulation layer 126/127 and the active material layer 128 may be conformally formed on the side surfaces of the cell opening 119. The sacrificial insulation layer 126/127 and the active material layer 128 may not fill the cell opening 119.

Figure 29A:
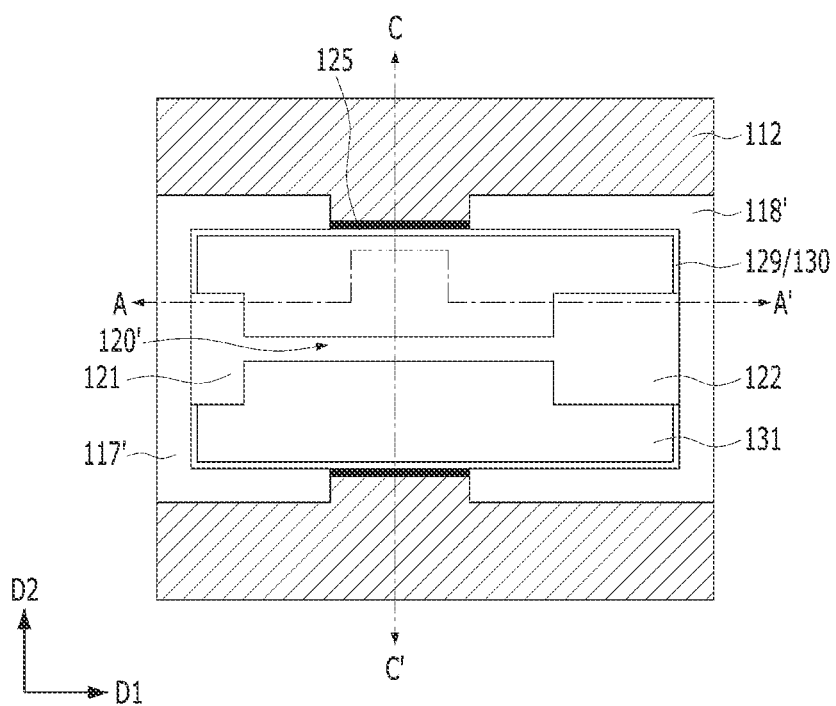
Figure 29B:
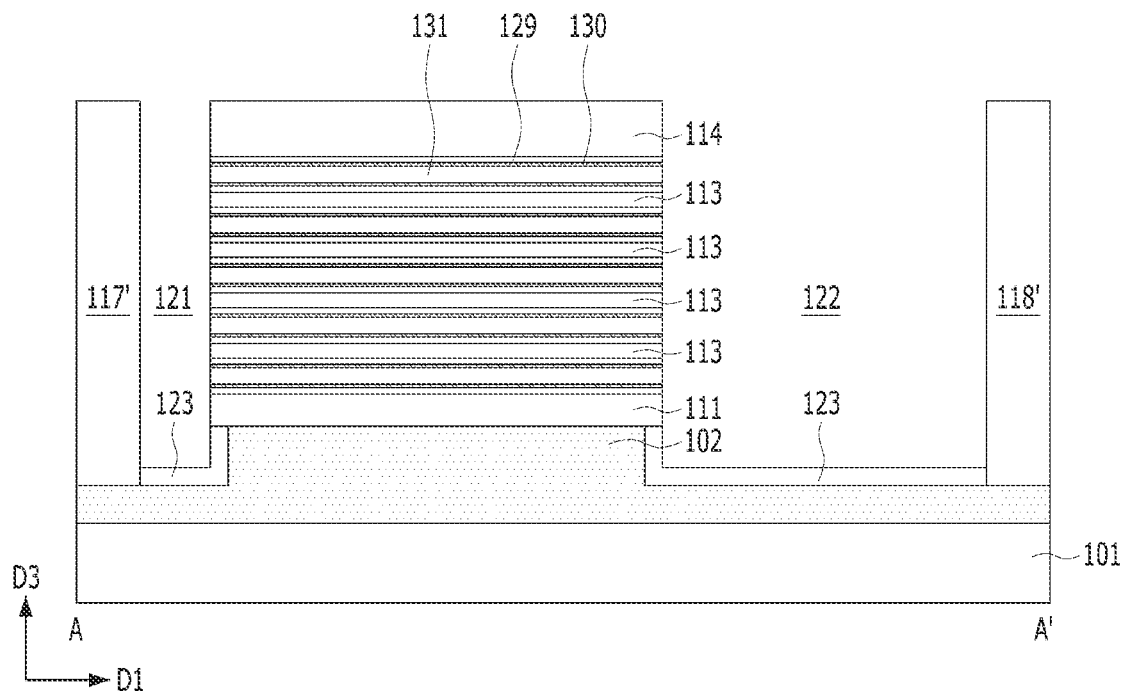
Figure 29C:
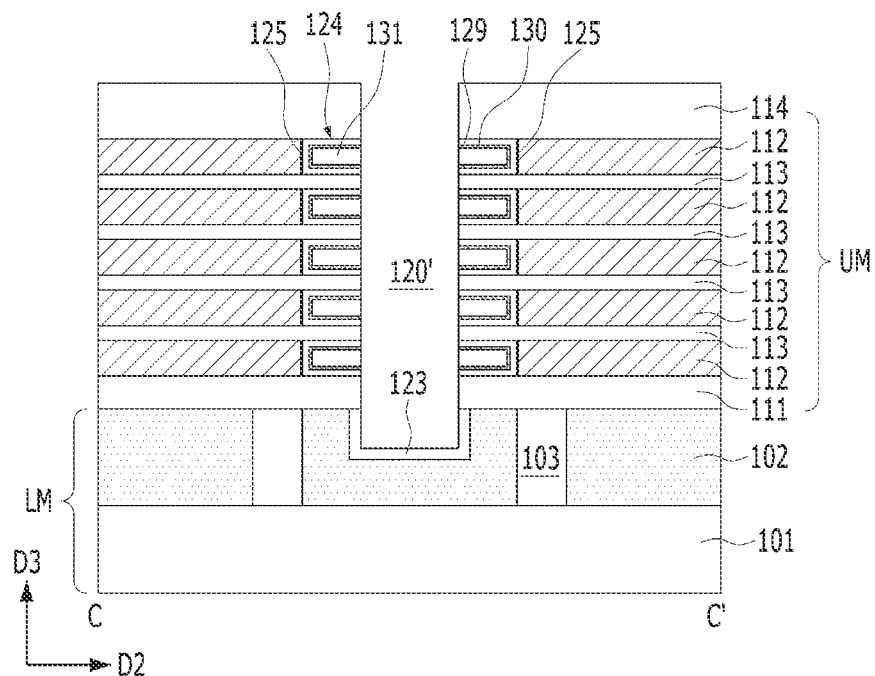

FIG. 29A is a layout illustrating a method for forming active layers. FIG. 29B is a cross-sectional view taken along line A-A' of FIG. 29A. FIG. 29C is a cross-sectional view taken along line C-C' of FIG. 29A.

Referring to FIGS. 29A to 29C, an active layer separation or isolation process may be performed. For example, an active layer 131 may be formed in each of the horizontal recesses 124 by selectively etching the active material layer 128 (see 128 in FIGS. 28A to 28C). The selective etching of the active material layer 128 may be referred to as a process of cutting the active material layer 128. The active layers 131 individually formed in the horizontal recesses 124 may be vertically separated from each other. In the second direction D2, the side walls of the active layers 131 may be covered with selective oxides 125. The selective oxides 125 may be positioned between the active layers 131 and the remaining sacrificial layers 112. Along the first direction D1, the respective first side walls of the active layers 131 may be covered with the first supporter 117', and the respective second side walls of the active layers 131 may be covered with the second supporter 118'. Prior to the cutting process for the active material layer 128, the sacrificial insulation layer 126/127 may be selectively cut. Thus, sacrificial insulation layers 129/130 may remain in the horizontal recesses 124. Each sacrificial insulation layer 129/130 may include a nitride pattern 129 and an oxide pattern 130. The nitride pattern 129 may be formed by etching the oxide 126, and the oxide pattern 130 may be formed by etching the oxide 127.

From a top view, a pair of active layers 131 may face each other, with the cell opening 119 disposed therebetween. The active layer 131 may extend along the second direction D2. One side surface of the active layer 131 may be covered by the sacrificial insulation layer 129/130. The opposite side surface of the active layer 131 may be exposed by the first to third cell openings 120', 121, and 122. Referring to FIG. 29A, the active layers 131 neighboring each other along the second direction D2 may face each other, with the first to third cell openings 120', 121, and 122 disposed therebetween. The first cell opening 120' may be smaller in width along the second direction D2 than the second cell opening 121 and the third cell opening 122.

Figure 30A:
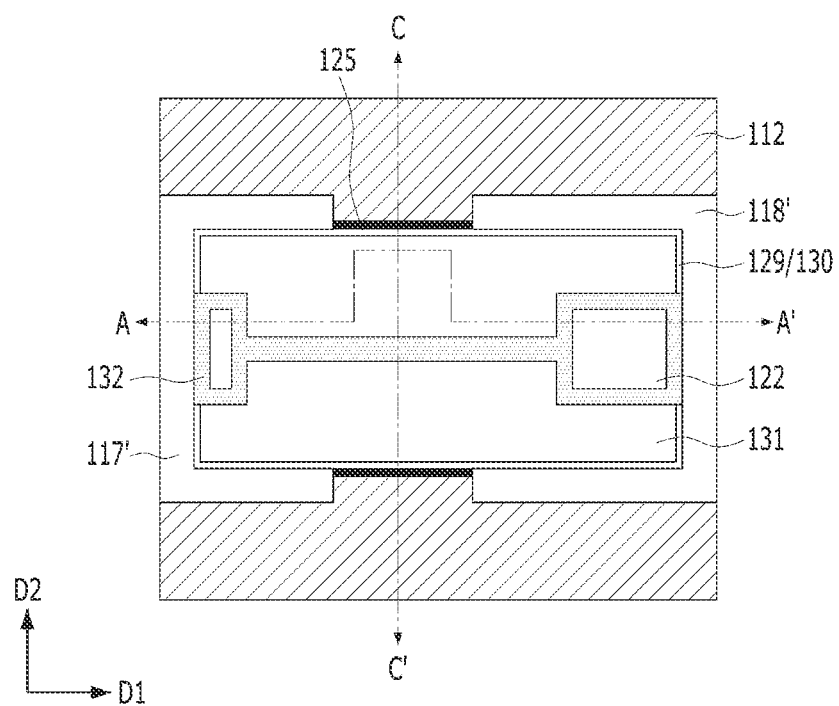
Figure 30B:
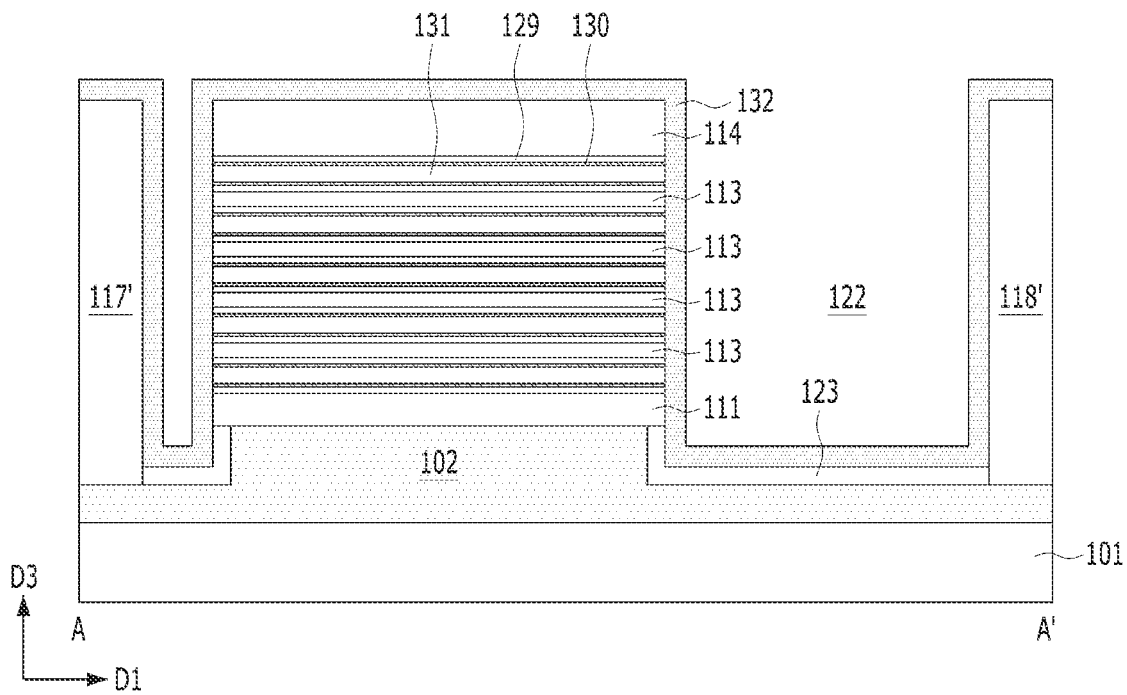
Figure 30C:
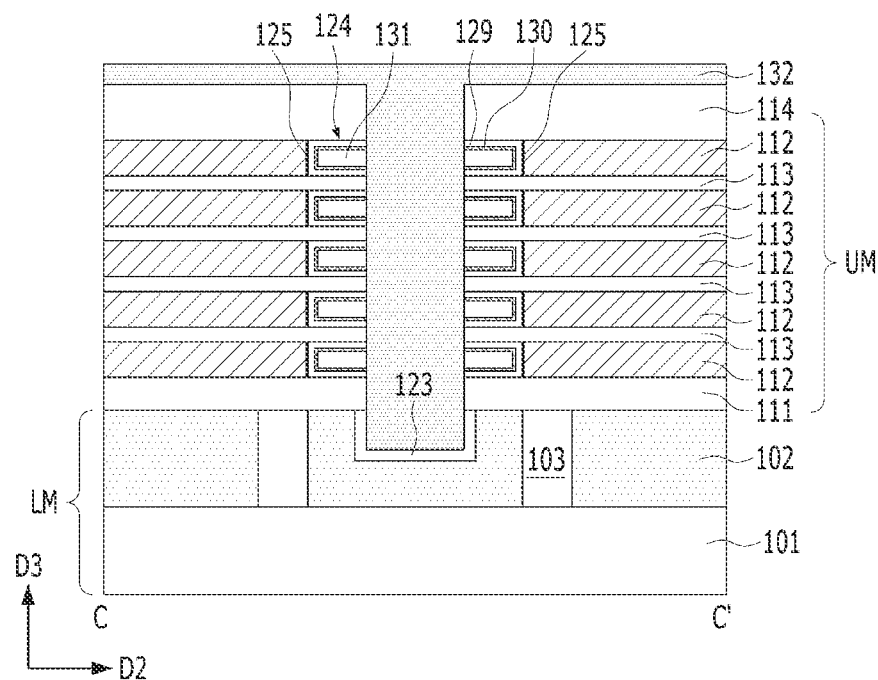

FIG. 30A is a layout illustrating a method for forming a liner oxide layer. FIG. 30B is a cross-sectional view taken along line A-A' of FIG. 30A. FIG. 30C is a cross-sectional view taken along line C-C' of FIG. 30A.

Referring to FIGS. 30A to 30C, a liner oxide layer 132 may be formed. The liner oxide layer 132 may fill the first cell opening 120' and conformally cover the second cell opening 121 and the third cell opening 122. The portion filling the first cell opening 120' of FIG. 29C may function as a separation or isolation layer between the neighboring active layers 131.

Figure 31A:
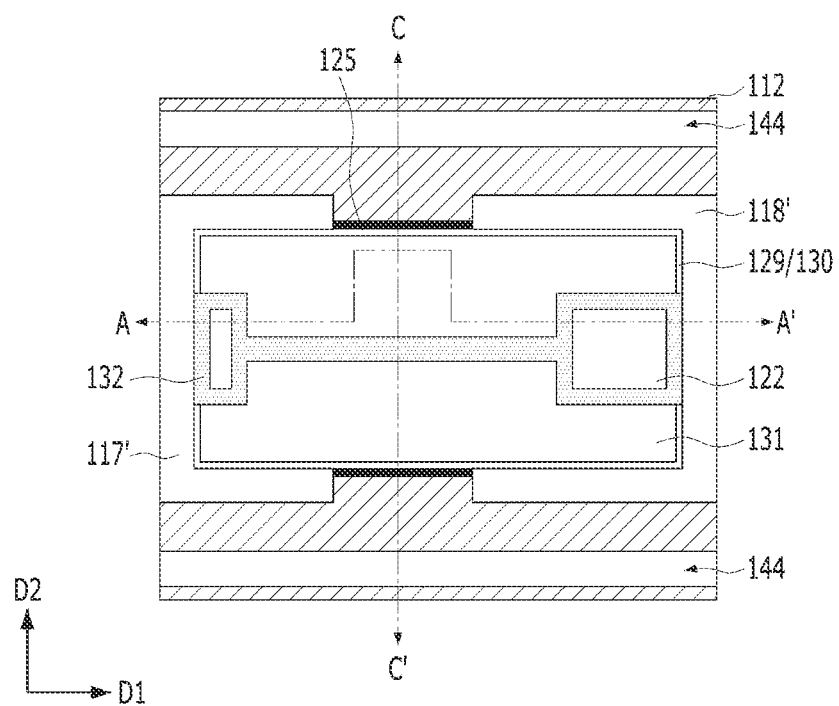
Figure 31B:
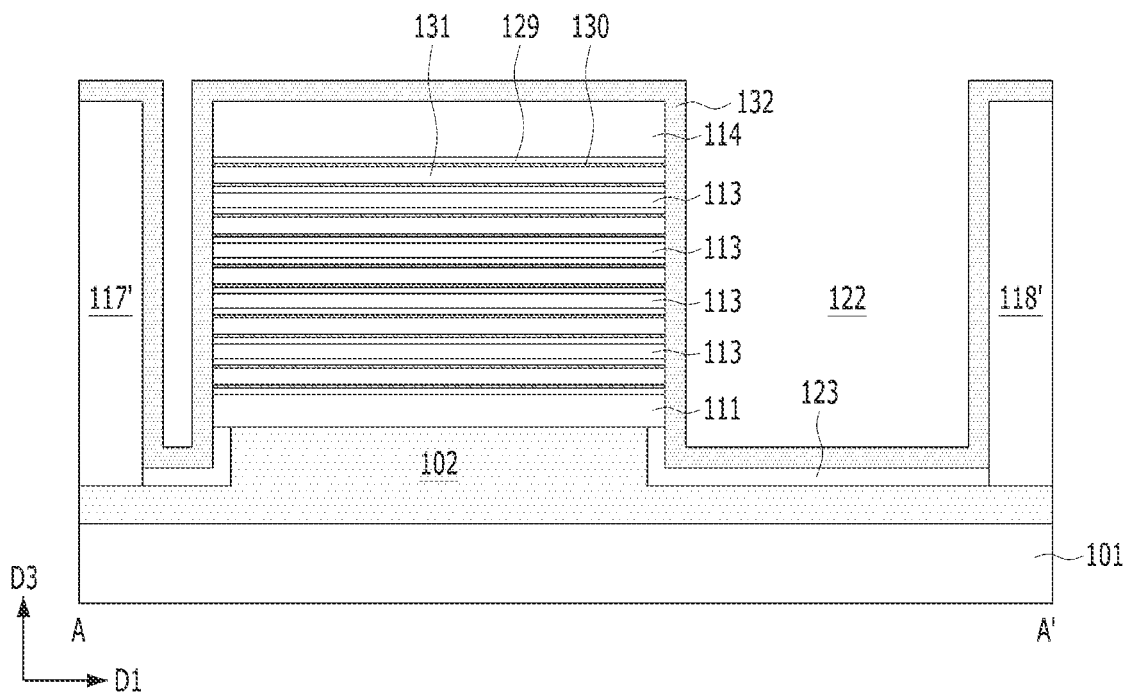
Figure 31C:
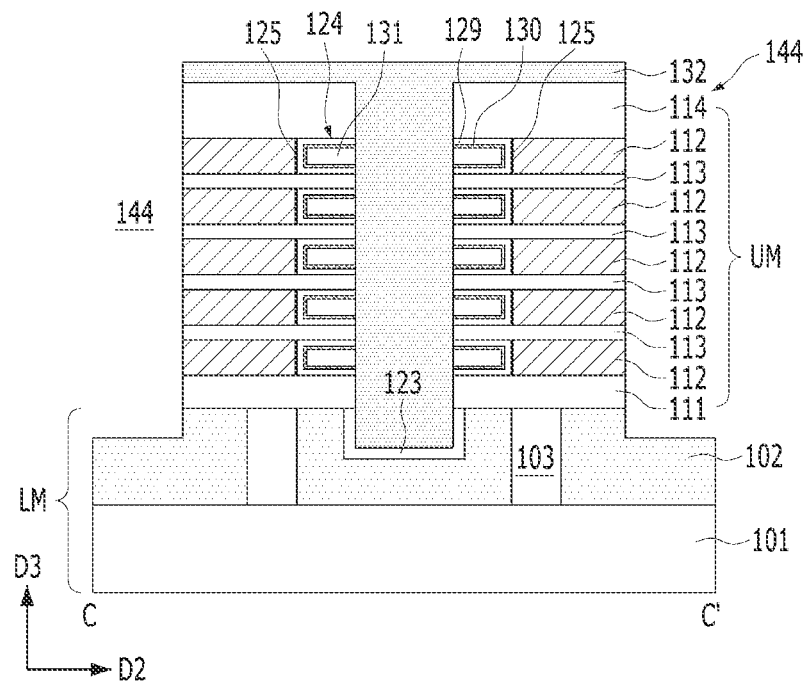

FIG. 31A is a layout illustrating a method for forming a slit. FIG. 31B is a cross-sectional view taken along line A-A' of FIG. 31A. FIG. 31C is a cross-sectional view taken along line C-C' of FIG. 31A.

Referring to FIGS. 31A to 31C, to form the slit 144, the separation insulation layer 143, the uppermost insulation layer 114, the insulation layers 113, the sacrificial layers 112, and the lowermost insulation layer 111 may be etched. The slit 144 may be shaped as a trench. Although not shown, a protection layer may be formed on the etch stop layers 102 after the slit 144 is formed.

Figure 32A:
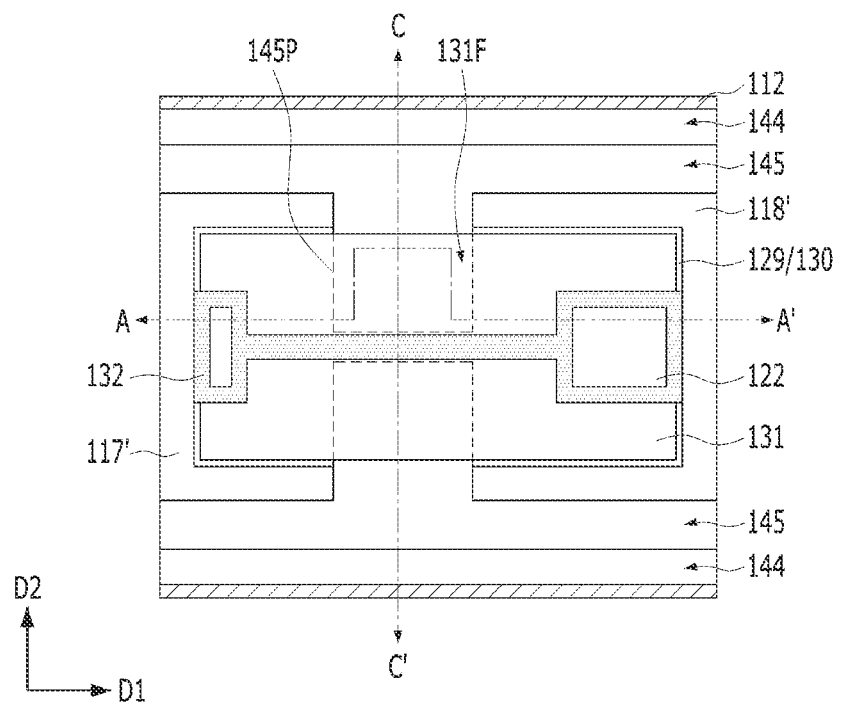
Figure 32B:
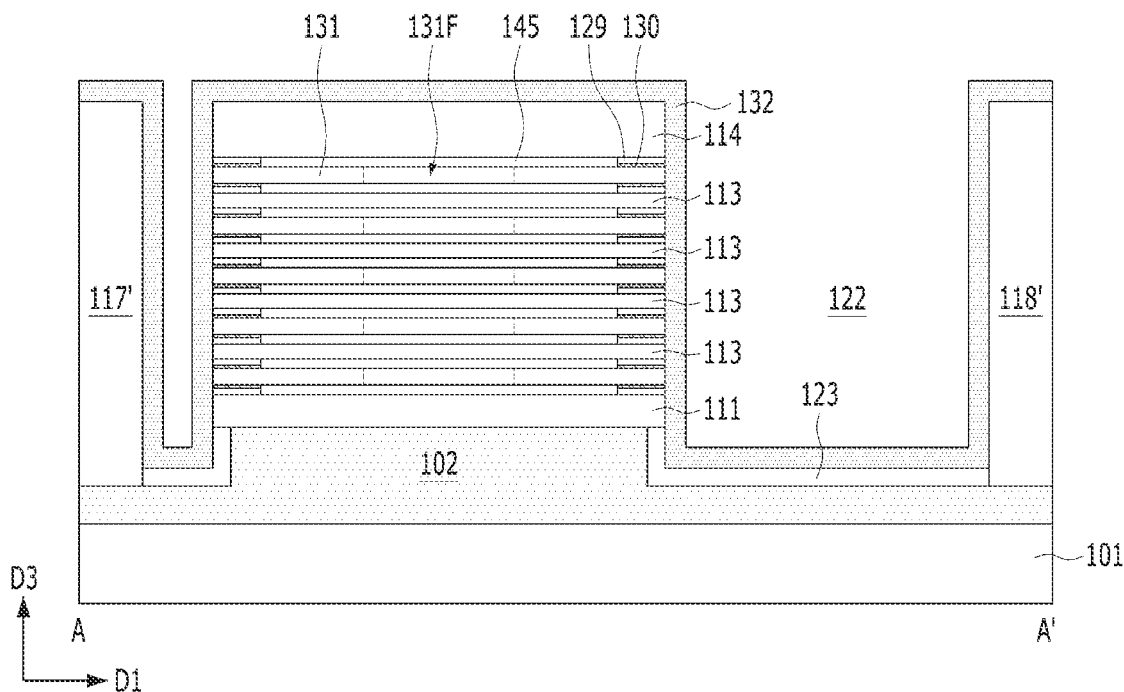
Figure 32C:
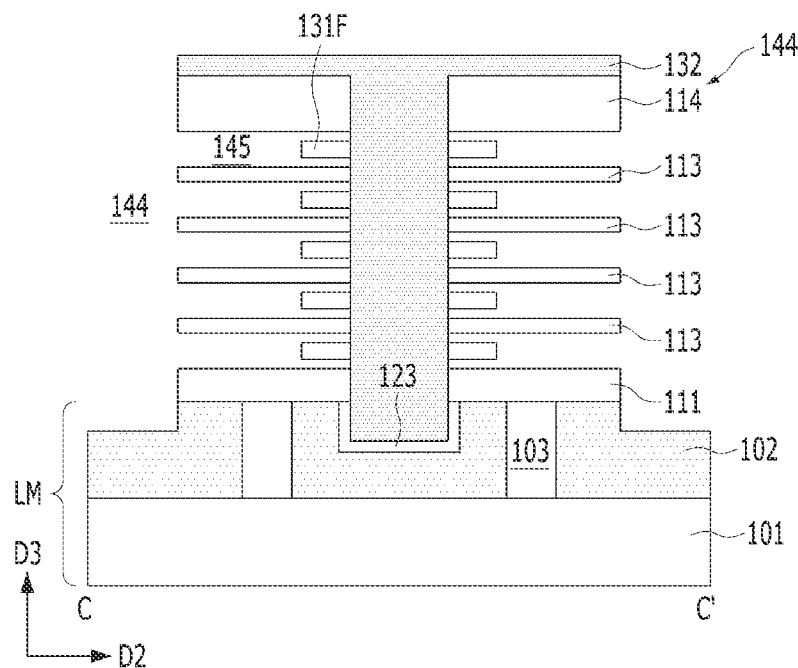

FIG. 32A is a layout illustrating a method for forming a gate recess. FIG. 32B is a cross-sectional view taken along line A-A' of FIG. 32A. FIG. 32C is a cross-sectional view taken along line C-C' of FIG. 32A.

Referring to FIGS. 32A to 32C, the sacrificial layers 112 may be selectively stripped via the slit 144. Thus, the sacrificial layers 112 may be selectively removed between the insulation layers 113.

Gate recesses 145 may be self-aligned and formed between the insulation layers 113 vertically stacked, by selectively removing the sacrificial layers 112.

Part of the selective oxide layer 125 may be exposed by the gate recesses 145. Subsequently, the selective oxide layer 125 may be removed to expose the sacrificial insulation layer pattern 129/130.

Although not shown, the gate recesses 145 may be expanded to the stepped structures, and the gate electrodes which are formed in a subsequent process may fill the edge portions of the gate recesses 145.

Next, part of the sacrificial insulation layer pattern 129/130 may be removed via the gate recesses 145, thereby exposing part of the active layer 131. The exposed portion of the active layer 131 may include a fin channel layer 131F. The fin channel layer 131F may be shaped to horizontally protrude to the gate recess 145. The fin channel layer 131F may be exposed along the second direction D2. The sacrificial insulation layer pattern 129/130 may remain between the active layers 131 and the first and second supporters 117' and 118'.

The gate recesses 145 may include protrusions 145P towards the active layers 131. The protrusions 145P of the gate recesses 145 may expose the fin channel layer 131F.

Figure 33A:
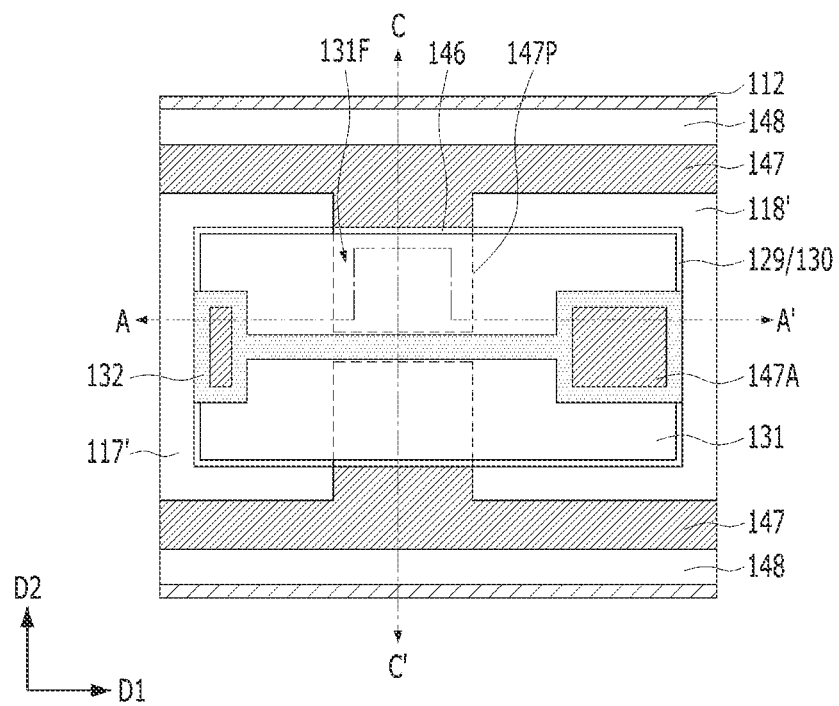
Figure 33B:
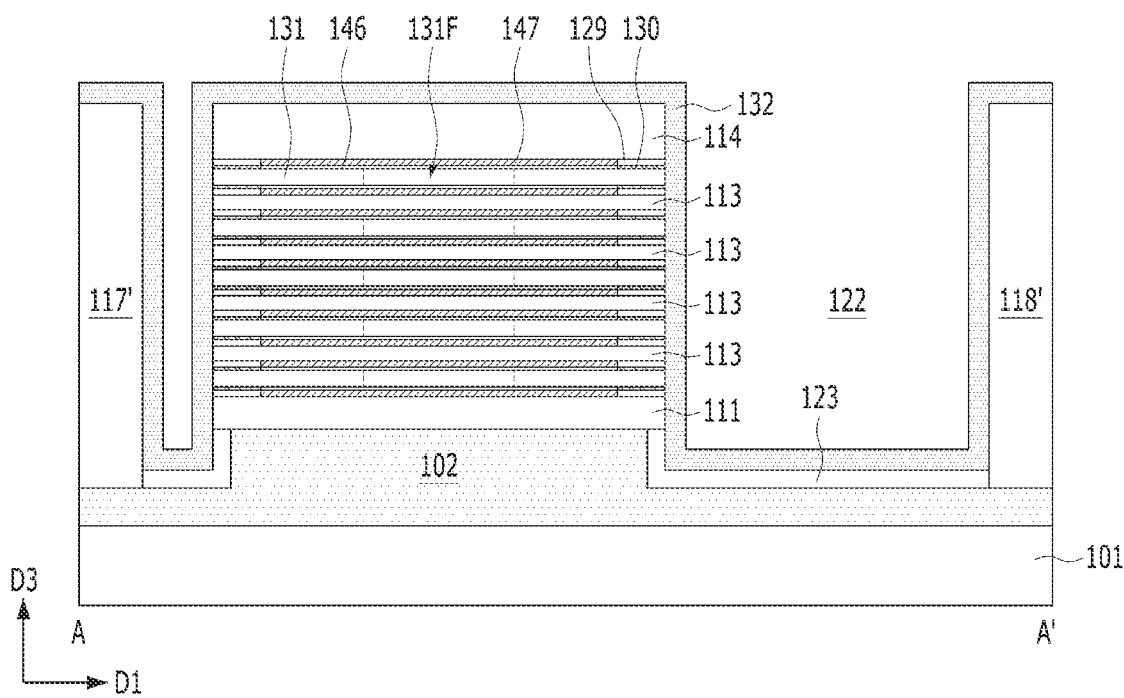
Figure 33C:
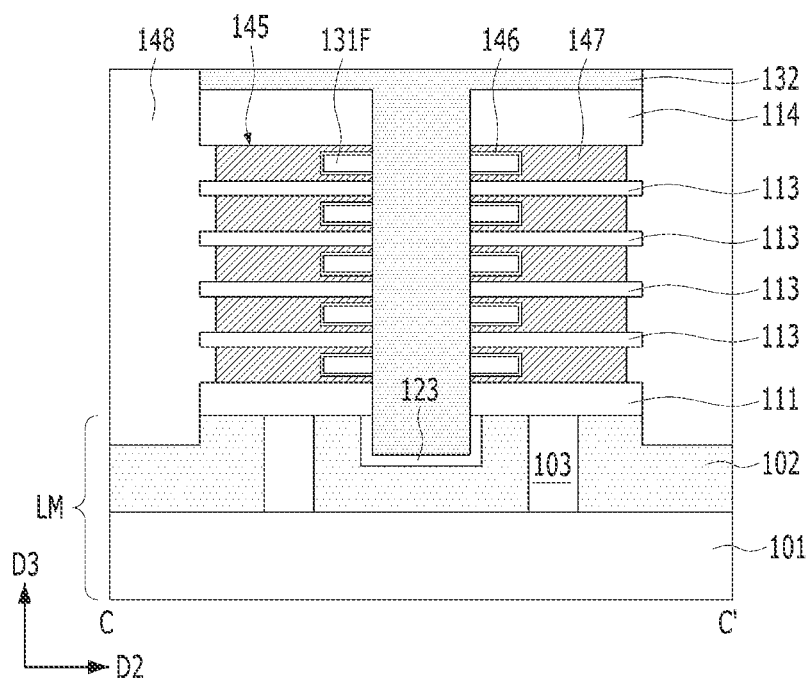

FIG. 33A is a layout illustrating a method for forming gate insulation layers and gate electrodes. FIG. 33B is a cross-sectional view taken along line A-A' of FIG. 33A. FIG. 33C is a cross-sectional view taken along line C-C' of FIG. 33A.

Referring to FIGS. 33A to 33C, a gate insulation layer 146 may be formed on each of the top surface and bottom surface of the active layer 131. The gate insulation layer 146 may be formed on the surface of the fin channel layer 131F.

The gate insulation layers 146 may be formed by selectively oxidating the surface of the fin channel layer 131F and the active layers 131 exposed by the gate recesses 145.

Gate electrodes 147 filling the gate recesses 145 may be formed on the gate insulation layers 146. The gate electrode 147 may be formed of a metal-base material. In an embodiment, the gate electrode 147 may be formed by stacking titanium nitride and tungsten. For example, after titanium nitride is conformally formed on the gate recesses 145, the gate recesses 145 may be gap-filled using tungsten. Subsequently, the titanium nitride and tungsten may be etchbacked to form gate electrodes 147 vertically separated. This is called a gate electrode separation or isolation process, and part of the gate electrode 147 may extend to cover the fin channel layer 131F. According to another embodiment, the gate electrodes 147 may include impurity-doped polysilicon.

The gate electrodes 147 may individually include protrusions 147P filling the protrusions 145P of the gate recesses 145. The protrusions 147P of the gate electrodes 147 may cover the fin channel layer 131F on the gate insulation layer 146. The protrusions 147P of the neighboring gate electrodes 147 may be spaced apart from each other by the separation layer 132I.

As described above, the plurality of gate electrodes 147 may be vertically stacked. The insulation layers 113 may be positioned between the vertically stacked gate electrodes 147. The plurality of insulation layers 113 and the plurality of gate electrodes 147 may be alternately stacked vertically from the lower structure LM. The gate electrodes 147 and the active layers 131 may be positioned at the same level.

While the gate electrodes 147 are formed, the second cell opening 121 and the third cell opening 122 may be filled with dummy gate electrodes 147A. The dummy gate electrodes 147A may be formed of the same material as the gate electrodes 147.

After the gate electrodes 147 are formed, a slit insulation layer 148 filling one side surface of the gate electrodes 147, e.g., the slit 144, may be formed. The slit insulation layer 148 may, for example, include silicon oxide.

Figure 34A:
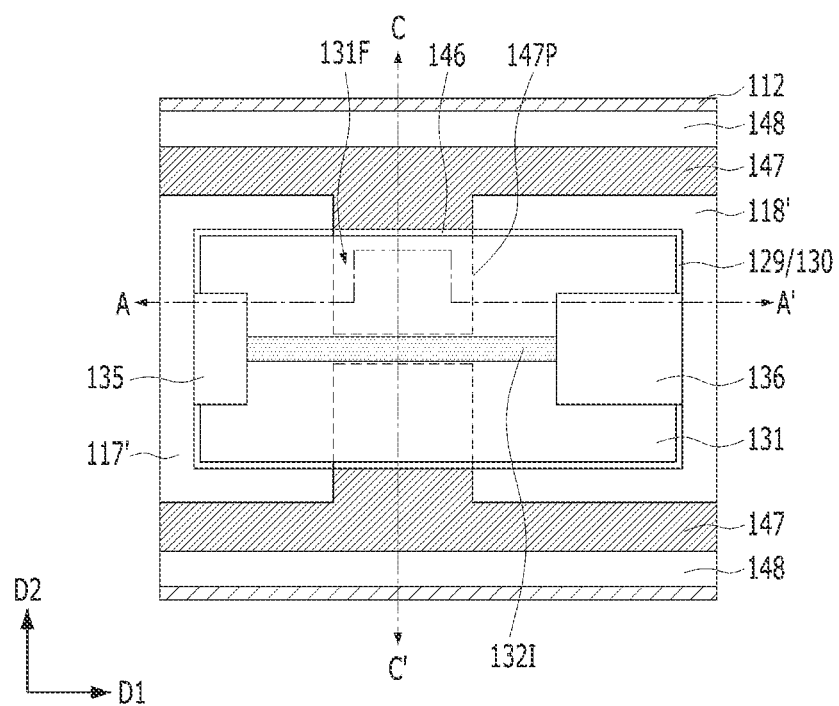
Figure 34B:
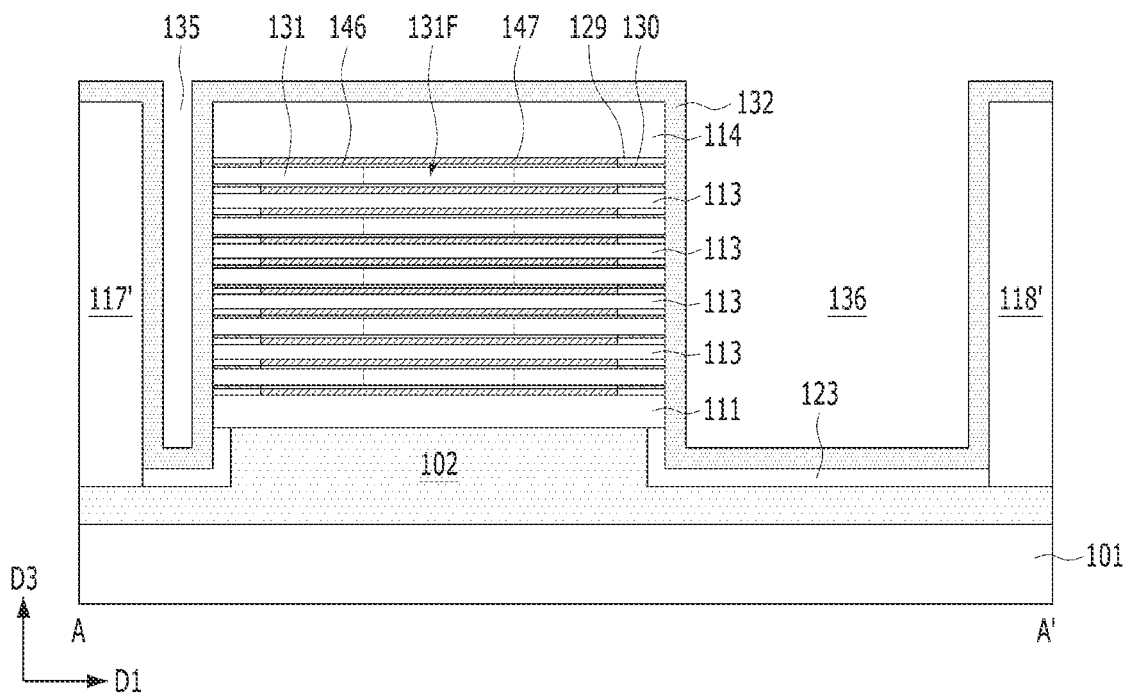
Figure 34C:
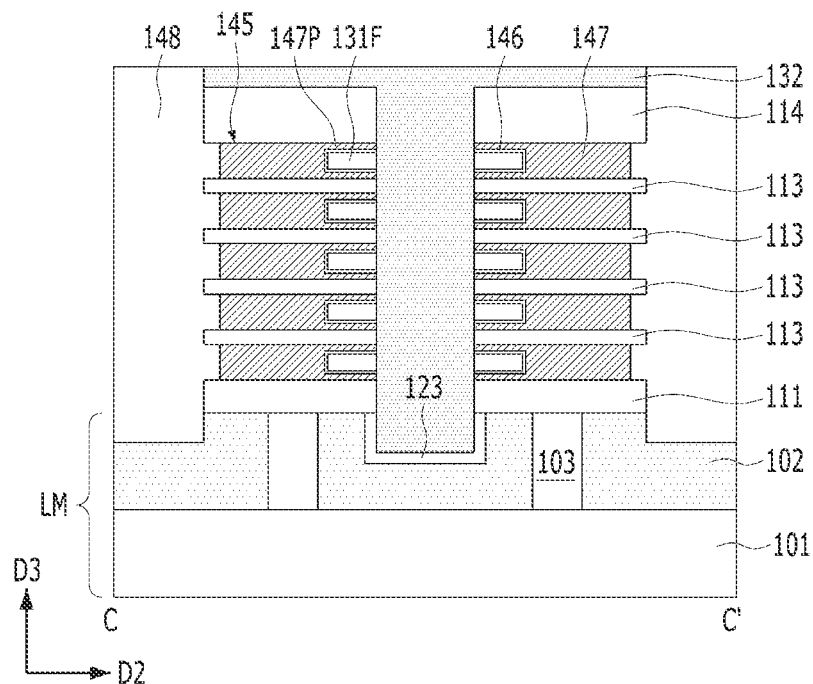

FIG. 34A is a layout illustrating a method for forming a bit line opening and a capacitor opening. FIG. 34B is a cross-sectional view taken along line A-A' of FIG. 34A. FIG. 34C is a cross-sectional view taken along line C-C' of FIG. 34A.

Referring to FIGS. 34A to 34C, a bit line opening 135 and a capacitor opening 136 may be formed. To form the bit line opening 135 and the capacitor opening 136, the dummy gate electrodes 147A may be selectively removed. A method for forming the bit line opening 135 and the capacitor opening 136 may be similar to the method described above in connection with FIGS. 13A to 13C.

Subsequently, a series of processes illustrated in FIGS. 14A to 20C may be performed.

Figure 35A:
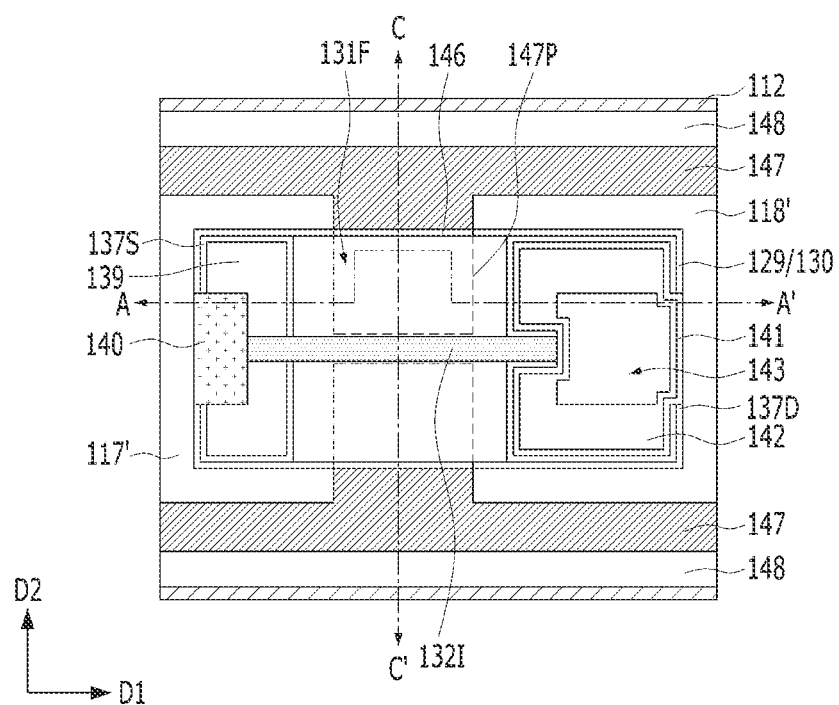
Figure 35B:
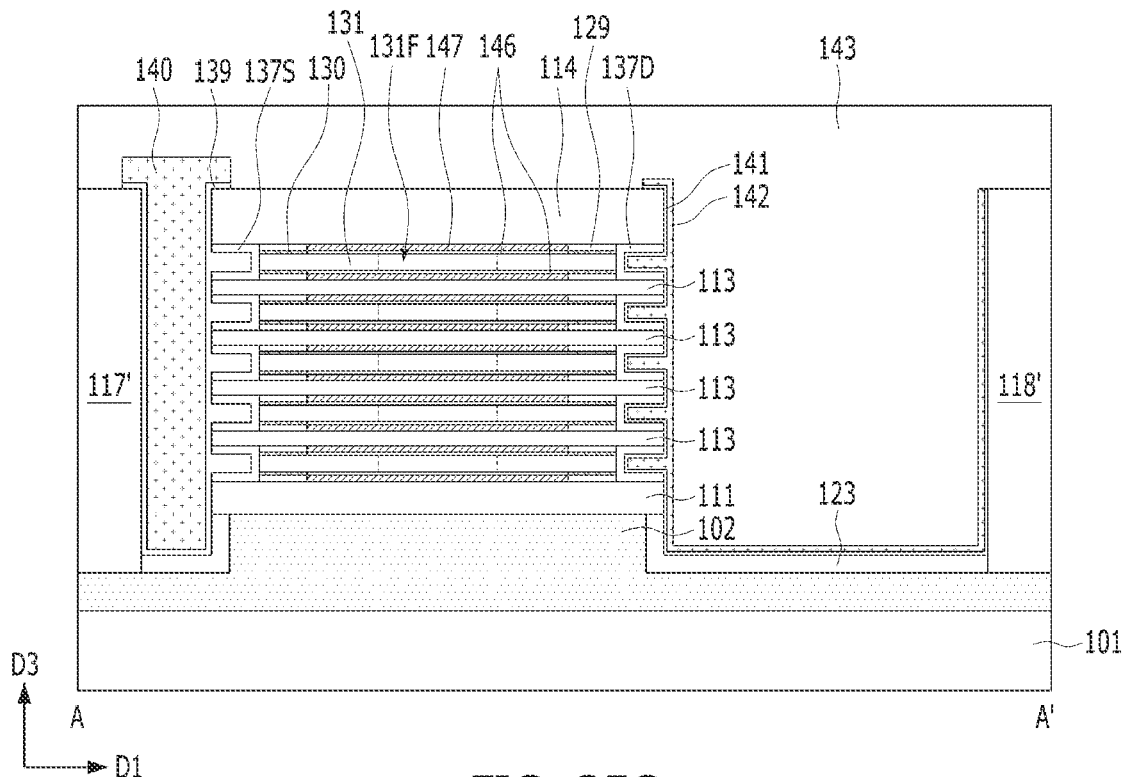
Figure 35C:
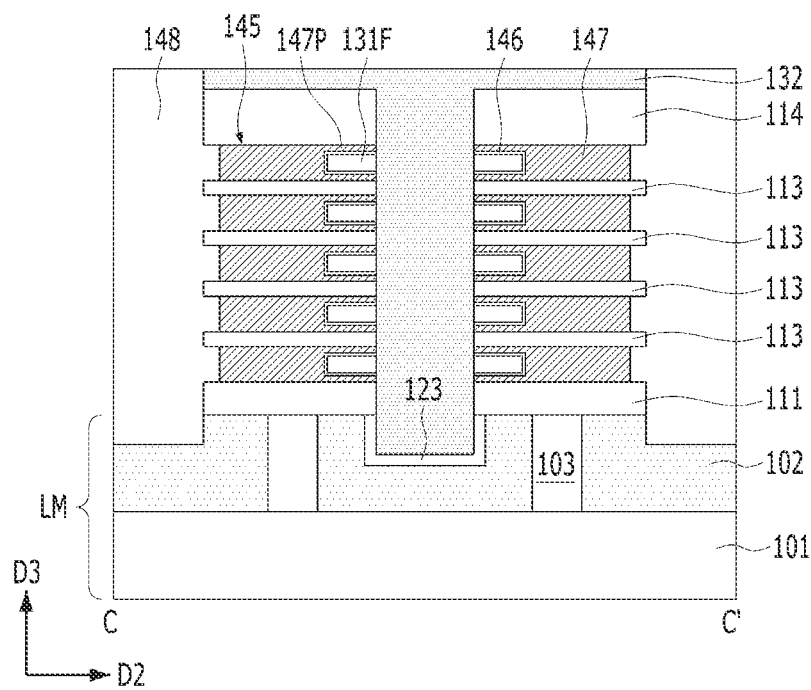

Thus, a bit line 140, a dielectric layer 141, and a plate 142 may be formed as illustrated in FIGS. 35A to 35C. After the bit line 140 is formed, the dielectric layer 141 and the plate 142 may be formed. According to another embodiment, after the dielectric layer 141 and the plate 142 are formed, the bit line 140 may be formed.

Before the bit line 140 is formed, a barrier layer 139 and a bit line contact node 137S may be formed. The bit line 140 may connect to the active layer 131 via the barrier layer 139 and the bit line contact node 137S. Before the dielectric layer 141 is formed, a capacitor contact node 137D may be formed connecting to the active layer 131. The capacitor contact node 137D may also serve as a storage node. The capacitor contact node 137D, the dielectric layer 141, and the plate 142 may configure a capacitor.

The bit line 140 and bit line contact nodes 137S may be supported by the first supporter 117', and the capacitor contact nodes 137D, dielectric layer 141, and plate 142 may be supported by the second supporter 118'. The active layers 131 may be supported by the first supporter 117' and the second supporter 118'.

The fin channel layers 131F may be part of the active layers 131 and may have a fin structure covered by the protrusion 147P of the gate electrode 147.

Separation layers 132I may be positioned between the active layers 131. One side of the separation layer 132I may connect to the bit line 140, and the opposite side of the separation layer 132I may connect to the storage nodes 141.

The active layers 131 may have a non-bent shape and extend along the first direction D1. Portions of the active layers 131 may protrude along the second direction D2. The separation layers 132I may be positioned between the protrusions of the active layers 131.

As such, the active layers 131 with no active body may be separated from each other by the separation layer 132I.

It is apparent to one of ordinary skill in the art that the methods according to various embodiments of the disclosure as described above are not limited to the above-described embodiments and those shown in the drawings, and various changes, modifications, or alterations may be made thereto without departing from the scope of the disclosure.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which are obvious in view of the present disclosure, are intended to fall within the scope of the appended claims.

What is claimed is:

1. A memory device, comprising:
a lower structure;
an active layer horizontally oriented parallel to a surface of the lower structure;
a bit line connected to a first end of the active layer and vertically oriented from the surface of the lower structure;
a capacitor connected to a second end of the active layer;
a word line horizontally oriented to be parallel with the active layer along a side surface of the active layer; and
a fin channel layer horizontally extending from one side surface of the active layer, wherein the word line includes a protrusion covering the fin channel layer.

2. The memory device of claim 1, wherein the active layer, the fin channel layer, and the word line are positioned at the same level.

3. The memory device of claim 1, further comprising:
a bit line contact node shaped as a cylinder and positioned between the bit line and the first end of the active layer; and
a barrier layer between the bit line and the bit line contact node, wherein the barrier layer extends to an inside of the cylinder of the bit line contact node.

4. The memory cell of claim 1, wherein the capacitor includes:
a storage node shaped as a cylinder and connected to the second end of the active layer;
a dielectric layer on the storage node; and
a plate on the dielectric layer, wherein the plate vertically extends along a direction in which the bit line is oriented.

5. The memory device of claim 1, wherein the storage node has a bent shape partially covering an outer wall of the plate.

6. The memory device of claim 1, wherein the active layer and the storage node are positioned at the same level.

7. The memory device of claim 1, wherein the word line has at least one stepped end.

8. The memory device of claim 1, further comprising a gate insulation layer between the word line and the fin channel layer.

9. The memory device of claim 1, further comprising:
a first supporter supporting the bit line and the active layer; and
a second supporter supporting the active layer and the capacitor.

10. The memory device of claim 9, wherein the first supporter and the second supporter are vertically oriented along a direction in which the bit line is oriented.

11. The memory device of claim 9, wherein the first supporter and the second supporter include an insulation material.

12. The memory device of claim 9, wherein the first supporter partially surrounds the bit line, and the second supporter partially surrounds the capacitor.

13. The memory device of claim 9, wherein the first supporter and the second supporter each include a bending edge connected to the active layer.

14. A memory device, comprising:
active layers vertically stacked along a first direction and horizontally oriented along a second direction crossing the first direction;
word lines horizontally oriented along the second direction to be individually parallel with the active layer along respective side surfaces of the active layers;
an active body vertically oriented along the first direction to be jointly connected to the active layers;
a bit line connected to a first end of the active layers and vertically oriented;
a capacitor connected to a second end of each of the active layers; and
a fin channel layer horizontally extending from a side surface of each of the active layers along a third direction, wherein each of the word lines includes a protrusion covering each of the fin channel layers.

15. The memory device of claim 14, wherein the active layers, the fin channel layers, and the word lines are positioned at the same level.

16. The memory device of claim 14, further comprising:
a bit line contact node shaped as a cylinder and positioned between the bit line and the first end of the active layers; and
a barrier layer between the bit line and the bit line contact node, wherein the barrier layer extends to an inside of the cylinder of the bit line contact node.

17. The memory cell of claim 14, wherein each of the capacitors includes:
a storage node shaped as a cylinder and connected to the second end of each of the active layers;
a dielectric layer on the storage node; and a plate on the dielectric layer, wherein the plate vertically extends along a direction in which the bit line is oriented.

18. The memory device of claim 17, wherein the storage node has a bent shape partially covering an outer wall of the plate.

19. The memory device of claim 18, wherein the active layers and the storage nodes are positioned at the same level.

20. The memory device of claim 14, wherein each of the word lines has at least one stepped end.

21. The memory device of claim 14, further comprising a gate insulation layer between the word lines and the fin channel layers.

22. The memory device of claim 14, further comprising:
   a first supporter supporting the bit line and the active layers; and
   a second supporter supporting the active layers and the capacitors, wherein the first supporter and the second supporter are vertically oriented along a direction in which the bit line is oriented.

23. The memory device of claim 14, further comprising an insulation layer positioned between the word lines, wherein the word lines and the insulation layers are alternately stacked along a third direction.

24. The memory device of claim 14, further comprising a peripheral circuit portion connected to the bit line, wherein the peripheral circuit portion is disposed lower than a lowermost word line among the word lines or higher than an uppermost word line among the word lines.

25. A method for manufacturing a memory device, the method comprising:
   forming a plurality of active layers vertically stacked from a lower structure and including a horizontal fin channel layer;
   forming an active body vertically oriented from the lower structure to mutually connect the active layers;
   forming a bit line vertically oriented from the lower structure, the bit line connected to a first end of the active layers;
   forming a capacitor including a storage node connected to a second end of the active layers; and
   forming word lines individually parallel with the active layers, the word lines individually covering the respective fin channel layers of the active layers.

26. The method of claim 25, wherein forming the plurality of active layers includes:
   forming a stack of insulation layers and sacrificial layers alternately formed on the lower structure;
   forming a cell opening vertically oriented and passing through the stack;
   forming recesses horizontally extending from the cell opening by selectively recessing the sacrificial layers through the cell opening; and
   forming the active layers individually filling the recesses.

27. The method of claim 25, wherein forming the active body includes:
   forming a stack of insulation layers and sacrificial layers alternately formed on the lower structure;
   forming a cell opening vertically oriented and passing through the stack;
   replacing some of the sacrificial layers with the active layers through the cell opening;
   forming a separation layer filling the cell opening;
   forming an active body opening simultaneously exposing the active layers by etching the separation layer; and
   filling the active body opening with a conductive material.

28. The method of claim 25, wherein forming the bit line includes:
   forming a stack of insulation layers and sacrificial layers alternately formed on the lower structure;
   replacing some of the sacrificial layers with bit line contact nodes shaped as a cylinder; and
   forming a conductive material passing through the bit line contact nodes to form the bit line.

29. The method of claim 25, wherein forming the capacitor includes:
   forming a stack of insulation layers and sacrificial layers alternately formed on the lower structure;
   replacing some of the sacrificial layers with storage nodes shaped as a cylinder; and
   forming a plate and a dielectric layer vertically oriented to cover the storage nodes.

30. The method of claim 25, wherein forming the active layers includes:
   forming a stack of insulation layers and sacrificial layers alternately formed on the lower structure;
   forming a pair of first supporter and second supporter facing each other and passing through the stack;
   forming the cell opening vertically oriented and passing through the stack between the first supporter and the second supporter;
   forming recesses horizontally extended from the cell opening by selectively recessing the sacrificial layers through the cell opening; and
   forming the active layers individually filling the recesses.

* * * * *